US012793643B2

(12) United States Patent
Cho et al.

(10) Patent No.: US 12,793,643 B2
(45) Date of Patent: Nov. 10, 2026

(54) DISPLAY APPARATUS

(71) Applicant: SAMSUNG DISPLAY CO., LTD., Yongin-si (KR)

(72) Inventors: Seunghwan Cho, Yongin-si (KR); Kiho Bang, Yongin-si (KR); Wonsuk Choi, Yongin-si (KR); Beomyeol Park, Yongin-si (KR); Jiryun Park, Yongin-si (KR); Seokje Seong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/378,305

(22) Filed: Nov. 3, 2025

(65) Prior Publication Data

US 2026/0057838 A1 Feb. 26, 2026

Related U.S. Application Data

(62) Division of application No. 17/657,715, filed on Apr. 1, 2022, now Pat. No. 12,462,745.

(30) Foreign Application Priority Data

Apr. 6, 2021 (KR) ........................ 10-2021-0044745

(51) Int. Cl.
*G09G 3/3233* (2016.01)
*H10K 59/131* (2023.01)

(52) U.S. Cl.
CPC ....... *G09G 3/3233* (2013.01); *H10K 59/1315* (2023.02); *G09G 2300/0426* (2013.01);
(Continued)

(58) Field of Classification Search
CPC ......... G09G 3/3233; G09G 2300/0426; G09G 2320/0223; G09G 2320/0233;
(Continued)

(56) References Cited

U.S. PATENT DOCUMENTS

| | | | |
|---|---|---|---|
| 8,575,628 | B2 | 11/2013 | Kim et al. |
| 10,997,919 | B2 | 5/2021 | Kim et al. |

(Continued)

FOREIGN PATENT DOCUMENTS

| | | |
|---|---|---|
| KR | 10-2011-0131973 A | 12/2011 |
| KR | 10-2019-0053585 A | 5/2019 |

(Continued)

*Primary Examiner* — Temesghen Ghebretinsae
*Assistant Examiner* — Ivelisse Martinez Quiles
(74) *Attorney, Agent, or Firm* — Womble Bond Dickinson (US) LLP

(57) ABSTRACT

A display apparatus includes: a substrate having a display area and a peripheral area around the display area; a first voltage wiring on one side of the peripheral area; a plurality of first voltage lines arranged in a first direction at the display area, extending in a second direction, and electrically connected to the first voltage wiring; a plurality of second voltage lines arranged in the second direction at the display area and extending in the first direction; a plurality of first connectors connecting the plurality of first voltage lines to the plurality of second voltage lines; a plurality of first auxiliary patterns extending in the first direction or the second direction on the display area; and a plurality of second connectors connecting at least one of the plurality of first voltage lines or the plurality of second voltage lines to the plurality of first auxiliary patterns.

4 Claims, 33 Drawing Sheets

(52) U.S. Cl.
CPC ............... *G09G 2320/0223* (2013.01); *G09G 2320/0233* (2013.01)

(58) Field of Classification Search
CPC ........... G09G 3/3225; G09G 2330/028; H10K 59/1315; H10K 59/123; H10K 59/122; H10K 59/1213; H10K 59/131
See application file for complete search history.

(56) References Cited

U.S. PATENT DOCUMENTS

| | | | | |
|---|---|---|---|---|
| 12,057,066 | B2 | 8/2024 | An et al. | |
| 2020/0243637 | A1 | 7/2020 | Lee et al. | |
| 2021/0257438 | A1* | 8/2021 | Cho | H10K 59/131 |
| 2021/0375215 | A1* | 12/2021 | Cho | H10K 59/131 |
| 2022/0366847 | A1 | 11/2022 | An et al. | |

FOREIGN PATENT DOCUMENTS

| | | | |
|---|---|---|---|
| KR | 10-2020-0049979 | A | 5/2020 |
| KR | 10-2020-0078806 | A | 7/2020 |
| KR | 10-2020-0094264 | A | 8/2020 |
| KR | 10-2021-0105462 | A | 8/2021 |

* cited by examiner

DISPLAY APPARATUS

CROSS-REFERENCE TO RELATED APPLICATIONS

This application is a divisional of U.S. patent application Ser. No. 17/657,715, filed Apr. 1, 2022, which claims priority to and the benefit of Korean Patent Application No. 10-2021-0044745, filed Apr. 6, 2021, the entire content of both of which is incorporated herein by reference.

BACKGROUND

1. Field

Aspects of one or more embodiments relate to display apparatuses.

2. Description of the Related Art

Display apparatuses may visually or graphically display data or images. A display apparatus may be used as a display for a small electronic device such as a mobile phone or may be used as a display of a large electronic device such as a television.

A display apparatus may include a plurality of pixels that receive an electrical signal to emit light to display images to the outside. Each pixel may include a display element, for example, an organic light emitting diode (OLED) as a display element in the case of an organic light emitting display apparatus. Generally, in an organic light emitting display apparatus, a thin film transistor and an organic light emitting diode may be formed on a substrate, and the organic light emitting diode may operate by emitting light (e.g., based on a data signal provided to the signal) by itself.

Recently, as the use of display apparatuses has diversified, various design attempts have been made to improve the quality of display apparatuses. For example, various display apparatuses having excellent characteristics such as thinness, lightness, and low power consumption have been introduced. Also, recently, a dead space of a display apparatus has decreased and the area of a display area has increased.

The above information disclosed in this Background section is only for enhancement of understanding of the background and therefore the information discussed in this Background section does not necessarily constitute prior art.

SUMMARY

Aspects of one or more embodiments include a display apparatus having a relatively reduced peripheral area and a relatively improved quality.

Technical solutions to be achieved by the disclosure are not limited to the technical solutions mentioned above, and other technical solutions not mentioned above may be more clearly understood from the description of the disclosure by those of ordinary skill in the art.

Additional aspects will be set forth in part in the description which follows and, in part, will be more apparent from the description, or may be learned by practice of the presented embodiments.

According to one or more embodiments, a display apparatus includes a substrate in which a display area and a peripheral area around the display area are defined, a first voltage wiring arranged on one side of the peripheral area, a plurality of first voltage lines arranged in a first direction on the display area, extending in a second direction, and electrically connected to the first voltage wiring, a plurality of second voltage lines arranged in the second direction on the display area and extending in the first direction, a plurality of first connectors connecting the plurality of first voltage lines to the plurality of second voltage lines, a plurality of first auxiliary patterns extending in the first direction or the second direction on the display area, and a plurality of second connectors connecting at least one of the plurality of first voltage lines or the plurality of second voltage lines to the plurality of first auxiliary patterns.

According to some embodiments, the plurality of first auxiliary patterns may be arranged in the first direction and may extend in the second direction.

According to some embodiments, a length of one of the plurality of first auxiliary patterns may be equal to or less than a length of a first voltage line adjacent to the one of the plurality of first auxiliary patterns among the plurality of first voltage lines.

According to some embodiments, the display apparatus may further include a plurality of first auxiliary lines arranged in the second direction on a first area of the display area and extending in the first direction, and a plurality of third connectors connecting at least one of the plurality of first voltage lines, the plurality of second voltage lines, or the plurality of first auxiliary patterns to the plurality of first auxiliary lines.

According to some embodiments, the display apparatus may further include a plurality of second auxiliary lines arranged in the second direction on a second area of the display area and each including a second auxiliary pattern and a third auxiliary pattern spaced apart from each other in the first direction, and a plurality of fourth connectors connecting at least one of the plurality of first voltage lines or the plurality of second voltage lines to the plurality of second auxiliary patterns or the plurality of third auxiliary patterns, wherein the first area and the second area may be areas into which the display area is divided in the first direction, and the second area may be closer to the first voltage wiring than the first area.

According to some embodiments, lengths of the plurality of second auxiliary patterns and lengths of the plurality of third auxiliary patterns may each monotonically decrease in the second direction.

According to some embodiments, the plurality of first voltage lines may be arranged on the plurality of first auxiliary lines and the plurality of second auxiliary lines, the plurality of first auxiliary patterns may be arranged on the plurality of first auxiliary lines and the plurality of second auxiliary lines, and the plurality of first auxiliary lines and the plurality of second auxiliary lines may be arranged on a same layer.

According to some embodiments, the plurality of second voltage lines may be arranged on a same layer as the plurality of first auxiliary lines and the plurality of second auxiliary lines.

According to some embodiments, the display apparatus may further include a plurality of third auxiliary lines extending in the second direction on the second area, and a plurality of fifth connectors connecting at least one of the plurality of first voltage lines, the plurality of second voltage lines, or the plurality of first auxiliary patterns to the plurality of third auxiliary lines.

According to some embodiments, the plurality of third auxiliary lines may be arranged between the plurality of second auxiliary lines.

According to some embodiments, the display apparatus may further include a pad unit arranged on one side of the peripheral area, a plurality of data lines arranged in the first direction on the display area and extending in the second direction, and a plurality of connection lines arranged on the second area of the display area and respectively connected to the plurality of data lines to transmit data signals supplied from the pad unit, to the plurality of data lines.

According to some embodiments, the display apparatus may further include a plurality of fourth auxiliary lines each including a corresponding first auxiliary pattern among the plurality of first auxiliary patterns and a fourth auxiliary pattern spaced apart from the corresponding first auxiliary pattern in the second direction, wherein each of the plurality of second auxiliary lines may further include a fifth auxiliary pattern arranged between the second auxiliary pattern and the third auxiliary pattern, and each of the plurality of connection lines may include a corresponding fourth auxiliary pattern among the plurality of fourth auxiliary patterns and a corresponding fifth auxiliary pattern among the plurality of fifth auxiliary patterns.

According to some embodiments, the display apparatus may further include a second voltage wiring arranged on the peripheral area to surround at least a portion of the display area and including a first portion located on the one side of the peripheral area and a second portion located on another side of the peripheral area; and a plurality of fifth auxiliary lines arranged on the display area and each extending in the second direction to be electrically connected between the first portion of the second voltage wiring and the second portion of the second voltage wiring.

According to some embodiments, the plurality of fifth auxiliary lines and the first auxiliary patterns may be arranged on a same layer and arranged apart from each other at same intervals in the first direction.

According to some embodiments, the display area may include a third area, a fourth area, and a fifth area into which the display area is divided in the second direction, the third area may be located between the fourth area and the fifth area, the plurality of first auxiliary patterns may be arranged in the third area, and the plurality of fifth auxiliary lines may be arranged in the fourth area and the fifth area.

According to some embodiments, the display apparatus may further include a plurality of pixels arranged in a matrix on the display area and connected to at least one of the plurality of first voltage lines or the plurality of second voltage lines, wherein the plurality of first auxiliary patterns may be arranged on at least a partial area of the display area in each pixel row or each pixel column.

According to some embodiments, the plurality of first voltage lines may be arranged in each pixel column or each pair of pixel columns, and the plurality of second voltage lines may be arranged in each pixel row.

According to some embodiments, the plurality of first connectors may be a plurality of contact plugs connecting the plurality of first voltage lines to the plurality of second voltage lines, and the plurality of second connectors may be a plurality of contact plugs connecting the plurality of first auxiliary patterns to the plurality of second voltage lines.

According to some embodiments, the plurality of first voltage lines, the plurality of first auxiliary patterns, and the plurality of second connectors may be arranged on a same layer, and the plurality of second connectors may directly connect the plurality of first auxiliary patterns to the plurality of first voltage lines.

According to one or more embodiments, a display apparatus includes a substrate in which a display area and a peripheral area around the display area are defined, a first voltage wiring arranged to surround at least a portion of the display area and including a first portion located on one side of the peripheral area and a second portion located on another side of the peripheral area, and a plurality of first auxiliary lines arranged on the display area and extending in a first direction to be electrically connected between the first portion of the first voltage wiring and the second portion of the first voltage wiring.

According to some embodiments, the display apparatus may further include a plurality of second auxiliary lines extending in a second direction intersecting with the first direction on the display area.

According to some embodiments, the plurality of second auxiliary lines may be directly connected to the plurality of first auxiliary lines.

According to some embodiments, both ends of each of the plurality of second auxiliary lines may be respectively electrically connected to two different portions of the first voltage wiring.

According to some embodiments, the display apparatus may further include a plurality of display elements arranged on the display area, wherein each of the plurality of display elements may include a pixel electrode on the plurality of first auxiliary lines, an intermediate layer on the pixel electrode, and an opposite electrode arranged on the intermediate layer and connected to the first voltage wiring.

According to some embodiments, the display apparatus may further include a plurality of first auxiliary patterns arranged on the display area and each extending in the first direction and electrically connected to the second portion of the first voltage wiring.

According to some embodiments, the display area may include a first area, a second area, and a third area into which the display area is divided in the first direction, the first area may be located between the second area and the third area, the plurality of first auxiliary patterns may be arranged in the first area, and the plurality of first auxiliary lines may be arranged in the second area and the third area.

According to some embodiments, the display apparatus may further include a plurality of second auxiliary lines arranged in the first direction on the display area and extending in a second direction, and a plurality of first connectors connecting at least one of the plurality of first auxiliary lines or the plurality of first auxiliary patterns to the plurality of second auxiliary lines.

According to some embodiments, the display apparatus may further include a plurality of third auxiliary lines arranged in the first direction on the display area and each including a second auxiliary pattern and a third auxiliary pattern spaced apart from each other in a second direction, and a plurality of second connectors connecting the plurality of first auxiliary lines to the plurality of second auxiliary patterns and the plurality of third auxiliary patterns.

According to some embodiments, lengths of the plurality of second auxiliary patterns and lengths of the plurality of third auxiliary patterns may each monotonically decrease in the first direction.

According to some embodiments, the display apparatus may further include a second voltage wiring arranged on one side of the peripheral area, wherein each of the plurality of third auxiliary lines may further include a fourth auxiliary pattern arranged between the second auxiliary pattern and the third auxiliary pattern and electrically connected to the second voltage wiring.

According to some embodiments, the display apparatus may further include a pad unit arranged on one side of the peripheral area, a plurality of data lines arranged in the second direction on the display area and extending in the first direction, a plurality of connection lines arranged on the display area and respectively connected to the plurality of data lines to transmit data signals supplied from the pad unit, to the plurality of data lines, and a plurality of fourth auxiliary lines arranged on the display area and each including a first auxiliary pattern extending in the first direction and electrically connected to the second portion of the first voltage wiring and a fifth auxiliary pattern spaced apart from the first auxiliary pattern in the second direction, wherein each of the plurality of third auxiliary lines may further include a fourth auxiliary pattern arranged between the second auxiliary pattern and the third auxiliary pattern, and each of the plurality of connection lines may include a corresponding fourth auxiliary pattern among the plurality of fourth auxiliary patterns and a corresponding fifth auxiliary pattern among the plurality of fifth auxiliary patterns.

According to some embodiments, the display apparatus may further include a plurality of pixels arranged in a matrix on the display area and electrically connected to the first voltage wiring, wherein the plurality of first auxiliary lines may be arranged on at least a partial area of the display area in each pixel row or each pixel column.

According to some embodiments, the display apparatus may further include a second voltage wiring arranged on one side of the peripheral area, a plurality of first voltage lines arranged in a second direction on the display area, extending in the first direction, and electrically connected to the second voltage wiring, a plurality of second voltage lines arranged in the first direction on the display area and extending in the second direction, a plurality of third connectors connecting the plurality of first voltage lines to the plurality of second voltage lines, a plurality of sixth auxiliary patterns extending in the first direction or the second direction on the display area, and a plurality of fourth connectors connecting at least one of the plurality of first voltage lines or the plurality of second voltage lines to the plurality of sixth auxiliary patterns.

According to one or more embodiments, a display apparatus includes a substrate in which a first display area, second display areas located on both sides of the first display area in a first direction, and a peripheral area around the first and second display areas are defined, a pad unit arranged in the peripheral area and including a plurality of first pads and a plurality of second pads, a plurality of first data lines extending in a second direction on the first display area and respectively connected to the plurality of first pads, a plurality of second data lines extending in the second direction on the second display areas, a plurality of auxiliary row lines extending in the first direction on the first display area and the second display areas, and a plurality of auxiliary column lines extending in the second direction on the first display area and the second display areas, wherein first auxiliary column lines that are some of the plurality of auxiliary column lines include first column connection portions respectively connected to the plurality of second pads, first auxiliary row lines that are some of the plurality of auxiliary row lines include first row connection portions respectively connecting the first column connection portions of the first auxiliary column lines to the plurality of second data lines, a first driving voltage is applied to second auxiliary row lines that are some others of the plurality of auxiliary row lines, and a second driving voltage having a different level than the first driving voltage is applied to second auxiliary column lines that are some others of the plurality of auxiliary column lines.

According to some embodiments, the first auxiliary column lines may respectively include second column connection portions to which the first driving voltage is applied, and the second column connection portions of the first auxiliary column lines may be respectively spaced apart from the first column connection portions of the first auxiliary column lines.

According to some embodiments, the first auxiliary row lines may respectively include second row connection portions to which the first driving voltage is applied, and the second row connection portions of the first auxiliary row lines may be respectively spaced apart from the first row connection portions of the first auxiliary row lines.

According to some embodiments, at least one of the second auxiliary row lines may be arranged between the first auxiliary row lines.

According to some embodiments, the display apparatus may further include a first voltage wiring arranged in the peripheral area and configured to transmit the first driving voltage, and a second voltage wiring arranged in the peripheral area and configured to transmit the second driving voltage.

According to one or more embodiments, a display apparatus includes a substrate in which a first display area, second display areas located on both sides of the first display area in a first direction, and a peripheral area around the first and second display areas are defined, a pad unit arranged in the peripheral area and including a plurality of first pads and a plurality of second pads, a plurality of first data lines extending in a second direction on the first display area and respectively connected to the plurality of first pads, a plurality of second data lines extending in the second direction on the second display areas, a plurality of auxiliary row lines extending in the first direction on the first display area and the second display areas, and a plurality of auxiliary column lines extending in the second direction on the first display area and the second display areas, wherein first auxiliary column lines that are some of the plurality of auxiliary column lines include first column connection portions respectively connected to the plurality of second pads, first auxiliary row lines that are some of the plurality of auxiliary row lines include first row connection portions respectively connecting the first column connection portions of the first auxiliary column lines to the plurality of second data lines, a second driving voltage is applied to second auxiliary row lines that are some others of the plurality of auxiliary row lines, and the second driving voltage is applied to second auxiliary column lines that are some others of the plurality of auxiliary column lines.

According to some embodiments, the first auxiliary column lines may respectively include second column connection portions to which the second driving voltage is applied, and the second column connection portions of the first auxiliary column lines may be respectively spaced apart from the first column connection portions of the first auxiliary column lines.

According to some embodiments, the first auxiliary row lines may respectively include second row connection portions to which the second driving voltage is applied, and the second row connection portions of the first auxiliary row lines may be respectively spaced apart from the first row connection portions of the first auxiliary row lines.

According to some embodiments, the first auxiliary row lines may respectively include third row connection portions to which a first driving voltage having a different level than the second driving voltage is applied, and the third row connection portions of the first auxiliary row lines may be respectively spaced apart from the first row connection portions of the first auxiliary row lines.

Other aspects, features, and characteristics other than those described above will become apparent from the following detailed description, the appended claims, and the accompanying drawings.

These general and particular aspects may be implemented by using systems, methods, computer programs, or any combinations of systems, methods, and computer programs.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
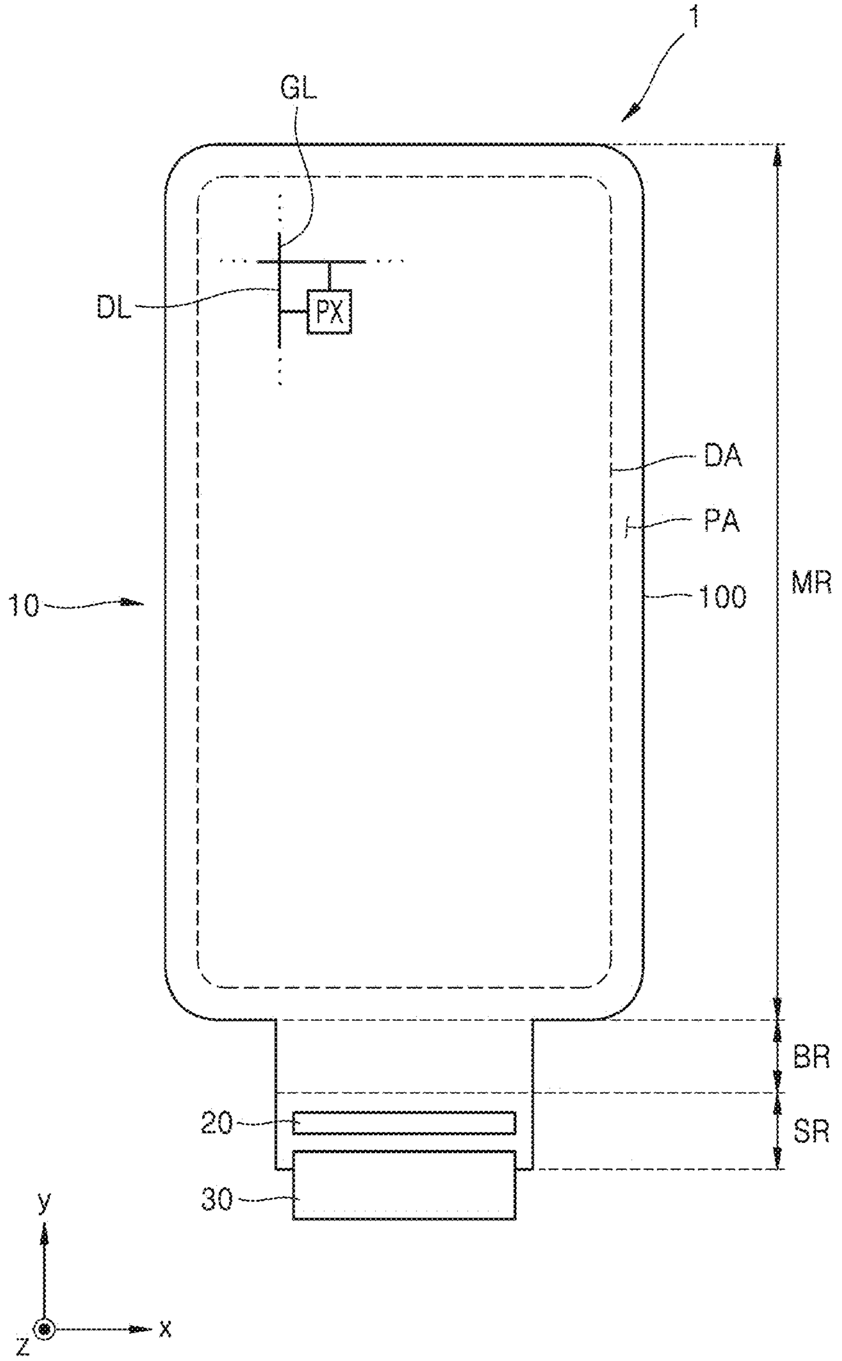
FIG. 1 is a plan view schematically illustrating a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component and/or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

Figure 2:
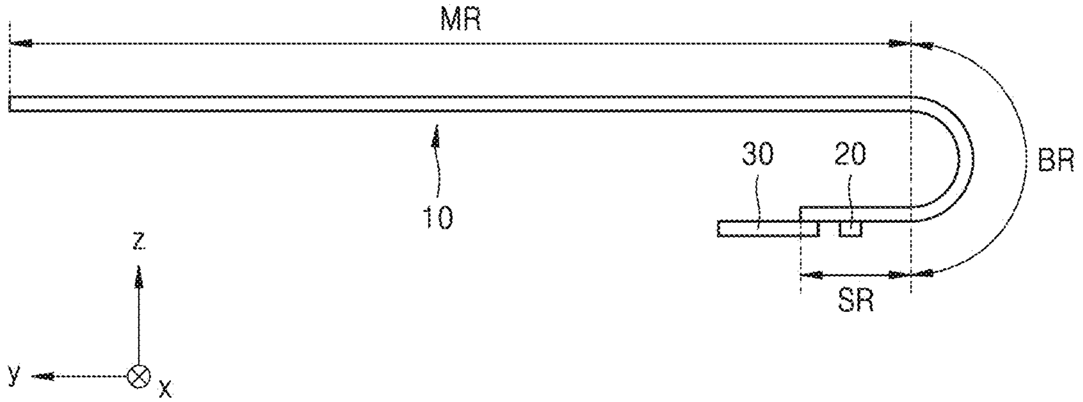
FIG. 2 is a side view schematically illustrating a display apparatus according to some embodiments.

FIG. 1 is a plan view schematically illustrating a display apparatus according to some embodiments, and FIG. 2 is a side view schematically illustrating a display apparatus according to some embodiments. Although a portion of the display apparatus according to some embodiments may be bent, FIG. 1 illustrates that it is not bent, for convenience.

Referring to FIG. 1, a display apparatus 1 may include a display panel 10. The display apparatus 1 may be of any type as long as it includes the display panel 10. For example, the display apparatus 1 may include various products such as smartphones, tablets, laptops, televisions, or billboards.

The display panel 10 may include a display area DA and a peripheral area PA outside (or around) the display area DA. As illustrated in FIG. 1, the peripheral area PA may be arranged to surround (e.g., outside a footprint, or in a periphery, of) the display area DA. In the plan view (e.g., in a view from the z-direction, or perpendicular or normal with respect to a plane that is parallel to the plane of the display area DA), the display area DA may have a rectangular shape (e.g., with rounded or square corners, or any other suitable shape corners) as in FIG. 1. In other embodiments, the display area DA may have a polygonal shape such as a triangular, pentagonal, or hexagonal shape, a circular shape, an elliptical shape, an atypical shape, or the like.

Because the display panel 10 includes a substrate 100, it may be said that the substrate 100 may include the display area DA and the peripheral area PA. In other words, it may be said that the display area DA and the peripheral area PA are defined in the substrate 100.

Also, the display panel 10 may be referred to as including a main region MR, a bending region BR outside the main region MR, and a sub region SR located opposite the main region MR with respect to the bending region BR. The sub region SR may correspond to one side of the peripheral area PA. As illustrated in FIG. 2, the display panel 10 may be bent in the bending region BR such that at least a portion of the sub region SR may overlap the main region MR in a view in the z-axis direction. However, the disclosure is not limited to a bent display apparatus 1 and may also be applied to an unbent display apparatus 1. The sub region SR may be a non-display area. By allowing the display panel 10 to be bent in the bending region BR, the non-display area may not be viewed when the display apparatus 1 is viewed from the front (in the −z direction) or the viewed area thereof may be minimized (or reduced) even when it is viewed.

A driving chip 20 may be arranged in the sub region SR of the display panel 10. The driving chip 20 may include an integrated circuit for driving the display panel 10. The integrated circuit may be a data driving integrated circuit for generating a data signal; however, embodiments according to the present disclosure are not limited thereto.

The driving chip 20 may be mounted on the sub region SR of the display panel 10. The driving chip 20 may be mounted on the same surface as the display surface of the display area DA; however, as the display panel 10 is bent in the bending region BR as described above, the driving chip 20 may be located on the rear surface of the main region MR.

A printed circuit board 30 or the like may be attached to an end portion of the sub region SR of the display panel 10. The printed circuit board 30 may be electrically connected to the driving chip 20 or the like through pads on the substrate. FIG. 1 illustrates that the driving chip 20 is arranged on the sub region SR; however, as another example, the driving chip 20 may be arranged on the printed circuit board 30.

The display panel 10 may include the substrate 100. The substrate 100 may include glass, metal, or polymer resin. When the display panel 10 is bent in the bending region BR as described above, the substrate 100 may need to have flexible or bendable characteristics. In this case, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may be variously modified such as including a multilayer structure including two layers including the polymer resin and a barrier layer arranged between the two layers and including an inorganic material (e.g., silicon oxide, silicon nitride, or silicon oxynitride).

The display panel 10 may provide an image by using a plurality of pixels PX. The pixels PX may be arranged in a matrix on the display area DA. The pixels PX may be arranged, for example, in a matrix form including a plurality of pixel columns extending in a first direction (e.g., ±y direction) and a plurality of pixel rows extending in a second direction (e.g., ±x direction). The pixels PX may be arranged in various forms such as stripe arrangement, pentile arrangement, and mosaic arrangement to implement an image.

Each of the pixels PX may include a display element and a pixel circuit for driving the display element. For example, the display element may be an organic light emitting diode OLED, and the pixel circuit may include a plurality of transistors and a storage capacitor. Each pixel PX may emit, for example, red, green, blue, or white light through the organic light emitting diode OLED. Hereinafter, each pixel PX may refer to each of subpixels emitting different colors, and each pixel PX may be, for example, one of a red subpixel, a green subpixel, and a blue subpixel.

Signal lines through which electrical signals may be applied to the pixels PX may be located in the display area DA of the display panel 10. The signal lines through which electrical signals may be applied to the pixels PX may include a plurality of gate lines GL and a plurality of data lines DL.

Each of the plurality of data lines DL may extend in the first direction (e.g., ±y direction), and each of the plurality of gate lines GL may extend in the second direction (e.g., ±x direction). The plurality of data lines DL may be arranged, for example, in a plurality of columns to transmit a data signal to the pixels PX, and the plurality of gate lines GL may be arranged, for example, in a plurality of rows to transmit a gate signal to the pixels PX. Each of the pixels PX may be connected to a corresponding data line DL among the plurality of data lines DL and to at least one corresponding gate line GL among the plurality of gate lines GL.

Although the gate line GL is illustrated as one line in FIG. 1, each of the gate lines GL may include a plurality of lines. For example, the gate line GL may include a scan line, an emission control line, and the like. In this case, the gate signal may include a scan signal, an emission control signal, and the like.

Figure 3:
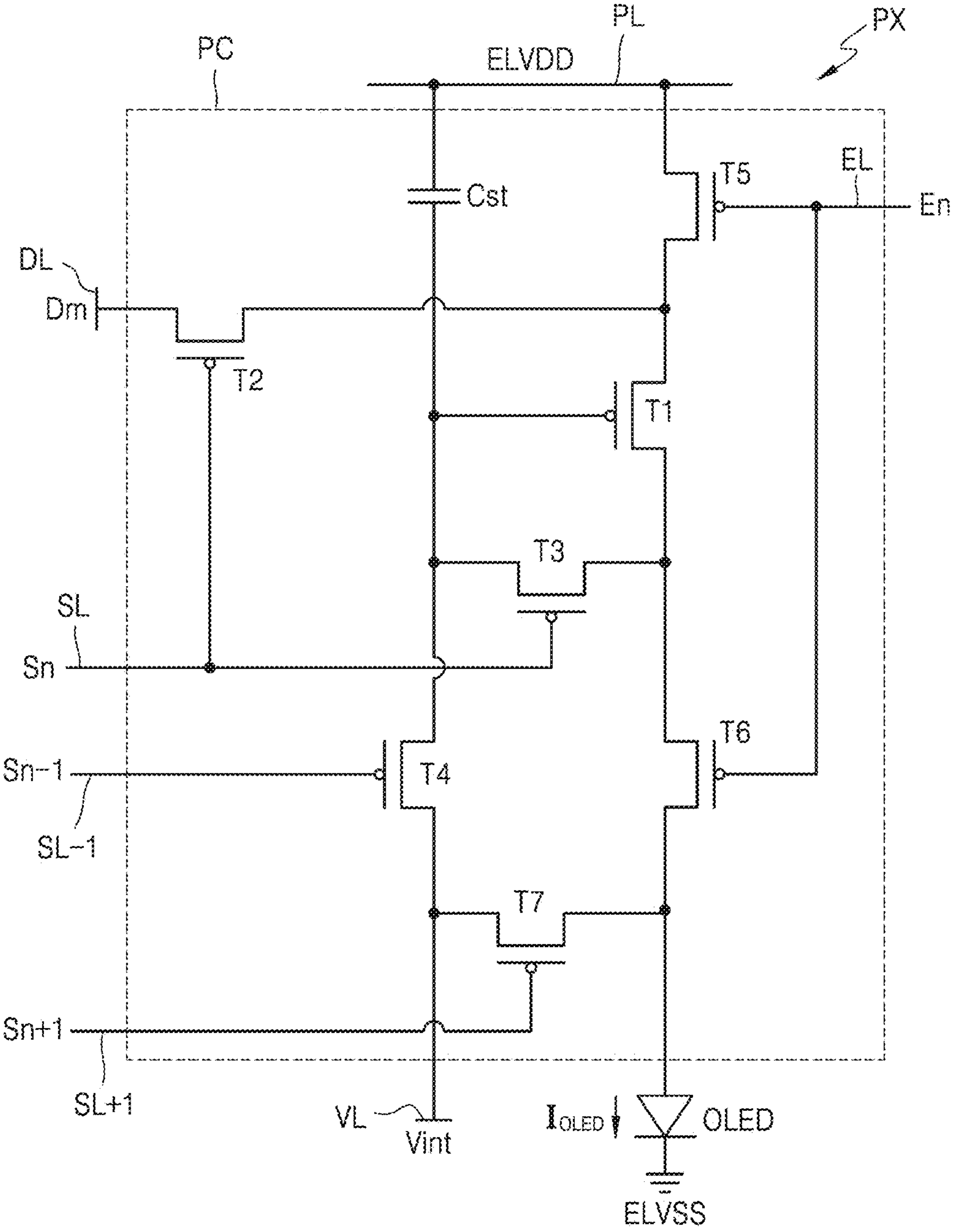
FIG. 3 is an equivalent circuit diagram schematically illustrating a pixel according to some embodiments.

FIG. 3 is an equivalent circuit diagram schematically illustrating a pixel according to some embodiments.

Referring to FIG. 3, a pixel PX may include a pixel circuit PC and an organic light emitting diode OLED electrically connected to the pixel circuit PC.

For example, as illustrated in FIG. 3, the pixel circuit PC may include first to seventh transistors T1 to T7 and a storage capacitor Cst. Embodiments according to the present disclosure are not limited thereto, however. For example, some embodiments may include additional electrical components or fewer electrical components, and/or a different arrangement of components, without departing from the spirit and scope of embodiments according to the present disclosure.

The first to seventh transistors T1 to T7 and the storage capacitor Cst may be connected to first to third scan lines SL, SL−1, and SL+1 configured to respectively transmit first to third scan signals Sn, Sn−1, and Sn+1, a data line DL configured to transmit a data voltage Dm, an emission control line EL configured to transmit an emission control signal En, a driving voltage line PL configured to transmit a first driving voltage ELVDD, an initialization voltage line VL configured to transmit an initialization voltage Vint, and a common electrode to which a second driving voltage ELVSS is applied.

The first transistor T1 may be a driving transistor whose drain current is determined according to a gate-source voltage, and the second to seventh transistors T2 to T7 may be switching transistors that are turned on/off according to a gate-source voltage, substantially a gate voltage. The first to seventh transistors T1 to T7 may be thin film transistors, according to some embodiments, although embodiments according to the present disclosure are not limited thereto.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst may be connected between the driving voltage line PL and the gate of the driving transistor T1. The storage capacitor Cst may include an upper electrode CE2 connected to the driving voltage line PL and a lower electrode CE1 connected to the gate of the driving transistor T1.

The driving transistor T1 may be configured to control the level of a driving current $I_{OLED}$ flowing from the driving voltage line PL to the organic light emitting diode OLED according to the gate-source voltage. The driving transistor T1 may include a gate connected to the lower electrode CE1 of the storage capacitor Cst, a source connected to the driving voltage line PL through the first emission control transistor T5, and a drain connected to the organic light emitting diode OLED through the second emission control transistor T6.

The driving transistor T1 may output the driving current $I_{OLED}$ to the organic light emitting diode OLED according to the gate-source voltage. The level of the driving current $I_{OLED}$ may be determined based on the difference between the gate-source voltage and the threshold voltage of the driving transistor T1. The organic light emitting diode OLED may receive the driving current $I_{OLED}$ from the driving transistor T1 and emit light with a brightness according to the level of the driving current $I_{OLED}$.

The scan transistor T2 may be configured to transmit the data voltage Dm to the source of the driving transistor T1 in response to the first scan signal Sn. The scan transistor T2 may include a gate connected to the first scan line SL, a source connected to the data line DL, and a drain connected to the source of the driving transistor T1.

The compensation transistor T3 may be connected in series between the drain and the gate of the driving transistor T1 and may be configured to connect the drain and the gate of the driving transistor T1 to each other in response to the first scan signal Sn. The compensation transistor T3 may include a gate connected to the first scan line SL, a source connected to the drain of the driving transistor T1, and a drain connected to the gate of the driving transistor T1. Although FIG. 3 illustrates that the compensation transistor T3 includes one transistor, the compensation transistor T3 may include two transistors connected in series to each other.

The gate initialization transistor T4 may be configured to apply the initialization voltage Vint to the gate of the driving transistor T1 in response to the second scan signal Sn−1. The gate initialization transistor T4 may include a gate connected to the second scan line SL−1, a source connected to the gate of the driving transistor T1, and a drain connected to the initialization voltage line VL. Although FIG. 3 illustrated that the gate initialization transistor T4 includes one transistor, the gate initialization transistor T4 may include two transistors connected in series to each other.

The anode initialization transistor T7 may be configured to apply the initialization voltage Vint to the anode of the organic light emitting diode OLED in response to the third scan signal Sn+1. The anode initialization transistor T7 may include a gate connected to the third scan line SL+1, a source connected to the anode of the organic light emitting diode OLED, and a drain connected to the initialization voltage line VL.

The first emission control transistor T5 may be configured to connect the driving voltage line PL and the source of the driving transistor T1 to each other in response to the emission control signal En. The first emission control transistor T5 may include a gate connected to the emission control line EL, a source connected to the driving voltage line PL, and a drain connected to the source of the driving transistor T1.

The second emission control transistor T6 may be configured to connect the drain of the driving transistor T1 and the anode of the organic light emitting diode OLED to each other in response to the emission control signal En. The second emission control transistor T6 may include a gate connected to the emission control line EL, a source connected to the drain of the driving transistor T1, and a drain connected to the anode of the organic light emitting diode OLED.

The second scan signal Sn−1 may be substantially synchronized with the first scan signal Sn of the previous row. The third scan signal Sn+1 may be substantially synchronized with the first scan signal Sn. According to another example, the third scan signal Sn+1 may be substantially synchronized with the first scan signal Sn of the next row.

According to some embodiments, the first to seventh transistors T1 to T7 may include a semiconductor layer including silicon. For example, the first to seventh transistors T1 to T7 may include a semiconductor layer including low-temperature polysilicon (LTPS). The polysilicon material may have high electron mobility (over 100 $cm^2/Vs$ or more) and thus may have relatively low energy consumption and relatively high reliability.

As another example, the semiconductor layers of the first to seventh transistors T1 to T7 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). For example, the semiconductor layer may be an InSnZnO (ITZO) semiconductor layer, an InGaZnO (IGZO) semiconductor layer, or the like. Embodiments according to the present disclosure are not limited thereto, however, and the first to seventh transistors T1-T7 may include any suitable semiconductor material or compound according to the design of the pixel PX.

As another example, some semiconductor layers of the first to seventh transistors T1 to T7 may include low-temperature polysilicon (LTPS), and other semiconductor layers may include an oxide semiconductor (IGZO or the like).

Hereinafter, an example operation process of a pixel PX of a display apparatus according to some embodiments will be described in more detail. As illustrated in FIG. 3, it is assumed that the first to seventh transistors T1 to T7 are p-type MOSFETs. As a person having ordinary skill in the art would appreciate, however, the first to seventh transistors T1 to T7 may be n-type MOSFETs, with a corresponding difference in operation and connection.

First, when a high-level emission control signal En is received, the first emission control transistor T5 and the second emission control transistor T6 may be turned off, the driving transistor T1 may stop the output of the driving current $I_{OLED}$, and the organic light emitting diode OLED may stop light emission.

Thereafter, during a gate initialization period in which a low-level second scan signal Sn−1 is received, the gate initialization transistor T4 may be turned on and the initialization voltage Vint may be applied to the gate of the driving transistor T1, that is, the lower electrode CE1 of the storage capacitor Cst. The difference (ELVDD-Vint) between the first driving voltage ELVDD and the initialization voltage Vint may be stored in the storage capacitor Cst.

Thereafter, during a data write period in which a low-level first scan signal Sn is received, the scan transistor T2 and the compensation transistor T3 may be turned on and the data voltage Dm may be received at the source of the driving transistor T1. The driving transistor T1 may be diode-connected by the compensation transistor T3 and may be forward biased. The gate voltage of the driving transistor T1 may rise from the initialization voltage Vint. When the gate voltage of the driving transistor T1 becomes equal to a data compensation voltage (Dm−|Vth|) that is equal to a decrease by a threshold voltage Vth of the driving transistor T1 from the data voltage Dm, the driving transistor T1 may be turned off and the rise of the gate voltage of the driving transistor T1 may stop. Accordingly, the difference (ELVDD−Dm+|Vth|) between the first driving voltage ELVDD and the data compensation voltage (Dm−|Vth|) may be stored in the storage capacitor Cst.

Also, during an anode initialization period in which a low-level third scan signal Sn+1 is received, the anode initialization transistor T7 may be turned on and the initialization voltage Vint may be applied to the anode of the organic light emitting diode OLED. By applying the initialization voltage Vint to the anode of the organic light emitting diode OLED to completely stop the organic light emitting diode OLED from emitting light, a phenomenon in which the organic light emitting diode OLED slightly emits light even when the pixel PX receives the data voltage Dm corresponding to a black gray scale in the next frame may be eliminated.

The first scan signal Sn and the third scan signal Sn+1 may be substantially synchronized with each other, and in this case, the data write period and the anode initialization period may be the same period.

Thereafter, when a low-level emission control signal En is received, the first emission control transistor T5 and the second emission control transistor T6 may be turned on, the driving transistor T1 may output the driving current $I_{OLED}$ corresponding to the voltage stored in the storage capacitor Cst, that is, the voltage (ELVDD−Dm) obtained by subtracting the threshold voltage |Vth| of the driving transistor T1 from the source-gate voltage (ELVDD−Dm+|Vth|) of the driving transistor T1, and the organic light emitting diode OLED may emit light with a luminance corresponding to the level of the driving current $I_{OLED}$.

Moreover, although FIG. 3 illustrates an example in which the pixel circuit PC includes seven transistors and one storage capacitor, the disclosure is not limited thereto. For example, the pixel circuit PC may include two or more transistors and/or two or more storage capacitors. According to some embodiments, the pixel circuit PC may include two transistors and one storage capacitor.

Figure 4:
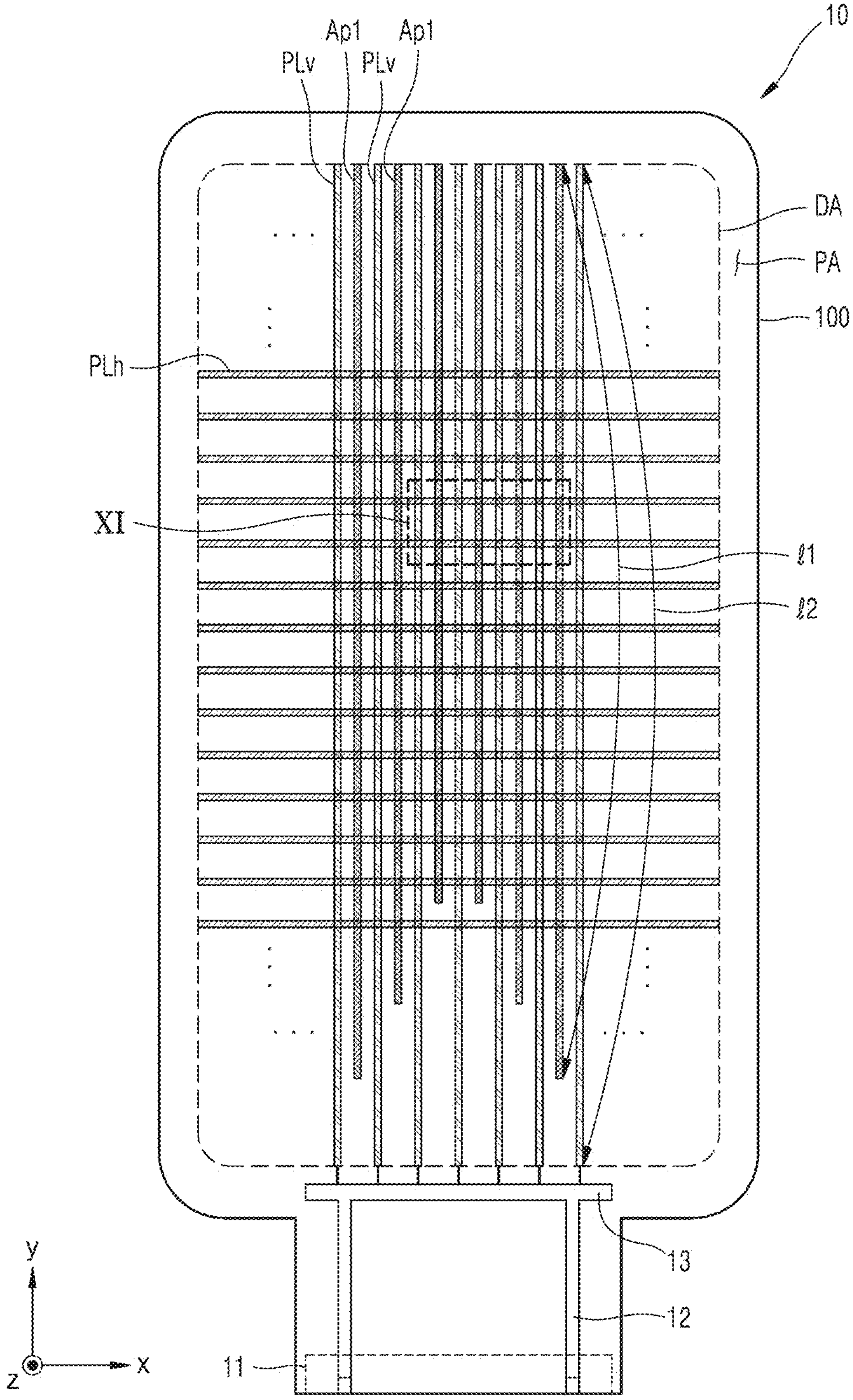
FIG. 4 is a plan view schematically illustrating a display panel according to some embodiments.

FIG. 4 is a plan view schematically illustrating a display panel according to some embodiments.

Referring to FIG. 4, a display panel 10 may include a display area DA and a peripheral area PA around the display area DA. Because the display panel 10 includes a substrate 100, it may be said that the substrate 100 may include the display area DA and the peripheral area PA. In other words, it may be said that the display area DA and the peripheral area PA are defined in the substrate 100.

A plurality of first voltage lines PLv, a plurality of second voltage lines PLh, and a plurality of first auxiliary patterns Ap1 may be arranged in the display area DA of the display panel 10.

The first voltage lines PLv may be arranged in the second direction (e.g., ±x direction) and may extend in the first direction (e.g., ±y direction). The first voltage lines PLv may be electrically connected to a first voltage wiring 13 described below. The first voltage lines PLv may receive a first voltage from the first voltage wiring 13.

Figure 5:
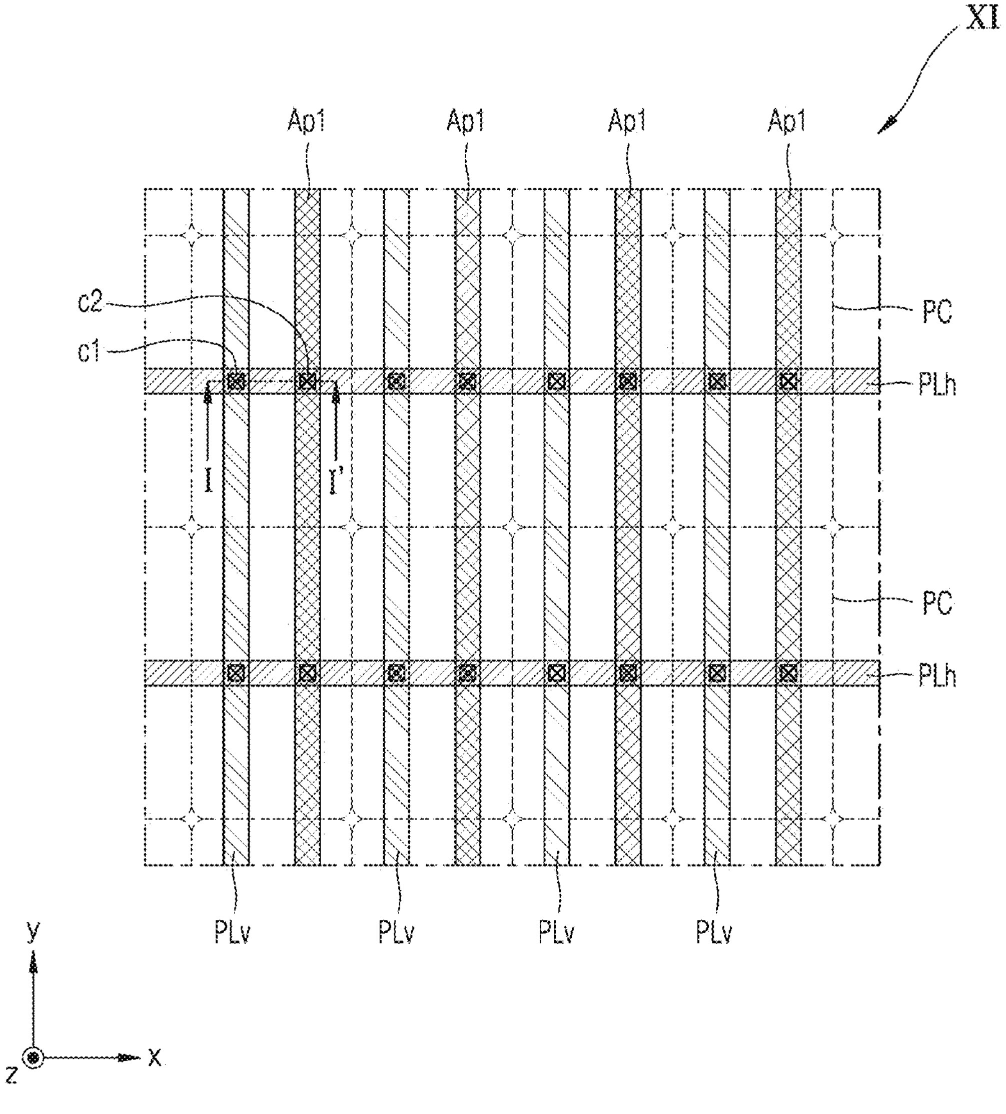
FIG. 5 is an enlarged plan view schematically illustrating a portion of the display panel of FIG. 4.
Figure 10:
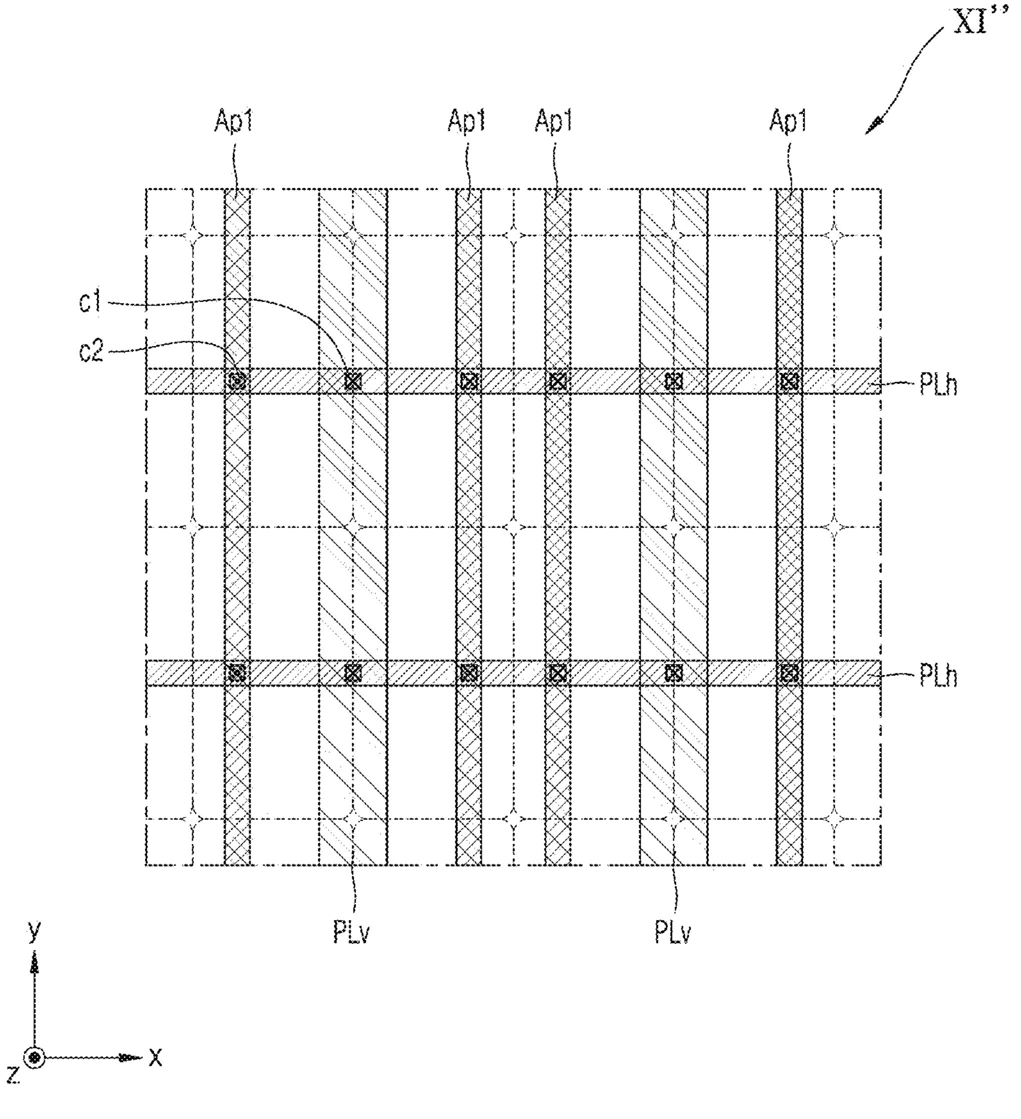
FIG. 10 is an enlarged plan view schematically illustrating a portion of the display panel of FIG. 4.

The first voltage lines PLv may be arranged in each pixel column or each pair of pixel columns as illustrated in FIGS. 5 and 10 described below. Thus, the first voltage lines PLv may extend in the first direction (e.g., ±y direction) to be connected to the pixels PX (FIG. 1) located in the same column and may be configured to transmit the first voltage to the pixels PX of the same column.

The second voltage lines PLh may be arranged in the first direction (e.g., ±y direction) and may extend in the second direction (e.g., ±x direction). The second voltage lines PLh may be electrically connected to the first voltage lines PLv. Because the second voltage lines PLh may be electrically connected to the first voltage lines PLv, the second voltage lines PLh may receive the first voltage from the first voltage lines PLv.

The second voltage lines PLh may be arranged in each pixel row as illustrated in FIG. 5 described below. Thus, the second voltage lines PLh may extend in the second direction (e.g., ±x direction) to be connected to the pixels PX located in the same row and may be configured to transmit the first voltage to the pixels PX of the same row.

Figure 8:
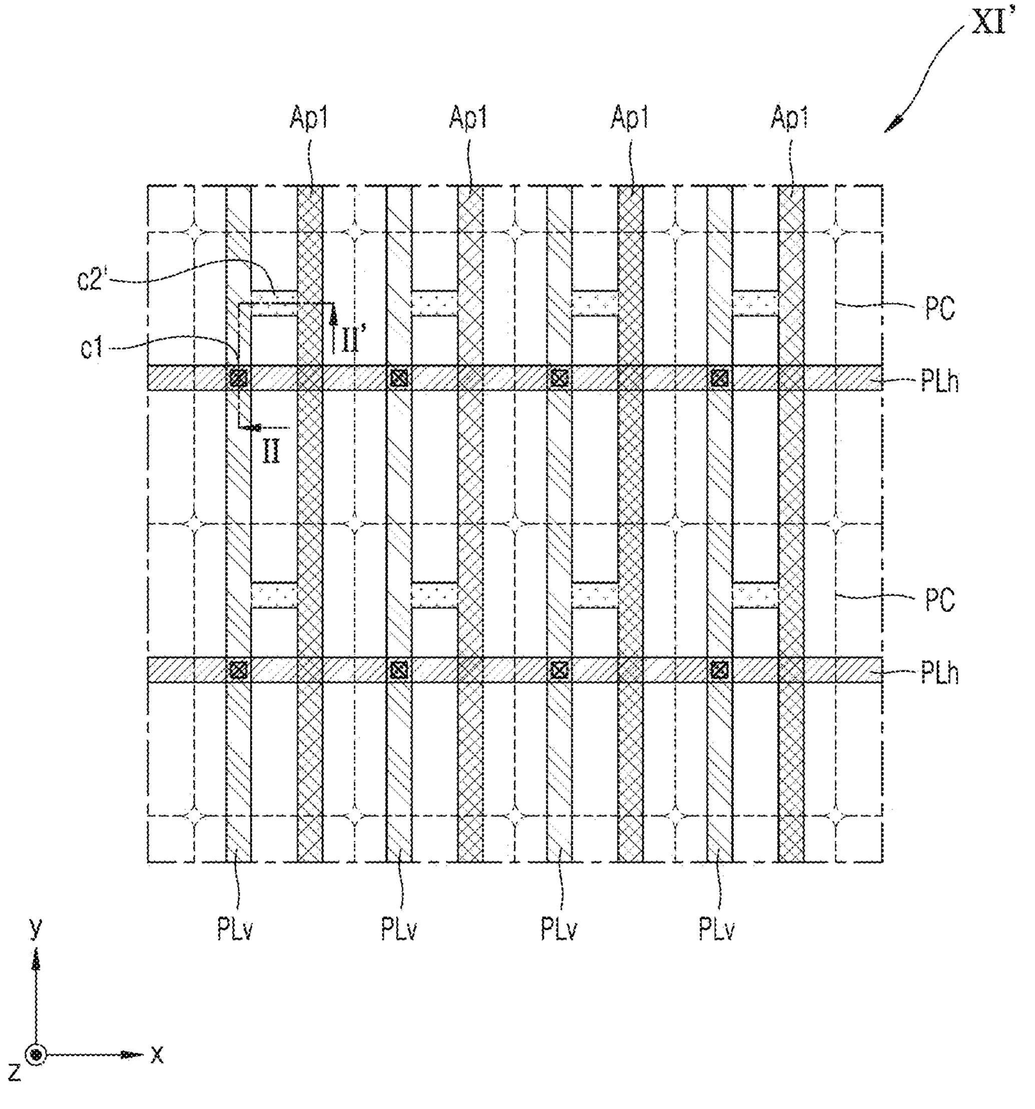
FIG. 8 is an enlarged plan view schematically illustrating a portion of the display panel of FIG. 4.

The second voltage lines PLh may be directly connected to the first voltage lines PLv. For example, as illustrated in FIGS. 5 and 8 described below, the second voltage lines PLh may be directly connected to the first voltage lines PLv through a plurality of first connectors c1. The first connectors c1 may be a portion that is buried in a contact hole formed in an insulating layer to connect an upper layer and a lower layer or may be a portion that connects one line and another line formed on the same layer.

As such, the first voltage lines PLv and the second voltage lines PLh may be connected to each other to form a voltage line of a grid shape (or a mesh structure). The voltage line may correspond to the driving voltage line PL described above with reference to FIG. 3, and the first voltage transmitted to the pixels PX by the voltage line may correspond to the first driving voltage ELVDD. When the driving voltage line PL is formed in a grid shape (or a mesh structure), a voltage drop of the first driving voltage ELVDD may be prevented or reduced by the driving voltage line PL of a grid shape (or a mesh structure) and the luminance uniformity of the pixels PX may be improved.

The first auxiliary patterns Ap1 may be arranged in the second direction (e.g., ±x direction) and may extend in the first direction (e.g., ±y direction). The first auxiliary patterns Ap1 may be arranged on at least a partial area of the display area DA in each pixel column as illustrated in FIG. 5 described below.

According to some embodiments, first auxiliary patterns Ap1 may be arranged between adjacent first voltage lines PLv among the plurality of first voltage lines PLv. For example, when the first voltage lines PLv are arranged in each pixel column as illustrated in FIG. 5 described below, one first auxiliary pattern Ap1 may be arranged between the first voltage lines PLv adjacent to each other. In other words, the first voltage lines PLv and the first auxiliary patterns Ap1 may be alternately arranged in the second direction (e.g., ±x direction). As another example, when the first voltage lines PLv are arranged in each pair of pixel columns as illustrated in FIG. 10 described below, two first auxiliary patterns Ap1 may be arranged between the first voltage lines PLv adjacent to each other.

According to some embodiments, the first auxiliary patterns Ap1 may be connected to at least one of the first voltage lines PLv or the second voltage lines PLh. For example, as illustrated in FIGS. 5 and 8 described below, the first auxiliary patterns Ap1 may be directly connected to at least one of the first voltage lines PLv or the second voltage lines PLh through a plurality of second connectors c2 and c2'. The second connectors c2 and c2' may be a portion that is buried in a contact hole formed in an insulating layer to connect an upper layer and a lower layer or may be a portion that connects one line and another line formed on the same layer.

As such, the first auxiliary patterns Ap1 may form a driving voltage line PL of a grid shape (or a mesh structure) together with the first voltage lines PLv and the second voltage lines PLh. In this case, the driving voltage line PL may have a denser grid shape (or mesh structure) than when it has a grid shape (or a mesh structure) through the first voltage lines PLv and the second voltage lines PLh.

In order to increase the display area DA of the display panel 10, the width of the first voltage wiring 13 arranged in the peripheral area PA may be relatively reduced. As the width of the first voltage wiring 13 decreases, the luminance uniformity of the pixels PX may also decrease. However, when the grid shape (or mesh structure) of the driving voltage line PL is densely formed through the first auxiliary patterns Ap1 according to some embodiments, a voltage drop of the first driving voltage ELVDD due to a decrease in the width of the first voltage wiring 13 may be prevented or reduced and the luminance uniformity of the pixels PX may be improved or maintained. That is, the relatively dense grid or mesh shape/structure of the driving voltage lines may enable the first driving voltage ELVDD to be stably maintained.

According to some embodiments, as illustrated in FIG. 4, a first length l1 of one of the first auxiliary patterns Ap1 may be equal to or less than a second length l2 of the first voltage line PLv adjacent to the one of the first auxiliary patterns Ap1 among the first voltage lines PLv.

Moreover, as described below in FIGS. 25 and 26, a plurality of sixth auxiliary lines AML6 may be arranged in the display area DA. Each of the sixth auxiliary lines AML6 may include a first auxiliary pattern Ap1 and a fifth auxiliary pattern Ap5. The first auxiliary pattern Ap1 and the fifth auxiliary pattern Ap5 may be spaced apart from each other in the first direction (e.g., ±y direction). The first auxiliary pattern Ap1 and the fifth auxiliary pattern Ap5 may be arranged on the same layer.

In this case, the first auxiliary pattern Ap1 may be connected to at least one of the first voltage lines PLv or the second voltage lines PLh as described above. One end of the fifth auxiliary pattern Ap5 may be connected to an input line IL extending from a pad unit 11, and the other end of the fifth auxiliary pattern Ap5 may be electrically connected to a data line DL. The fifth auxiliary pattern Ap5 may function to transmit a data signal received from the pad unit 11 through the input line IL, to the data line DL.

As such, because the first auxiliary pattern Ap1 and the fifth auxiliary pattern Ap5 having different functions may be arranged on the same layer in the first direction (e.g., ±y direction), the first length l1 of the first auxiliary pattern of Ap1 may be less than the second length l2 of the first voltage line PLv adjacent to the first auxiliary pattern Ap1. Alternatively, in a partial area of the display area DA where the fifth auxiliary pattern Ap5 is not arranged (e.g., a fourth area AR4 and/or a fifth area AR5 of FIG. 25), the first length l1 of the first auxiliary pattern Ap1 may be equal to the second length l2 of the first voltage line PLv adjacent to the first auxiliary pattern Ap1.

Referring back to FIG. 4, a pad unit 11 and a first voltage wiring 13 may be arranged in the peripheral area PA of the display panel 10. The first voltage wiring 13 may be electrically connected to the pad unit 11 through a first connection wiring 12.

The pad unit 11 may be arranged on one side of the peripheral area PA. The pad unit 11 may be exposed by not being covered by an insulating layer, to be electrically connected to the printed circuit board 30 described above with reference FIG. 1. The terminals of the printed circuit board 30 may be electrically connected to the pads of the pad unit 11 respectively. The printed circuit board 30 may be configured to transmit the signal, power, or voltage of a controller to the display panel 10 through the pad unit 11.

For example, the controller may provide a first voltage to the first voltage wiring 13 through the first connection wiring 12. The first voltage may be provided to each pixel PX through the first voltage line PLv and/or the second voltage line PLh electrically connected to the first voltage wiring 13. Here, the first voltage may correspond to the first driving voltage ELVDD described above with reference to FIG. 3, and the first voltage line PLv and/or the second voltage line PLh may correspond to the driving voltage line PL.

The first voltage wiring 13 may extend in the second direction (e.g., ±x direction). FIG. 4 illustrates that the first voltage wiring 13 is arranged on one side of the peripheral area PA; however, in other embodiments, a plurality of first voltage wirings 13 may be provided or formed and the first voltage wirings 13 may be respectively arranged on one side and the other side of the peripheral area PA. The first voltage wirings 13 may extend in parallel in the second direction (e.g., ±x direction) with the display area DA therebetween.

Figure 6:
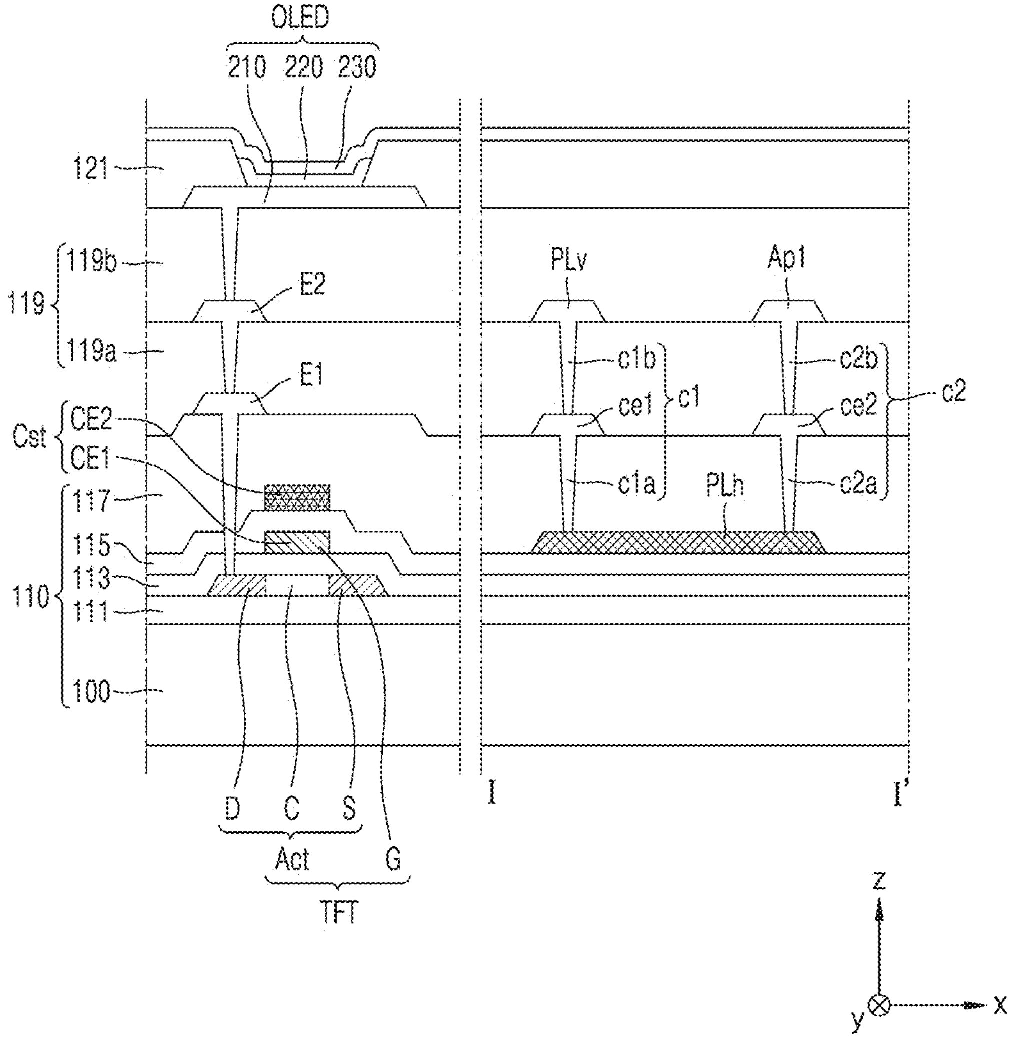
FIG. 6 is an example of a cross-sectional view of a portion of the display panel of FIG. 5 taken along the line I-I'.
Figure 7:
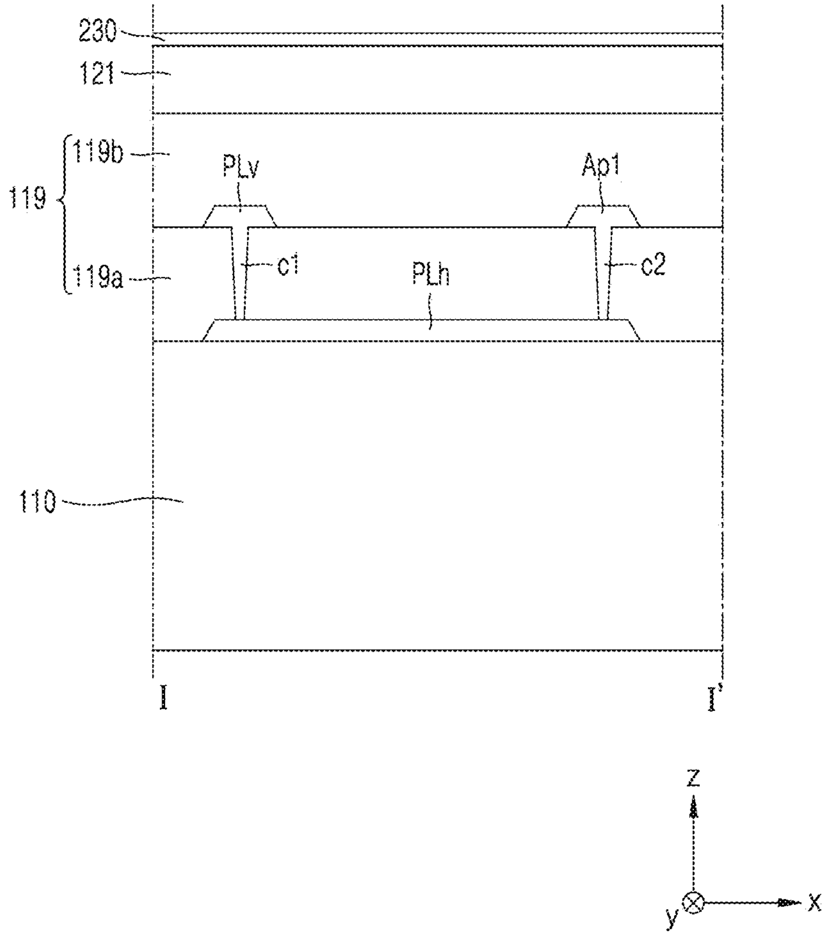
FIG. 7 is an example of a cross-sectional view of a portion of the display panel of FIG. 5 taken along the line I-I'.

FIG. 5 is an enlarged plan view schematically illustrating a portion of the display panel of FIG. 4, and FIGS. 6 and 7 are examples of cross-sectional views of a portion of the display panel of FIG. 5 taken along the line I-I'.

FIG. 5 is an enlarged plan view schematically illustrating a portion of the display area DA of FIG. 4. As described above with reference to FIG. 1, the pixels PX may be arranged in a matrix on the display area DA. The pixels PX may be arranged, for example, in a matrix form including a plurality of pixel columns extending in the first direction (e.g., ±y direction) and a plurality of pixel rows extending in the second direction (e.g., ±x direction).

Because each of the pixels PX may include a pixel circuit PC, a plurality of pixel circuits PC may be arranged in a matrix on the display area DA as illustrated in FIG. 5. The pixel circuits PC may be arranged, for example, in a matrix form including a plurality of pixel circuit columns extending in the first direction (e.g., ±y direction) and a plurality of pixel circuit rows extending in the second direction (e.g., ±x direction).

According to some embodiments, the first voltage lines PLv may extend in the first direction (e.g., ±y direction) and may be arranged in each pixel circuit column (or pixel column). The second voltage lines PLh may extend in the second direction (e.g., ±x direction) and may be arranged in each pixel circuit row (or pixel row). The first auxiliary patterns Ap1 may extend in the first direction (e.g., ±y direction) and may be arranged in each pixel circuit column (or pixel column).

In other words, one pixel circuit PC may overlap one first voltage line PLv, one second voltage line PLh, and one first auxiliary pattern Ap1. One first voltage line PLv, one second voltage line PLh, and one first auxiliary pattern Ap1 may be connected to one pixel circuit PC.

According to some embodiments, the second voltage lines PLh may be directly connected to the first voltage lines PLv through a plurality of first connectors c1. The first connector c1 may be a contact plug that is buried in a contact hole formed in an insulating layer to connect the first voltage line PLv to the second voltage line PLh as illustrated in FIGS. 6 and 7. For example, as illustrated in FIG. 6, the first connector c1 may include a (1-1)$^{th}$ contact plug c1*a* buried in a contact hole formed in an interlayer insulating layer 117, a first connection electrode ce1 arranged on the interlayer insulating layer 117, and a (1-2)$^{th}$ contact plug c1*b* buried in a contact hole formed in a first planarization layer 119*a*. As another example, as illustrated in FIG. 7, the first connector c1 may be a contact plug buried in a contact hole formed in the first planarization layer 119*a*.

According to some embodiments, the first auxiliary patterns Ap1 may be directly connected to the second voltage lines PLh through a plurality of second connectors c2. The second connector c2 may be a contact plug that is buried in a contact hole formed in an insulating layer to connect the first auxiliary pattern Ap1 to the second voltage line PLh as illustrated in FIGS. 6 and 7. For example, as illustrated in FIG. 6, the second connector c2 may include a (2-1)$^{th}$ contact plug c2*a* buried in a contact hole formed in the interlayer insulating layer 117, a second connection electrode ce2 arranged on the interlayer insulating layer 117, and a (2-2)$^{th}$ contact plug c2*b* buried in a contact hole formed in the first planarization layer 119*a*. As another example, as illustrated in FIG. 7, the second connector c2 may be a contact plug buried in a contact hole formed in the first planarization layer 119*a*.

Hereinafter, with reference to FIGS. 6 and 7, the configuration included in the display panel 10 (FIG. 4) will be described in more detail according to a stack structure thereof, and the position relationship between the first voltage line PLv, the second voltage line PLh, the first auxiliary pattern Ap1, and the like will be described.

The display panel 10 may include a transistor layer 110, a planarization layer 119, a pixel definition layer 121, and the like. The transistor layer 110 may include a substrate 100, a buffer layer 111, a first gate insulating layer 113, a second gate insulating layer 115, and an interlayer insulating layer 117.

The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayer structure including an inorganic layer and a layer including the above polymer resin.

The buffer layer 111 may reduce or block the penetration of foreign materials, moisture, or external air from the bottom of the substrate 100 and may provide a flat surface on the substrate 100. The buffer layer 111 may include an inorganic material such as oxide or nitride, an organic material, or an organic/inorganic composite and may include a single-layer or multiple-layer structure of an inorganic material and an organic material.

A barrier layer may be further included between the substrate 100 and the buffer layer 111. The barrier layer may function to prevent, reduce, or minimize the penetration of impurities from the substrate 100 or the like into a semiconductor layer Act. The barrier layer may include an inorganic material such as oxide or nitride, an organic material, or an organic/inorganic composite and may include a single-layer or multiple-layer structure of an inorganic material and an organic material.

The semiconductor layer Act may be arranged on the buffer layer 111. The semiconductor layer Act may include amorphous silicon or may include polysilicon. In other embodiments, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn).

The semiconductor layer Act may include a channel area C and a source area S and a drain area D arranged on both sides of the channel area C. The semiconductor layer Act may include a single layer or multiple layers.

A first gate insulating layer 113 and a second gate insulating layer 115 may be stacked and arranged on the substrate 100 to cover the semiconductor layer Act. The first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A gate electrode G may be arranged on the first gate insulating layer 113. The gate electrode G may be arranged to at least partially overlap the semiconductor layer Act. The gate electrode G may include molybdenum (Mo), aluminum (Al), copper (Cu), titanium (Ti), or the like and may include a single layer or multiple layers. For example, the gate electrode G may include a single layer of Mo.

An upper electrode CE2 of a storage capacitor Cst and a second voltage line PLh may be arranged on the second gate insulating layer 115. The upper electrode CE2 and the second voltage line PLh may include molybdenum (Mo), aluminum (Al), copper (Cu), titanium (Ti), or the like and may include a single layer or multiple layers. For example, the upper electrode CE2 and the second voltage line PLh may include a single layer of Mo.

FIG. 6 illustrates that the second voltage line PLh is arranged on the second gate insulating layer 115; however, in other embodiments, as illustrated in FIG. 7, the second voltage line PLh may be arranged on the interlayer insulating layer 117.

According to some embodiments, the storage capacitor Cst may include a lower electrode CE1 and an upper electrode CE2 and may overlap a transistor TFT as illustrated in FIG. 6. For example, the gate electrode G of the transistor TFT may function as the lower electrode CE1 of the storage capacitor Cst. Unlike this, the storage capacitor Cst may not overlap the transistor TFT and may exist separately.

The upper electrode CE2 of the storage capacitor Cst may overlap the lower electrode CE1 with the second gate insulating layer 115 therebetween and may form a capacitance. In this case, the second gate insulating layer 115 may function as a dielectric layer of the storage capacitor Cst.

An interlayer insulating layer 117 may be provided over the second gate insulating layer 115 to cover the upper electrode CE2 of the storage capacitor Cst and the second voltage line PLh. The interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A first electrode E1, a first connection electrode ce1, and a second connection electrode ce2 may be arranged on the interlayer insulating layer 117. The first electrode E1, the first connection electrode ce1, and the second connection electrode ce2 may include a conductive material including molybdenum (Mo), aluminum (Al), copper (Cu), titanium (Ti), or the like and may include a single layer or multiple layers including the above material. For example, the first electrode E1, the first connection electrode ce1, and the second connection electrode ce2 may include a multilayer structure of Ti/Al/Ti.

The first electrode E1 may be connected to the drain area D of the semiconductor layer Act through a contact hole formed in the first gate insulating layer 113, the second gate insulating layer 115, and the interlayer insulating layer 117. FIG. 6 illustrates that the first electrode E1 is connected to the drain area D of the semiconductor layer Act; however, in other embodiments, the first electrode E1 may be connected to the source area S of the semiconductor layer Act.

The first connection electrode ce1 may be connected to the second voltage line PLh through the $(1\text{-}1)^{th}$ contact plug c1*a* buried in the contact hole formed in the interlayer insulating layer 117. The second connection electrode ce2 may be connected to the second voltage line PLh through the $(2\text{-}1)^{th}$ contact plug c2*a* buried in the contact hole formed in the interlayer insulating layer 117.

The first electrode E1, the first connection electrode ce1, and the second connection electrode ce2 may be covered with an inorganic protection layer. The inorganic protection layer may include a single layer or multiple layers of silicon nitride ($SiN_x$) and silicon oxide ($SiO_x$). The inorganic protection layer may be introduced to cover and protect some lines arranged on the interlayer insulating layer 117.

A planarization layer 119 may be arranged to cover the first electrode E1, the first connection electrode ce1, and the second connection electrode ce2, and the planarization layer 119 may include contact holes for connecting the transistor TFT to a pixel electrode 210.

The planarization layer 119 may include a single layer or multiple layers including an organic material and may provide a flat upper surface. The planarization layer 119 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any blend thereof.

According to some embodiments, as illustrated in FIG. 6, the planarization layer 119 may include a first planarization layer 119*a* and a second planarization layer 119*b*.

A second electrode E2, a first voltage line PLv, and a first auxiliary pattern Ap1 may be arranged on the first planarization layer 119*a*. The second electrode E2, the first voltage line PLv, and the first auxiliary pattern Ap1 may include a conductive material including molybdenum (Mo), aluminum (Al), copper (Cu), titanium (Ti), or the like and may include a single layer or multiple layers including the above material. For example, the second electrode E2, the first voltage line PLv, and the first auxiliary pattern Ap1 may include a multilayer structure of Ti/Al/Ti.

The second electrode E2 may be connected to the first electrode E1 through a contact hole formed in the first planarization layer 119*a*.

The first voltage line PLv and the first auxiliary pattern Ap1 may be arranged on the same layer.

The first voltage line PLv may be arranged on a different layer than the second voltage line PLh. For example, as illustrated in FIG. 6, the first voltage line PLv may be arranged on the second voltage line PLh.

The first voltage line PLv and the second voltage line PLh may be connected to each other through a first connector c1.

For example, as illustrated in FIG. 6, the first connector c1 may include a $(1-1)^{th}$ contact plug c1*a*, a first connection electrode ce1, and a $(1-2)^{th}$ contact plug c1*b*. The first voltage line PLv may be connected to the first connection electrode ce1 through the $(1-2)^{th}$ contact plug c1*b* buried in the contact hole formed in the first planarization layer 119*a*. The first connection electrode ce1 may be connected to the second voltage line PLh through the $(1-1)^{th}$ contact plug c1*a*. Because the first connector c1 includes the $(1-1)^{th}$ contact plug c1*a*, the first connection electrode ce1, and the $(1-2)^{th}$ contact plug c1*b*, the first voltage line PLv and the second voltage line PLh may be understood as being connected to each other through the first connector c1.

Moreover, the second voltage line PLh may be arranged on the interlayer insulating layer 117 as illustrated in FIG. 7. In this case, the first connector c1 may be a contact plug that is buried in the contact hole formed in the first planarization layer 119*a* to connect the first voltage line PLv to the second voltage line PLh. The first connector c1 may correspond to a portion of the first voltage line PLv buried in the contact hole formed in the first planarization layer 119*a*. In other words, a portion of the first voltage line PLv buried in the contact hole formed in the first planarization layer 119*a* may be referred to as the first connector c1. In other words, the first connector c1 and the first voltage line PLv may be integral.

The first auxiliary pattern Ap1 may be arranged on a different layer than the second voltage line PLh. For example, as illustrated in FIG. 6, the first auxiliary pattern Ap1 may be arranged on (or above) the second voltage line PLh.

The first auxiliary pattern Ap1 and the second voltage line PLh may be connected to each other through a second connector c2. For example, as illustrated in FIG. 6, the second connector c2 may include a $(2-1)^{th}$ contact plug or via c2*a*, a second connection electrode ce2, and a $(2-2)^{th}$ contact plug or via c2*b*. The first auxiliary pattern Ap1 may be connected to the second connection electrode ce2 through the $(2-2)^{th}$ contact plug or via c2*b* buried in the contact hole formed in the first planarization layer 119*a*. The second connection electrode ce2 may be connected to the second voltage line PLh through the $(2-1)^{th}$ contact plug or via c2*a*. Because the second connector c2 includes the $(2-1)^{th}$ contact plug or via c2*a*, the second connection electrode ce2, and the $(2-2)^{th}$ contact plug c2*b*, the first auxiliary pattern Ap1 and the second voltage line PLh may be understood as being connected to each other through the second connector c2.

Moreover, the first auxiliary pattern Ap1 may be arranged on the interlayer insulating layer 117 as illustrated in FIG. 7. In this case, the second connector c2 may be a contact plug or via that is buried in the contact hole formed in the first planarization layer 119*a* to connect the first auxiliary pattern Ap1 to the second voltage line PLh. The second connector c2 may correspond to a portion of the first auxiliary pattern Ap1 buried in the contact hole formed in the first planarization layer 119*a*. In other words, a portion of the first auxiliary pattern Ap1 buried in the contact hole formed in the first planarization layer 119*a* may be referred to as the second connector c2. In other words, the second connector c2 and the first auxiliary pattern Ap1 may be integrally formed.

In other embodiments, the planarization layer 119 may further include a third planarization layer arranged on the second planarization layer 119*b*. A first electrode E1 and a second voltage line PLh may be arranged on the first planarization layer 119*a*, and a second electrode E2, a first voltage line PLv, and a first auxiliary pattern Ap1 may be arranged on the second planarization layer 119*b*. In this case, the first connector c1 may be a contact plug or via that is buried in the contact hole formed in the second planarization layer 119*b* to connect the first voltage line PLv to the second voltage line PLh. The second connector c2 may be a contact plug or via that is buried in the contact hole formed in the second planarization layer 119*b* to connect the first auxiliary pattern Ap1 to the second voltage line PLh.

An organic light emitting diode OLED that is a display element may be arranged on the planarization layer 119. The organic light emitting diode OLED may include a pixel electrode 210, an intermediate layer 220 including an organic emission layer, and an opposite electrode 230.

The organic light emitting diode OLED may be connected to the transistor TFT through the second electrode E2 and the contact holes formed in the planarization layer 119. As a result, the organic light emitting diode OLED may be electrically connected to the pixel circuit PC including the transistor TFT.

The pixel electrode 210 may include a (semi) transparent electrode or a reflective electrode. In some embodiments, the pixel electrode 210 may include a reflective layer formed of Ag, Mg, Al, Pt, Pd, Au, Ni, Nd, Ir, Cr, or any compound thereof and a transparent or semitransparent electrode layer formed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include ITO/Ag/ITO.

In the display area of the substrate 100, a pixel definition layer 121 may be arranged on the planarization layer 119. The pixel definition layer 121 may cover an edge of the pixel electrode 210 and may include an opening exposing a center portion of the pixel electrode 210. An emission area of the organic light emitting diode OLED may be defined by the opening.

The pixel definition layer 121 may prevent or reduce the occurrence of an arc or the like at the edge of the pixel electrode 210 by increasing the distance between the edge of the pixel electrode 210 and the opposite electrode 230 on the pixel electrode 210.

The pixel definition layer 121 may be formed of an organic insulating material of at least one of polyimide, polyamide, acrylic resin, benzocyclobutene, or phenol resin by spin coating or the like.

The intermediate layer 220 may be arranged in the opening formed by the pixel definition layer 121 and may include an organic emission layer. The organic emission layer may include an organic material including a fluorescent or phosphorescent material emitting red, green, blue, or white light. The organic emission layer may include a low molecular weight organic material or a high molecular weight organic material, and a functional layer such as a hole transport layer (HTL), a hole injection layer (HIL), an electron transport layer (ETL), or an electron injection layer (EIL) may optionally be further included under and on the organic emission layer.

The opposite electrode 230 may be a transparent electrode or a reflective electrode. In some embodiments, the opposite electrode 230 may be a transparent or semitransparent electrode and may include a thin metal layer having a low work function and including Li, Ca, LiF/Ca, LiF/Al, Al, Ag, Mg, or any compound thereof. Also, a transparent conductive oxide (TCO) layer such as ITO, IZO, ZnO, or $In_2O_3$ may be further arranged on the thin metal layer. The opposite electrode 230 may be arranged on the display area and may be arranged on the intermediate layer 220 and the pixel definition layer 121. The opposite electrode 230 may be integrally formed in a plurality of organic light emitting diodes OLED to correspond to a plurality of pixel electrodes 210.

Because the organic light emitting diode OLED may be relatively easily damaged by the moisture or oxygen, or other contaminants, from the outside, an encapsulation layer may cover and protect the organic light emitting diode OLED. The encapsulation layer may cover the display area and may extend to at least a portion of the peripheral area. The encapsulation layer may include a first inorganic encapsulation layer, an organic encapsulation layer, and a second inorganic encapsulation layer.

Figure 9:
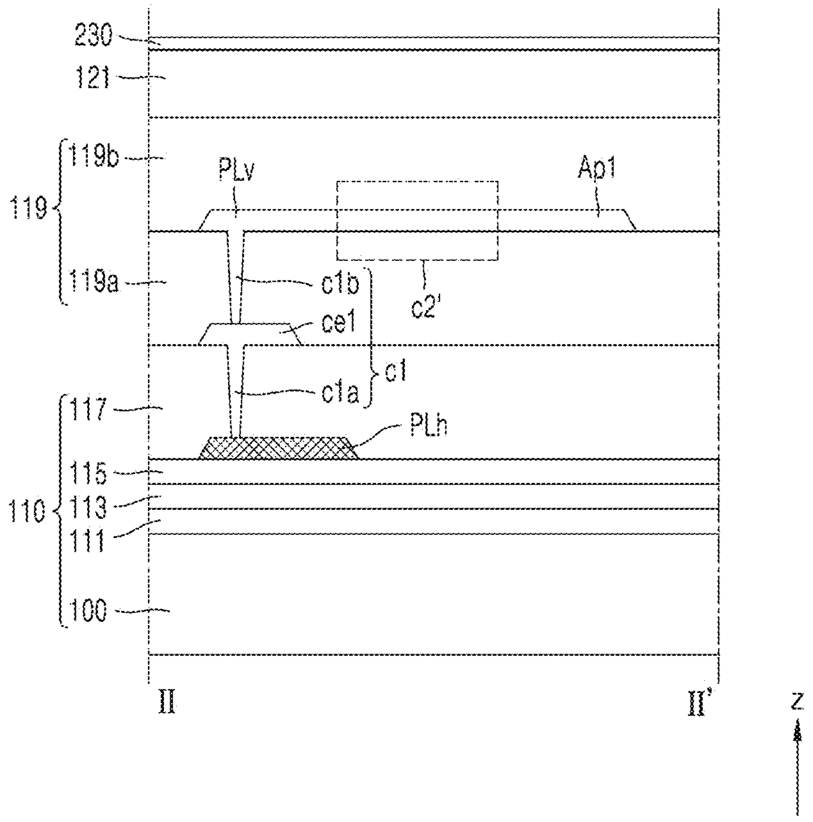
FIG. 9 is an example of a cross-sectional view of a portion of the display panel of FIG. 8 taken along the line II-II'.

FIG. 8 is an enlarged plan view schematically illustrating a portion of the display panel of FIG. 4, and FIG. 9 is an example of a cross-sectional view of a portion of the display panel of FIG. 8 taken along the line II-II'. FIGS. 8 and 9 are respectively modifications of FIGS. 5 and 6, and they are different in the structure of a second connector. Hereinafter, some redundant descriptions thereof will be replaced with those in the description of FIGS. 5 and 6 and differences therebetween will be mainly described.

Referring to FIGS. 8 and 9, the first auxiliary patterns Ap1 may be directly connected to the first voltage lines PLv through a plurality of second connectors c2'.

The first voltage line PLv, the first auxiliary pattern Ap1, and the second connector c2' may be arranged on the same layer. The first voltage line PLv, the first auxiliary pattern Ap1, and the second connector c2' may be arranged on the first planarization layer 119*a*. In this case, the second connector c2' may directly connect the first auxiliary pattern Ap1 to the first voltage line PLv. The second connector c2' may be a portion connecting the first auxiliary pattern Ap1 and the first voltage line PLv formed on the same layer. In other words, the first voltage line PLv, the first auxiliary pattern Ap1, and the second connector c2' may be integral.

FIG. 10 is an enlarged plan view schematically illustrating a portion of the display panel of FIG. 4. FIG. 10 is a modification of FIG. 5, and they are different in the structure of a first voltage line. Hereinafter, redundant descriptions thereof will be replaced with those in the description of FIG. 5 and differences therebetween will be mainly described.

Referring to FIG. 10, the first voltage lines PLv may extend in the first direction (e.g., ±y direction) and may be arranged in each pair of pixel circuit columns (or pixel columns). The second voltage lines PLh may extend in the second direction (e.g., ±x direction) and may be arranged in each pair of pixel circuit rows (or pixel rows). The first auxiliary patterns Ap1 may extend in the first direction (e.g., ±y direction) and may be arranged in each pixel circuit column (or pixel column).

Because the first voltage lines PLv are arranged in each pair of pixel circuit columns (or pixel columns), pixel circuits PC adjacent to each other in the second direction (e.g., ±x direction) among the plurality of pixel circuits PC may share one first voltage line PLv with each other. The number of first voltage lines PLv may be less than the number of pixel circuit columns (or pixel columns).

Figure 11:
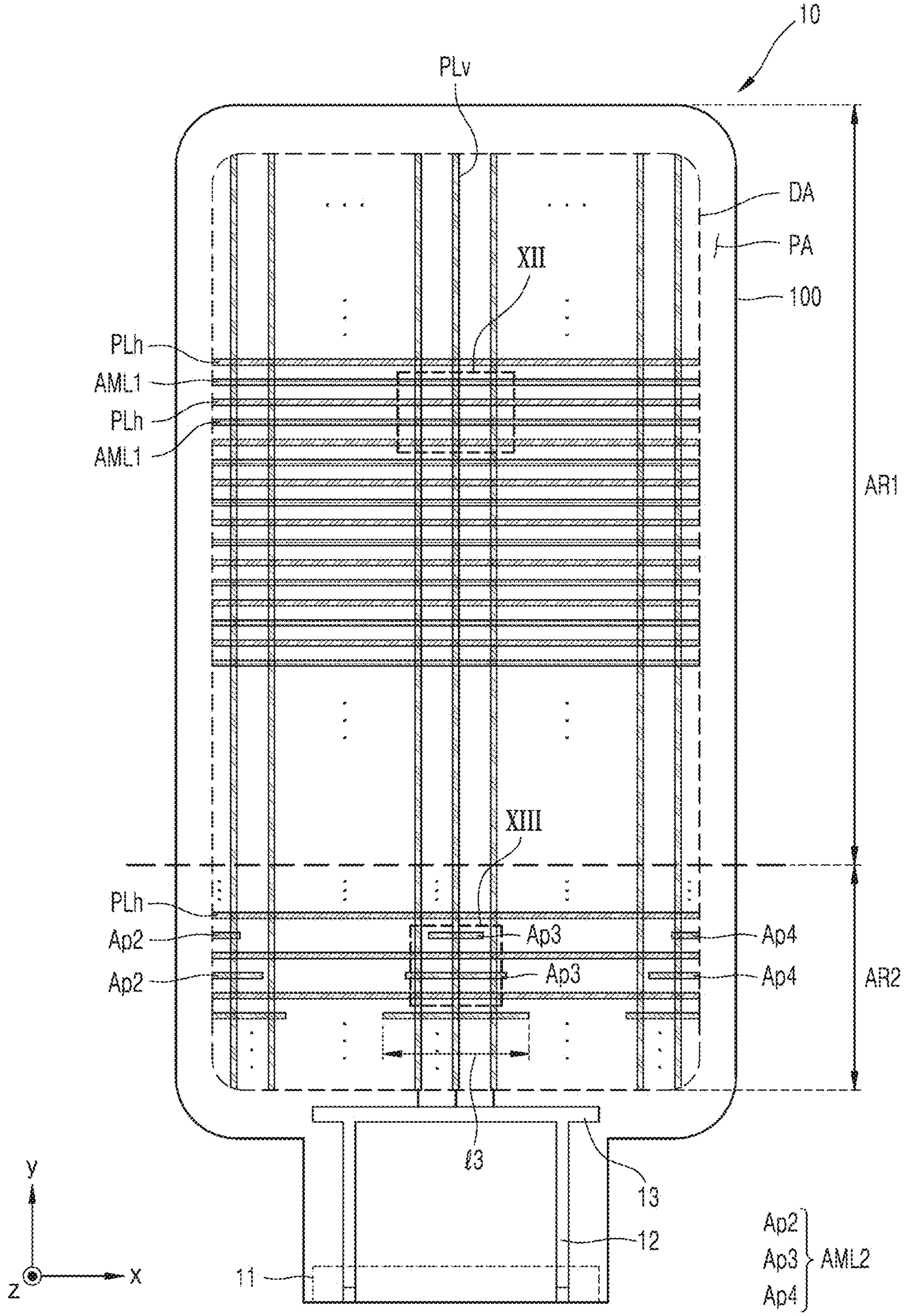
FIG. 11 is a plan view schematically illustrating a display panel according to some embodiments.

FIG. 11 is a plan view schematically illustrating a display panel according to some embodiments.

Referring to FIG. 11, a plurality of first voltage lines PLv, a plurality of second voltage lines PLh, a plurality of first auxiliary lines AML1, and a plurality of second auxiliary lines AML2 may be arranged in a display area DA of a display panel 10.

The first voltage lines PLv may be arranged in the second direction (e.g., ±x direction) and may extend in the first direction (e.g., ±y direction). The second voltage lines PLh may be arranged in the first direction (e.g., ±y direction) and may extend in the second direction (e.g., ±x direction). As described above with reference to FIG. 5, the first voltage lines PLv and the second voltage lines PLh may be connected to each other through a plurality of first connectors c1.

Figure 12:
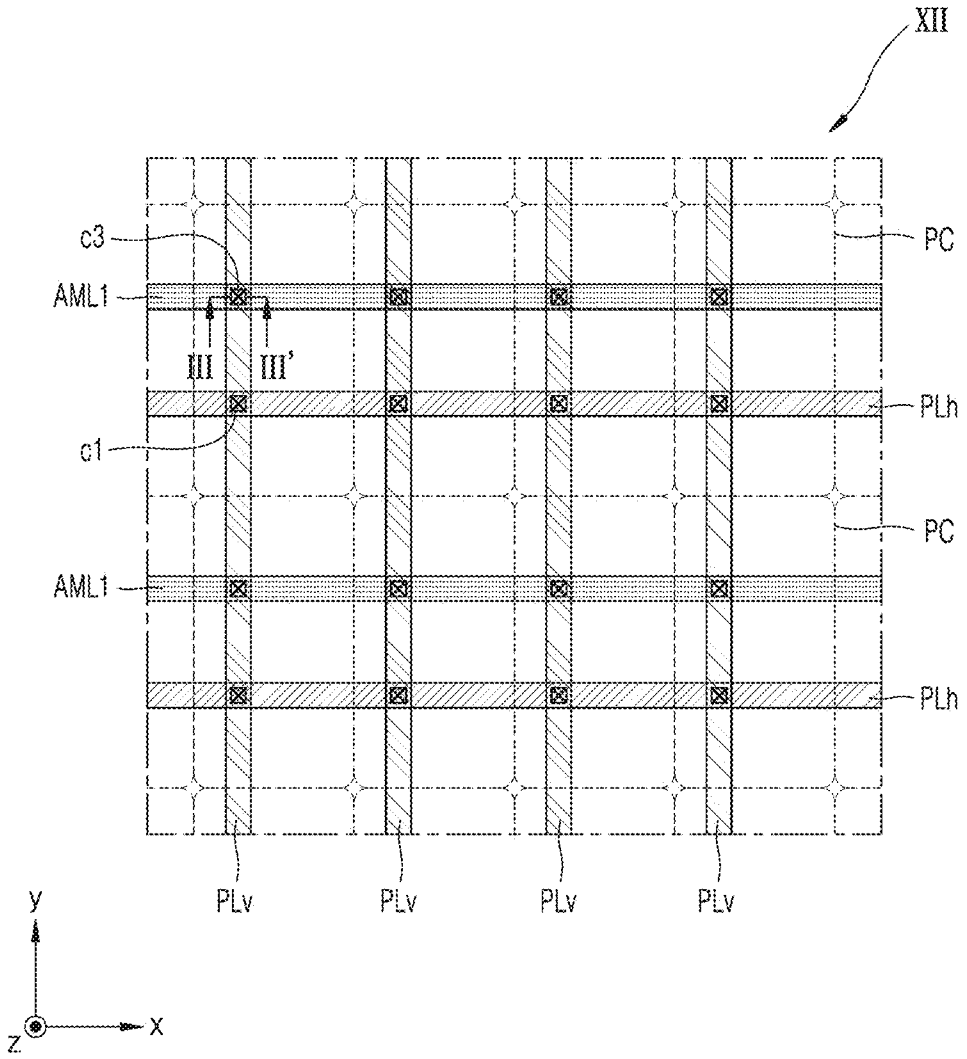
FIG. 12 is an enlarged plan view schematically illustrating a portion of the display panel of FIG. 11.

The first auxiliary lines AML1 may be arranged in the first direction (e.g., ±y direction) on a first area AR1 of the display area DA and may extend in the second direction (e.g., ±x direction). The first auxiliary lines AML1 may be arranged in each pixel row as illustrated in FIG. 12 described below.

According to some embodiments, first auxiliary lines AML1 may be arranged between adjacent second voltage lines PLh among the plurality of second voltage lines PLh. For example, when the second voltage lines PLh are arranged in each pixel row as illustrated in FIG. 12 described below, one first auxiliary line AML1 may be arranged between the second voltage lines PLh adjacent to each other. In other words, the second voltage lines PLh and the first auxiliary lines AML1 may be alternately arranged in the first direction (e.g., ±y direction).

Figure 13:
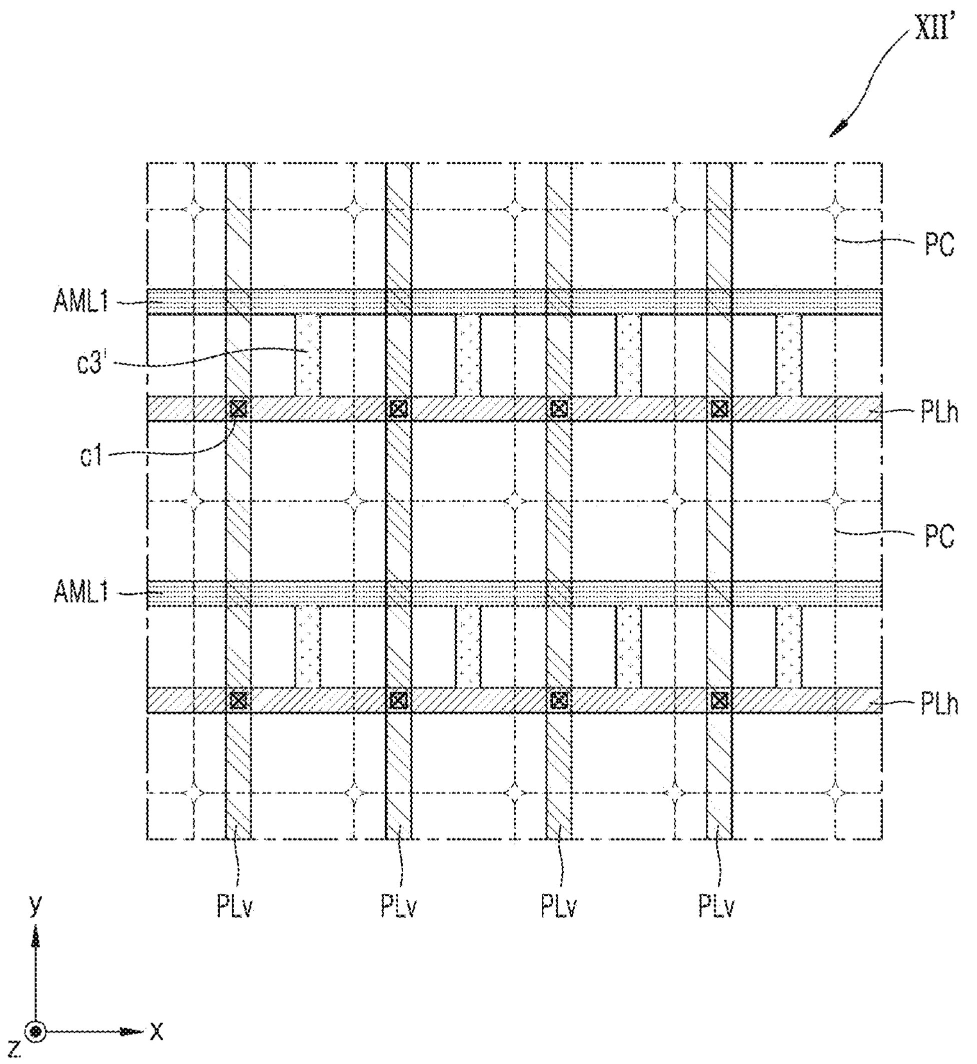
FIG. 13 is an enlarged plan view schematically illustrating a portion of the display panel of FIG. 11.

According to some embodiments, the first auxiliary lines AML1 may be connected to at least one of the first voltage lines PLv or the second voltage lines PLh. For example, as illustrated in FIGS. 12 and 13 described below, the first auxiliary lines AML1 may be directly connected to at least one of the first voltage lines PLv or the second voltage lines PLh through a plurality of third connectors c3 and c3'. The third connectors c3 and c3' may be a portion that is buried in a contact hole formed in an insulating layer to connect an upper layer and a lower layer or may be a portion that connects one line and another line formed on the same layer.

As such, the first auxiliary lines AML1 may form a driving voltage line PL of a grid shape (or a mesh structure) together with the first voltage lines PLv and the second voltage lines PLh. In this case, the driving voltage line PL may have a denser grid shape (or mesh structure) than when it has a grid shape (or a mesh structure) through the first voltage lines PLv and the second voltage lines PLh. Thus, when the grid shape (or mesh structure) of the driving voltage line PL is relatively densely formed through the first auxiliary lines AML1, the voltage drop of the first driving voltage ELVDD may be further prevented or reduced and the luminance uniformity of the pixels PX (FIG. 1) may be improved.

The second auxiliary lines AML2 may be arranged in the first direction (e.g., ty direction) on a second area AR2 of the display area DA. Here, the first area AR1 and the second area AR2 of the display area DA may be areas into which the display area DA is divided in the second direction (e.g., ±x direction). As illustrated in FIG. 11, the second area AR2 may be closer to a first voltage wiring 13 than the first area AR1.

The second auxiliary lines AML2 may be arranged in each pixel row as illustrated in FIG. 12 described below.

According to some embodiments, second auxiliary lines AML2 may be arranged between adjacent second voltage lines PLh among the plurality of second voltage lines PLh. For example, when the second voltage lines PLh are arranged in each pixel row as illustrated in FIG. 12 described below, one second auxiliary line AML2 may be arranged between the second voltage lines PLh adjacent to each other.

In other words, the second voltage lines PLh and the second auxiliary lines AML2 may be alternately arranged in the first direction (e.g., ±y direction).

According to some embodiments, each of the second auxiliary lines AML2 may include a second auxiliary pattern Ap2, a third auxiliary pattern Ap3, and a fourth auxiliary pattern Ap4. The second auxiliary pattern Ap2 and the third auxiliary pattern Ap3 may be spaced apart from each other in the second direction (e.g., ±x direction), the third auxiliary pattern Ap3 and the fourth auxiliary pattern Ap4 may be spaced apart from each other in the second direction (e.g., ±x direction), and the second auxiliary pattern Ap2 and the fourth auxiliary pattern Ap4 may be spaced apart from each other in the second direction (e.g., ±x direction).

Figure 14:
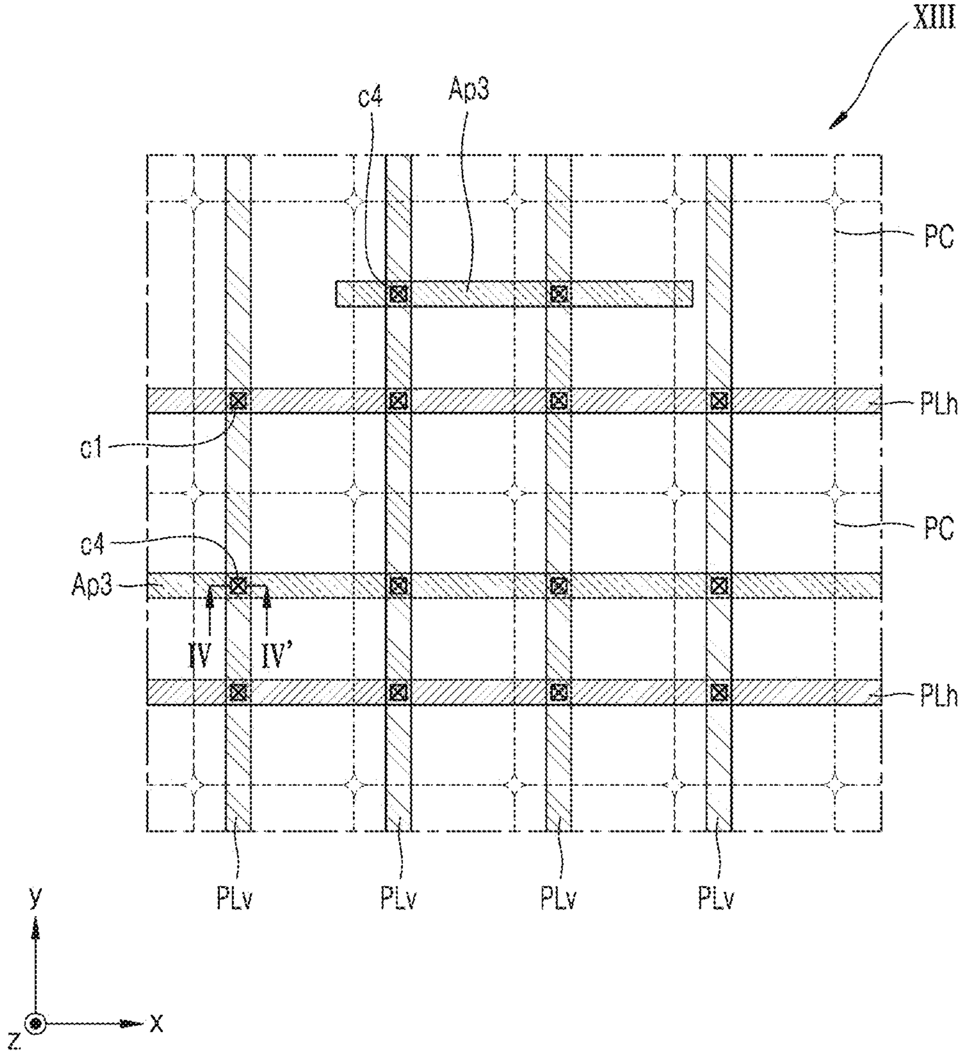
FIG. 14 is an enlarged plan view schematically illustrating another portion of the display panel of FIG. 11.

According to some embodiments, the second auxiliary pattern Ap2, the third auxiliary pattern Ap3, and the fourth auxiliary pattern Ap4 of each of the second auxiliary lines AML2 may be connected to at least one of the first voltage lines PLv or the second voltage lines PLh. For example, the second auxiliary pattern Ap2, the third auxiliary pattern Ap3, or the fourth auxiliary pattern Ap4 of each of the second auxiliary lines AML2 may be directly connected to at least one of the first voltage lines PLv or the second voltage lines PLh through a plurality of fourth connectors c4 (see FIG. 14). As illustrated in FIG. 14 described below, the fourth connectors c4 may be a portion that is buried in a contact hole formed in an insulating layer to connect an upper layer and a lower layer or may be a portion that connects one line and another line formed on the same layer.

As such, the second auxiliary pattern Ap2, the third auxiliary pattern Ap3, and the fourth auxiliary pattern Ap4 of each of the second auxiliary lines AML2 may form a driving voltage line PL of a grid shape (or a mesh structure) together with the first voltage lines PLv and the second voltage lines PLh. In this case, the driving voltage line PL may have a denser grid shape (or mesh structure) than when it has a grid shape (or a mesh structure) through the first voltage lines PLv and the second voltage lines PLh. Thus, when the grid shape (or mesh structure) of the driving voltage line PL is densely formed through the second auxiliary pattern Ap2, the third auxiliary pattern Ap3, and the fourth auxiliary pattern Ap4 of each of the second auxiliary lines AML2, the voltage drop of the first driving voltage ELVDD may be further prevented or reduced and the luminance uniformity of the pixels PX may be improved.

According to some embodiments, the lengths of the second auxiliary patterns Ap2, the lengths of the third auxiliary patterns Ap3, and the lengths of the fourth auxiliary patterns Ap4 may each monotonically decrease in the first direction (e.g., ±y direction). For example, as illustrated in FIG. 11, third lengths l3 of the third auxiliary patterns Ap3 may monotonically decrease in the first direction (e.g., ±y direction). The length of a third auxiliary pattern Ap3 closest to the first area AR1 of the display area DA among the third auxiliary patterns Ap3 may be least, and the length of a third auxiliary pattern Ap3 closest to the first voltage wiring 13 among the third auxiliary patterns Ap3 may be greatest.

Moreover, as described below with reference to FIGS. 25 and 26, each of the second auxiliary lines AML2 may further include a sixth auxiliary pattern Ap6 and a seventh auxiliary pattern Ap7. The sixth auxiliary pattern Ap6 may be arranged between the second auxiliary pattern Ap2 and the third auxiliary pattern Ap3, and the seventh auxiliary pattern Ap7 may be arranged between the third auxiliary pattern Ap3 and the fourth auxiliary pattern Ap4. The second auxiliary pattern Ap2, the sixth auxiliary pattern Ap6, the third auxiliary pattern Ap3, the seventh auxiliary pattern Ap7, and the fourth auxiliary pattern Ap4 may be arranged on the same layer.

The second auxiliary pattern Ap2 and the sixth auxiliary pattern Ap6 may be spaced apart from each other in the second direction (e.g., ±x direction), the sixth auxiliary pattern Ap6 and the third auxiliary pattern Ap3 may be spaced apart from each other in the second direction (e.g., ±x direction), the third auxiliary pattern Ap3 and the seventh auxiliary pattern Ap7 may be spaced apart from each other in the second direction (e.g., ±x direction), and the seventh auxiliary pattern Ap7 and the fourth auxiliary pattern Ap4 may be spaced apart from each other in the second direction (e.g., ±x direction).

In this case, the second auxiliary pattern Ap2, the third auxiliary pattern Ap3, and the fourth auxiliary pattern Ap4 may be connected to at least one of the first voltage lines PLv or the second voltage lines PLh as described above.

The sixth auxiliary pattern Ap6 and the seventh auxiliary pattern Ap7 may be connected to a fifth auxiliary pattern Ap5. The fifth auxiliary pattern Ap5 may be connected to the input line IL extending from the pad unit 11 as described above with reference to FIG. 4. The sixth auxiliary pattern Ap6 and the seventh auxiliary pattern Ap7 may each be connected to the data lines DL. Thus, the fifth auxiliary pattern Ap5, the sixth auxiliary pattern Ap6, and the seventh auxiliary pattern Ap7 may be configured to transmit the data signal received from the pad unit 11 through the input line IL, to the data line DL.

As such, the sixth auxiliary pattern Ap6 having a different function than the second auxiliary pattern Ap2 and the third auxiliary pattern Ap3 may be arranged between the second auxiliary pattern Ap2 and the third auxiliary pattern Ap3 spaced apart from each other. The seventh auxiliary pattern Ap7 having a different function than the third auxiliary pattern Ap3 and the fourth auxiliary pattern Ap4 may be arranged between the third auxiliary pattern Ap3 and the fourth auxiliary pattern Ap4 spaced apart from each other.

FIGS. 12 and 13 are enlarged plan views schematically illustrating a portion of the display panel of FIG. 11. Particularly, FIGS. 12 and 13 are enlarged plan views schematically illustrating a portion of the first area of FIG. 11.

Referring first to FIG. 12, the first auxiliary lines AML1 may be directly connected to the first voltage lines PLv through a plurality of third connectors c3.

Figure 15:
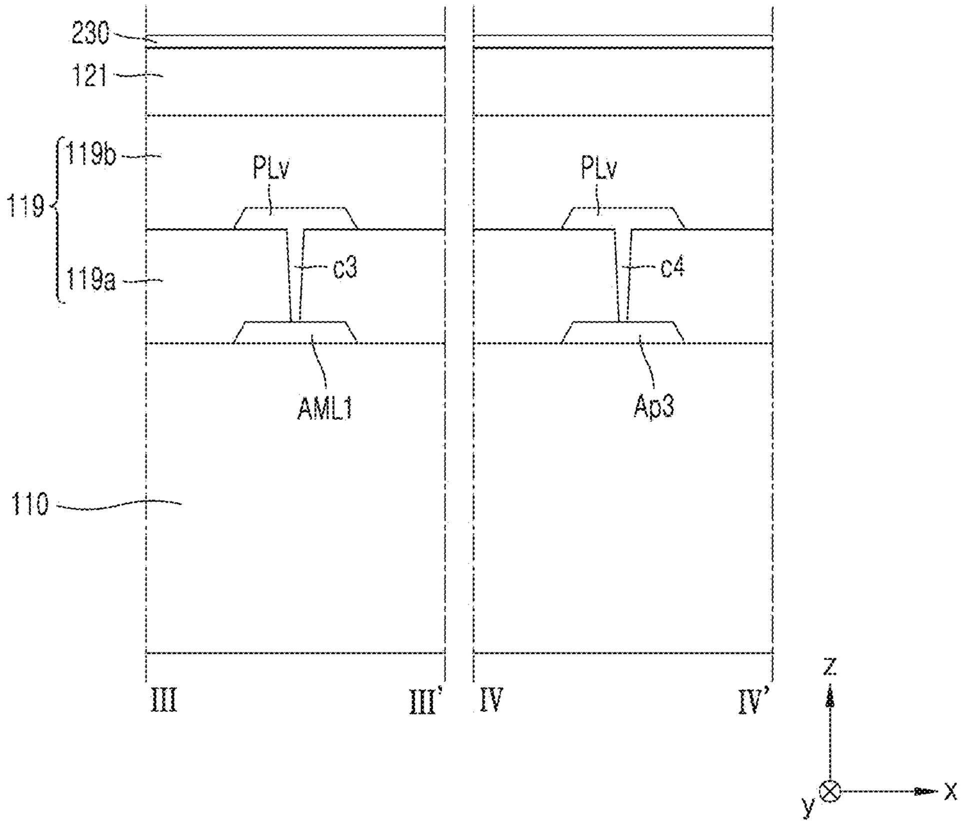
FIG. 15 is an example of cross-sectional views of a portion of FIG. 12 and a portion of FIG. 14 respectively taken along the line III-III' and line IV-IV"

The first voltage line PLv and the first auxiliary line AML1 may be arranged on different layers. For example, as illustrated in FIG. 15 described below, the first voltage line PLv may be arranged on the first auxiliary line AML1.

According to some embodiments, the third connector c3 may be a contact plug that is buried in a contact hole formed in an insulating layer to connect the first voltage line PLv to the first auxiliary line AML1. The third connector c3 may correspond to a portion of the first voltage line PLv buried in the contact hole formed in the insulating layer.

In other embodiments, referring to FIG. 13, the first auxiliary lines AML1 may be directly connected to the second voltage lines PLh through a plurality of third connectors c3'.

The second voltage line PLh, the first auxiliary line AML1, and the third connector c3' may be arranged on the same layer. For example, the second voltage line PLh, the first auxiliary line AML1, and the third connector c3' may be arranged on a transistor layer 110 (see FIG. 15). In this case, the third connector c3' may directly connect the first auxiliary line AML1 to the second voltage line PLh. The third connector c3' may be a portion connecting the first auxiliary line AML1 and the second voltage line PLh formed on the same layer. In other words, the second voltage line PLh, the first auxiliary line AML1, and the third connector c3' may be integral.

FIG. 14 is an enlarged plan view schematically illustrating another portion of the display panel of FIG. 11. Particularly, FIG. 14 is an enlarged plan view schematically illustrating a portion of the second area of FIG. 11.

Referring to FIG. 14, the third auxiliary patterns Ap3 may be directly connected to the first voltage lines PLv through a plurality of fourth connectors c4. In FIG. 14, the description is based on the third auxiliary pattern Ap3; however, the second auxiliary pattern Ap2 and the fourth auxiliary pattern Ap4 illustrated in FIG. 11 may be similarly applied.

The first voltage line PLv and the third auxiliary pattern Ap3 may be arranged on different layers. For example, as illustrated in FIG. 15 described in more detail below, the first voltage line PLv may be arranged on the third auxiliary pattern Ap3.

According to some embodiments, the fourth connector c4 may be a contact plug that is buried in a contact hole formed in an insulating layer to connect the first voltage line PLv to the third auxiliary pattern Ap3. The fourth connector c4 may correspond to a portion of the first voltage line PLv buried in the contact hole formed in the insulating layer.

FIG. 14 illustrates that the third auxiliary patterns Ap3 are connected to the first voltage lines PLv through the fourth connectors c4; however, in other embodiments, the third auxiliary patterns Ap3 may be directly connected to the second voltage lines PLh through the fourth connectors c4. In this case, the second voltage line PLh, the third auxiliary pattern Ap3, and the fourth connector c4 may be arranged on the same layer. The fourth connector c4 may directly connect the third auxiliary pattern Ap3 to the second voltage line PLh. The fourth connector c4 may be a portion connecting the third auxiliary pattern Ap3 and the second voltage line PLh formed on the same layer. In other words, the second voltage line PLh, the third auxiliary pattern Ap3, and the fourth connector c4 may be integral.

FIG. 15 is an example of cross-sectional views of a portion of the display panel of FIG. 12 and a portion of the display panel of FIG. 14 respectively taken along the line Ill-Ill' and the line IV-IV".

Referring to FIG. 15, the first voltage line PLv may be arranged on the first auxiliary line AML1 and the third auxiliary pattern Ap3. In FIG. 15, the description is based on the third auxiliary pattern Ap3; however, the second auxiliary pattern Ap2 and the fourth auxiliary pattern Ap4 illustrated in FIG. 11 may be similarly applied. That is, the first voltage line PLv may be understood as being arranged on the second auxiliary line AML2.

Also, the first auxiliary line AML1 and the third auxiliary pattern Ap3 may be arranged on the same layer. In other words, the first auxiliary line AML1 and the second auxiliary line AML2 may be arranged on the same layer.

For example, as illustrated in FIG. 15, the first auxiliary line AML1 and the third auxiliary pattern Ap3 may be arranged on the transistor layer 110, and the first voltage line PLv may be arranged on the first planarization layer 119*a*.

In this case, the third connector c3 may be a contact plug that is buried in the contact hole formed in the first planarization layer 119*a* to connect the first voltage line PLv to the first auxiliary line AML1. The third connector c3 may correspond to a portion of the first voltage line PLv buried in the contact hole formed in the first planarization layer 119*a*. In other words, a portion of the first voltage line PLv buried in the contact hole formed in the first planarization layer 119*a* may be referred to as the third connector c3. In other words, the third connector c3 and the first voltage line PLv may be integral.

The fourth connector c4 may be a contact plug that is buried in the contact hole formed in the first planarization layer 119*a* to connect the first voltage line PLv to the third auxiliary pattern Ap3. The fourth connector c4 may correspond to a portion of the first voltage line PLv buried in the contact hole formed in the first planarization layer 119*a*. In other words, a portion of the first voltage line PLv buried in the contact hole formed in the first planarization layer 119*a* may be referred to as the fourth connector c4. In other words, the fourth connector c4 and the first voltage line PLv may be integral.

Figure 16:
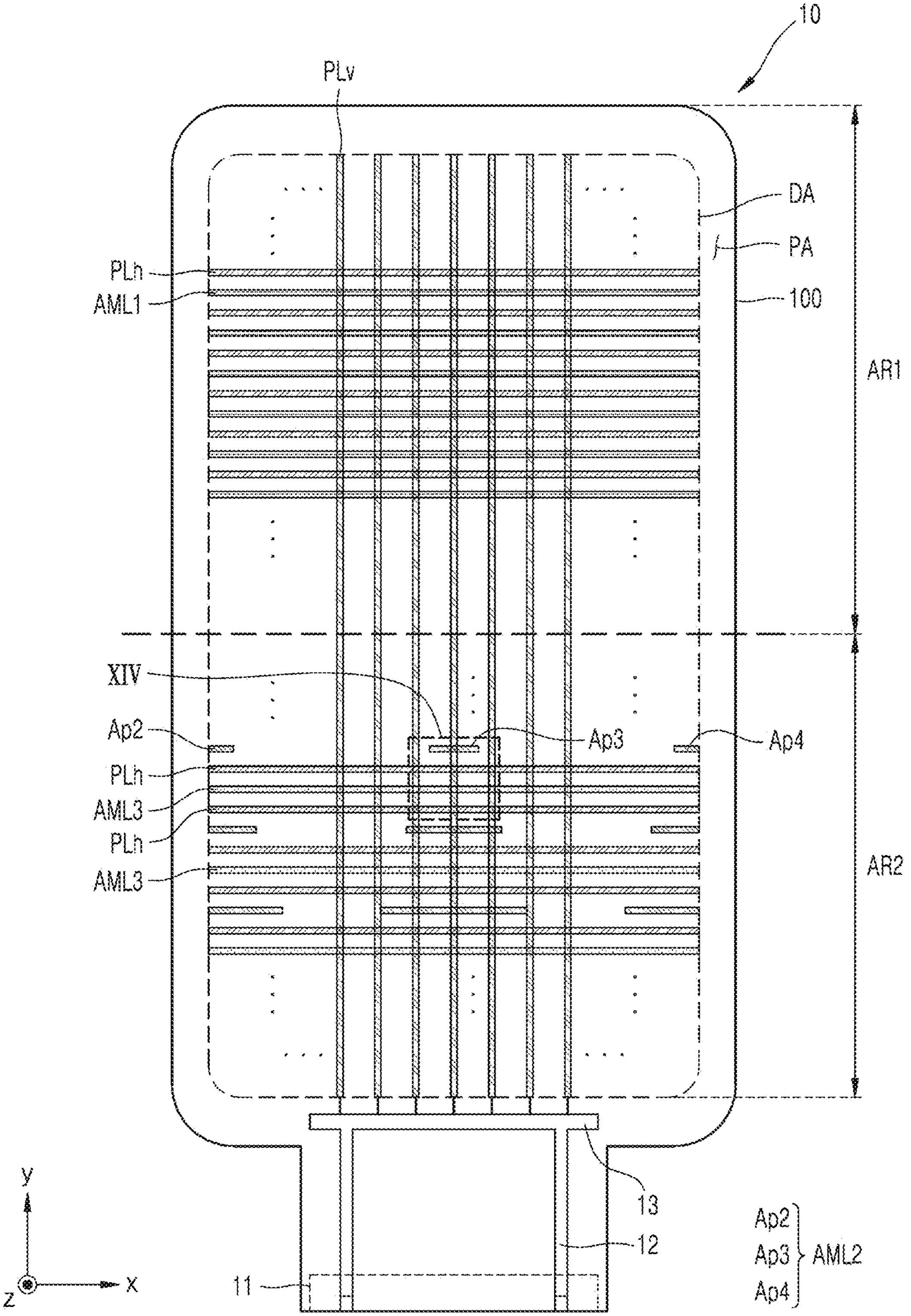
FIG. 16 is a plan view schematically illustrating a display panel according to some embodiments.

FIG. 16 is a plan view schematically illustrating a display panel according to other embodiments. FIG. 16 is a modification of FIG. 11, and they are different in the structure of a third auxiliary line. Hereinafter, redundant descriptions thereof will be replaced with those in the description of FIG. 11 and differences therebetween will be mainly described.

Referring to FIG. 16, a display panel 10 may include a plurality of third auxiliary lines AML3 arranged in a second area AR2 of a display area DA. In this case, the area of the second area AR2 of the display area DA may increase.

The third auxiliary lines AML3 may be arranged in the first direction (e.g., ±y direction) on the second area AR2 of the display area DA and may extend in the second direction (e.g., ±x direction). The third auxiliary lines AML3 may be arranged in each pixel row on at least a partial area of the second area AR2.

According to some embodiments, second auxiliary lines AML2 or third auxiliary lines AML3 may be arranged between adjacent second voltage lines PLh among the plurality of second voltage lines PLh. In other words, the second voltage line PLh may be arranged between the second auxiliary line AML2 and the third auxiliary line AML3 adjacent to each other among the plurality of second auxiliary lines AML2 and the plurality of third auxiliary lines AML3.

According to some embodiments, the third auxiliary lines AML3 may be arranged between the second auxiliary lines AML2. For example, as illustrated in FIG. 16, one third auxiliary line AML3 may be arranged between the second auxiliary lines AML2 adjacent to each other among the plurality of second auxiliary lines AML2.

Figure 17:
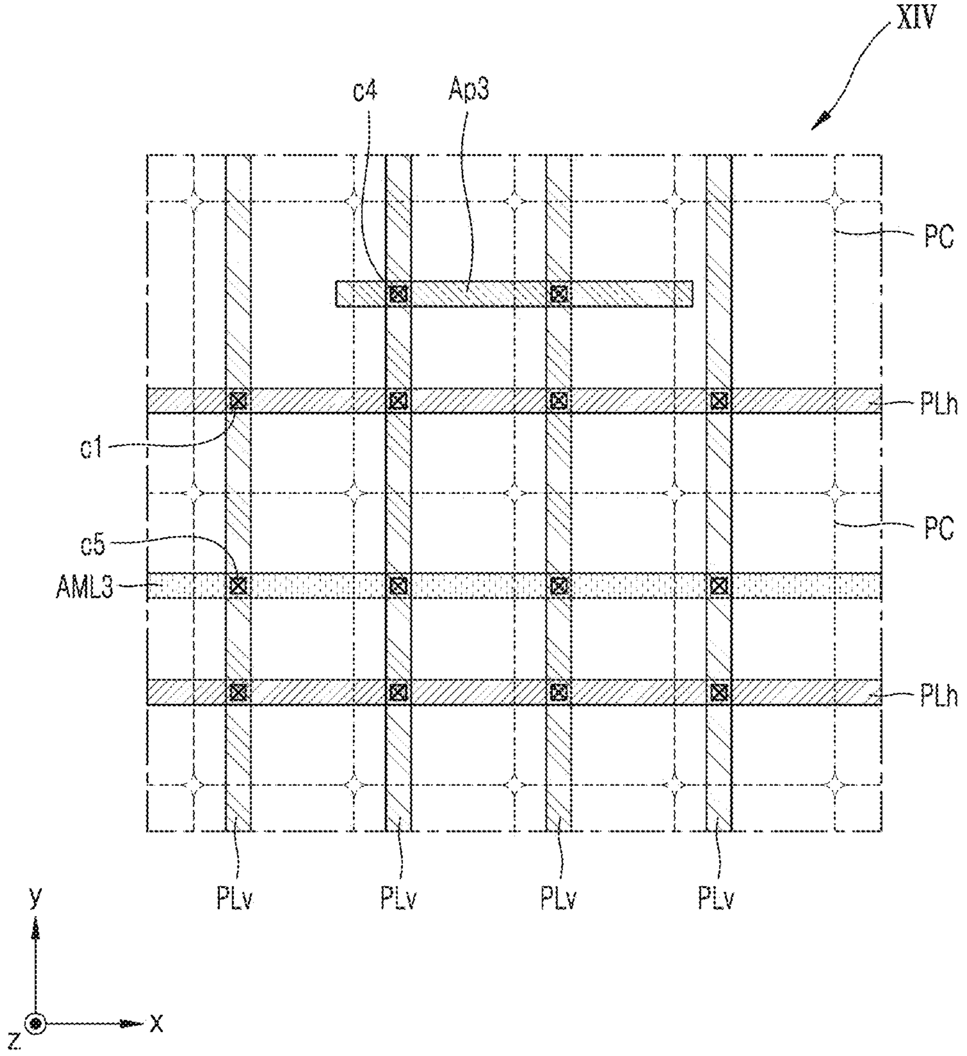
FIG. 17 is an enlarged plan view schematically illustrating a portion of the display panel of FIG. 16.

According to some embodiments, the third auxiliary lines AML3 may be connected to at least one of the first voltage lines PLv or the second voltage lines PLh. For example, the third auxiliary lines AML3 may be directly connected to at least one of the first voltage lines PLv or the second voltage lines PLh through a plurality of fifth connectors c5 (see FIG. 17). As illustrated in FIG. 17 described below, the fifth connectors c5 may be a portion that is buried in a contact hole formed in an insulating layer to connect an upper layer and a lower layer or may be a portion that connects one line and another line formed on the same layer.

As such, the third auxiliary lines AML3 may form a driving voltage line PL of a grid shape (or a mesh structure) together with the first voltage lines PLv and the second voltage lines PLh. In this case, the driving voltage line PL may have a denser grid shape (or mesh structure) than when it has a grid shape (or a mesh structure) through the first voltage lines PLv and the second voltage lines PLh. Thus, when the grid shape (or mesh structure) of the driving voltage line PL is densely formed through the third auxiliary lines AML3, the voltage drop of the first driving voltage ELVDD may be further prevented or reduced and the luminance uniformity of the pixels PX may be improved.

FIG. 17 is an enlarged plan view schematically illustrating a portion of the display panel of FIG. 16. Particularly, FIG. 17 is an enlarged plan view schematically illustrating a portion of the second area of FIG. 16.

Referring to FIG. 17, the third auxiliary line AML3 may be directly connected to the first voltage lines PLv through a plurality of fifth connectors c5.

The first voltage line PLv and the third auxiliary line AML3 may be arranged on different layers. For example, the first voltage line PLv may be arranged on the third auxiliary line AML3.

According to some embodiments, the fifth connector c5 may be a contact plug that is buried in a contact hole formed in an insulating layer to connect the first voltage line PLv to the third auxiliary line AML3. The fifth connector c5 may correspond to a portion of the first voltage line PLv buried in the contact hole formed in the insulating layer.

FIG. 17 illustrates that the third auxiliary line AML3 is connected to the first voltage lines PLv through the fifth connectors c5; however, in other embodiments, the third auxiliary line AML3 may be directly connected to the second voltage lines PLh through the fifth connectors c5. In this case, the second voltage line PLh, the third auxiliary line AML3, and the fifth connector c5 may be arranged on the same layer. The fifth connector c5 may directly connect the third auxiliary line AML3 to the second voltage line PLh. The fifth connector c5 may be a portion connecting the third auxiliary line AML3 and the second voltage line PLh formed on the same layer. In other words, the second voltage line PLh, the third auxiliary line AML3, and the fifth connector c5 may be integral.

According to some embodiments, the second voltage lines PLh may be arranged in each pixel row, the third auxiliary patterns Ap3 may be arranged in some pixel rows (e.g., every other pixel row), and the third auxiliary lines AML3 may be arranged in some pixel rows (e.g., every other pixel row). For example, as illustrated in FIG. 17, the second voltage line PLh and the third auxiliary pattern Ap3 may be arranged in a certain pixel row, and the second voltage line PLh and the third auxiliary line AML3 may be arranged in the next pixel row. Moreover, because the second auxiliary line AML2 (see FIG. 16) includes the third auxiliary pattern Ap3, it may be understood that the second auxiliary lines AML2 are arranged in every pixel rows.

Figure 18:
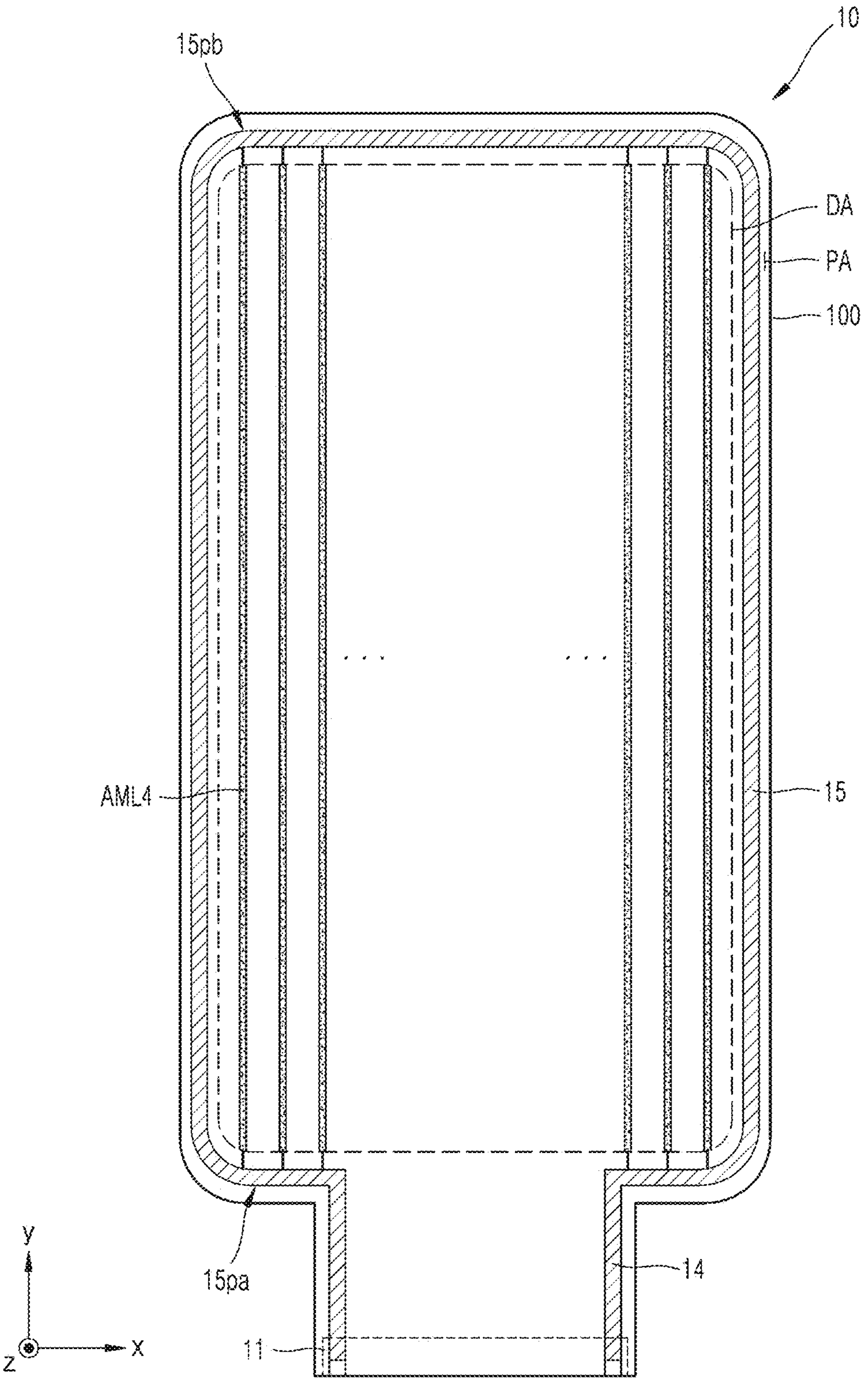
FIG. 18 is a plan view schematically illustrating a display panel according to some embodiments.

FIG. 18 is a plan view schematically illustrating a display panel according to other embodiments.

Referring to FIG. 18, a display panel 10 may include a display area DA and a peripheral area PA around the display area DA. Because the display panel 10 includes a substrate 100, it may be said that the substrate 100 may include the display area DA and the peripheral area PA. In other words, it may be said that the display area DA and the peripheral area PA are defined in the substrate 100.

A plurality of fourth auxiliary lines AML4 may be arranged in the display area DA of the display panel 10.

The fourth auxiliary lines AML4 may be arranged in the second direction (e.g., ±x direction) and may extend in the first direction (e.g., ±y direction). The fourth auxiliary lines AML4 may be arranged in each pixel column on at least a partial area of the display area DA.

The fourth auxiliary lines AML4 may be electrically connected to a second voltage wiring 15 described below. For example, the fourth auxiliary lines AML4 may extend in the first direction (e.g., ±y direction) to be electrically connected between a first portion 15_pa_ of the second voltage wiring 15 and a second portion 15_pb_ of the second voltage wiring 15. Here, the first portion 15_pa_ of the second voltage wiring 15 may be located on one side of the peripheral area PA, and the second portion 15_pb_ of the second voltage wiring 15 may be located on the other side of the peripheral area PA.

In other words, one end of each of the fourth auxiliary lines AML4 may be connected to the first portion 15_pa_ of the second voltage wiring 15, and the other end of each of the fourth auxiliary lines AML4 may be connected to the second portion 15_pb_ of the second voltage wiring 15.

Moreover, in order to increase the display area DA of the display panel 10, the width of the second voltage wiring 15 arranged in the peripheral area PA may be reduced. In the display panel 10, heating may occur due to the current concentrated on the second voltage wiring 15 having a reduced width. However, when the fourth auxiliary lines AML4 are electrically connected to the first portion 15_pa_ and the second portion 15_pb_ of the second voltage wiring 15 according to some embodiments, the current may be distributed because some of the current may move to the fourth auxiliary lines AML4. As a result, a heating phenomenon due to a decrease in the width of the second voltage wiring 15 may be prevented or reduced.

A pad unit 11 and a second voltage wiring 15 may be arranged in the peripheral area PA of the display panel 10. The second voltage wiring 15 may be electrically connected to the pad unit 11 through a second connection wiring 14.

The pad unit 11 may be arranged on one side of the peripheral area PA. The pad unit 11 may be exposed by not being covered by an insulating layer, to be electrically connected to the printed circuit board 30 described above with reference FIG. 1. The terminals of the printed circuit board 30 may be electrically connected to the pads of the pad unit 11 respectively. The printed circuit board 30 may be configured to transmit the signal, power, or voltage of a controller to the display panel 10 through the pad unit 11.

For example, the controller may provide a second voltage to the second voltage wiring 15 through the second connection wiring 14. The second voltage may be provided to the opposite electrode 230 (see FIG. 3) of each pixel PX (see FIG. 3) electrically connected to the second voltage wiring 15. Here, the second voltage may correspond to the second driving voltage ELVSS described above with reference to FIG. 3.

The second voltage wiring 15 may surround at least a portion of the display area DA. The second voltage wiring 15 may partially surround the display area DA in a loop shape with one side open.

Figure 19:
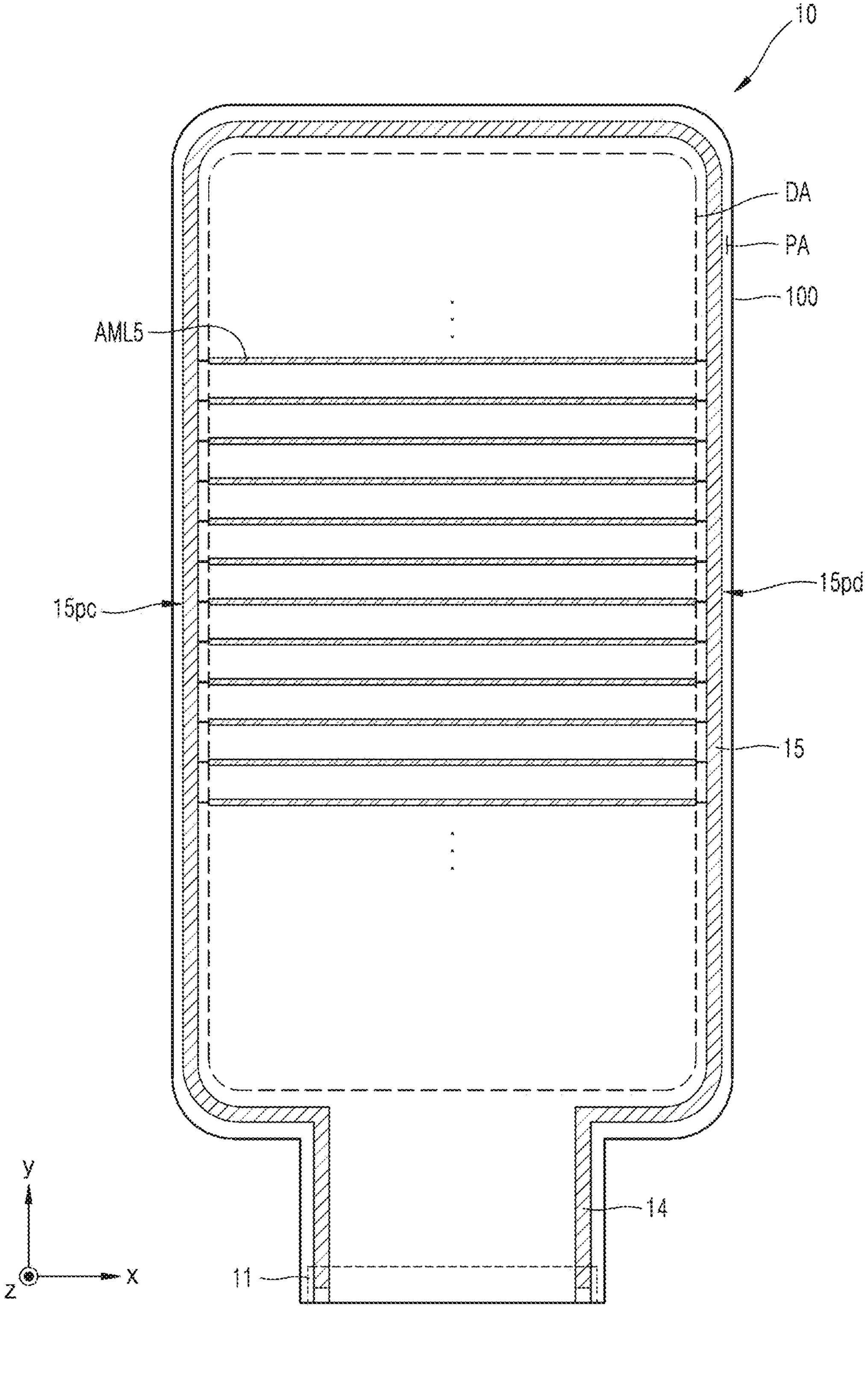
FIG. 19 is a plan view schematically illustrating a display panel according to some embodiments.

FIG. 19 is a plan view schematically illustrating a display panel according to other embodiments.

Referring to FIG. 19, a plurality of fifth auxiliary lines AML5 may be arranged in a display area DA of a display panel 10.

The fifth auxiliary lines AML5 may be arranged in the first direction (e.g., ±y direction) and may extend in the second direction (e.g., ±x direction). The fifth auxiliary lines AML5 may be arranged in each pixel row on at least a partial area of the display area DA.

The fifth auxiliary lines AML5 may be electrically connected to a second voltage wiring 15. For example, the fifth auxiliary lines AML5 may extend in the second direction (e.g., ±x direction) to be electrically connected between a third portion 15_pc_ of the second voltage wiring 15 and a fourth portion 15_pd_ of the second voltage wiring 15. Here, the third portion 15_pc_ of the second voltage wiring 15 may be located on the left side of the peripheral area PA, and the fourth portion 15*pd* of the second voltage wiring 15 may be located on the right side of the peripheral area PA.

In other words, one end of each of the fifth auxiliary lines AML5 may be connected to the third portion 15*pc* of the second voltage wiring 15, and the other end of each of the fifth auxiliary lines AML5 may be connected to the fourth portion 15*pd* of the second voltage wiring 15.

Moreover, in order to increase the display area DA of the display panel 10, the width of the second voltage wiring 15 arranged in the peripheral area PA may be reduced. In the display panel 10, heating may occur due to the current concentrated on the second voltage wiring 15 having a reduced width. However, when the fifth auxiliary lines AML5 are electrically connected to the third portion 15*pc* and the fourth portion 15*pd* of the second voltage wiring 15 according to some embodiments, the current may be distributed because some of the current may move to the fifth auxiliary lines AML5.

As a result, a heating phenomenon due to a decrease in the width of the second voltage wiring 15 may be prevented or reduced.

Figure 20:
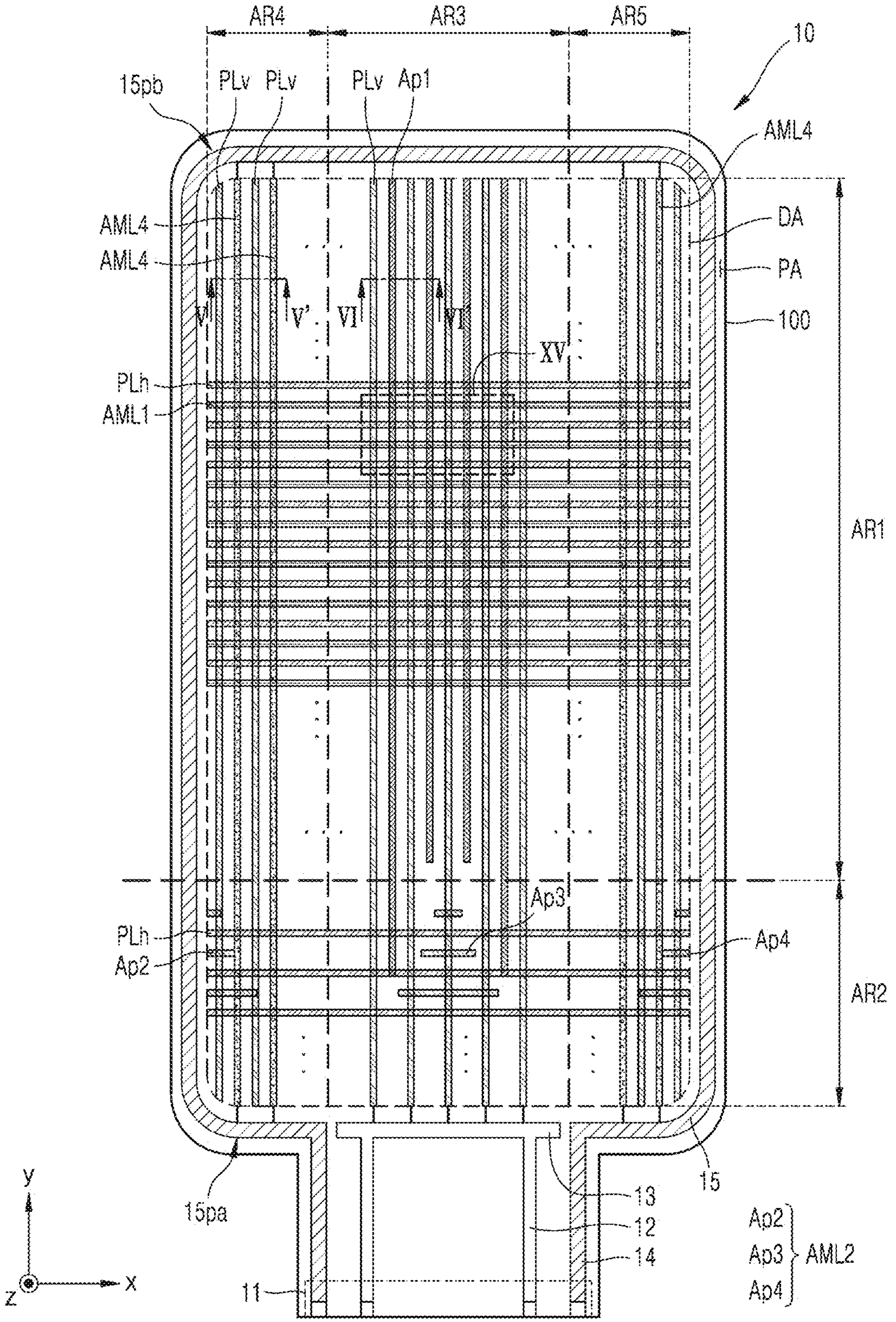
FIG. 20 is a plan view schematically illustrating a display panel according to some embodiments.
Figure 21:
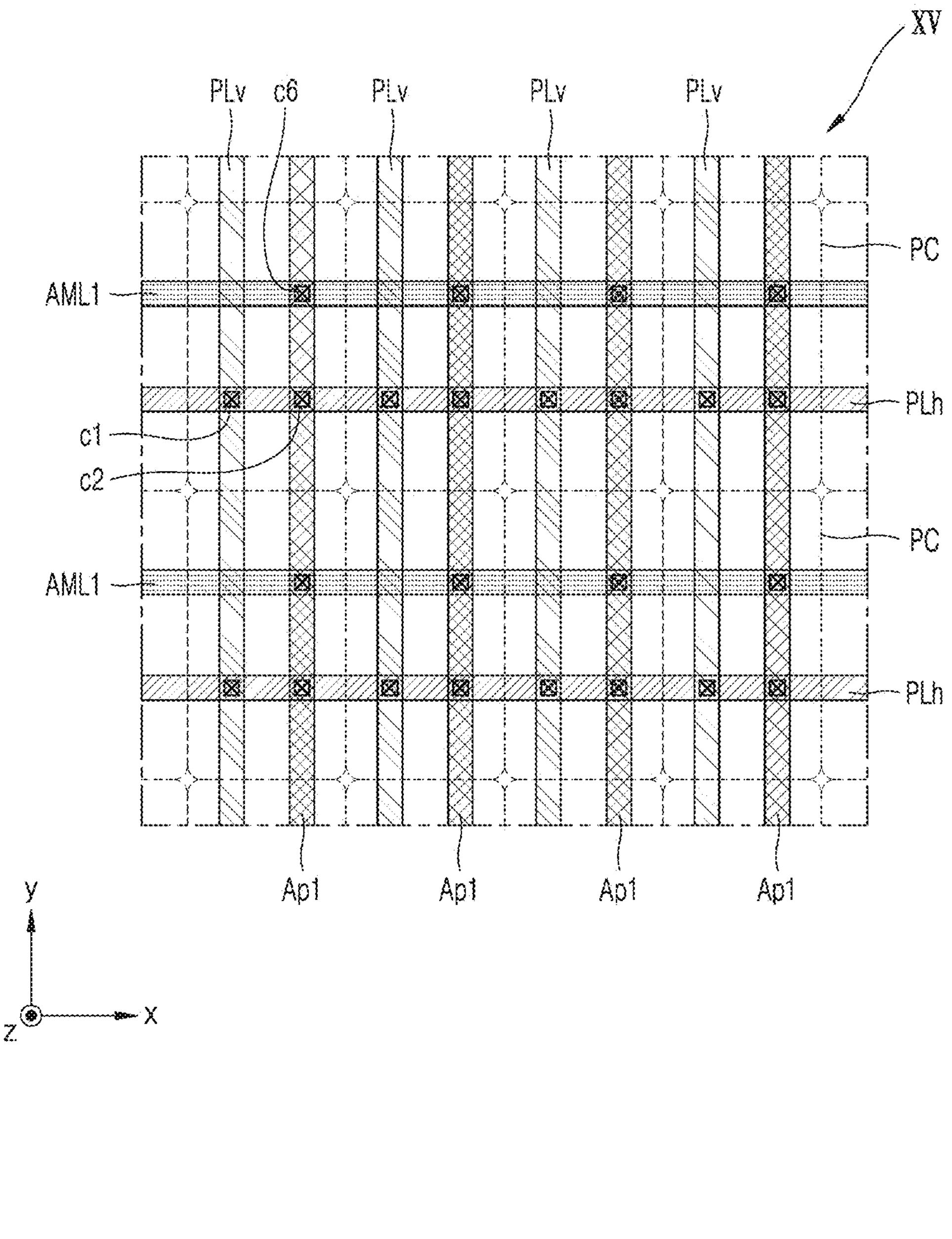
FIG. 21 is an enlarged plan view schematically illustrating a portion of the display panel of FIG. 20.
Figure 22:
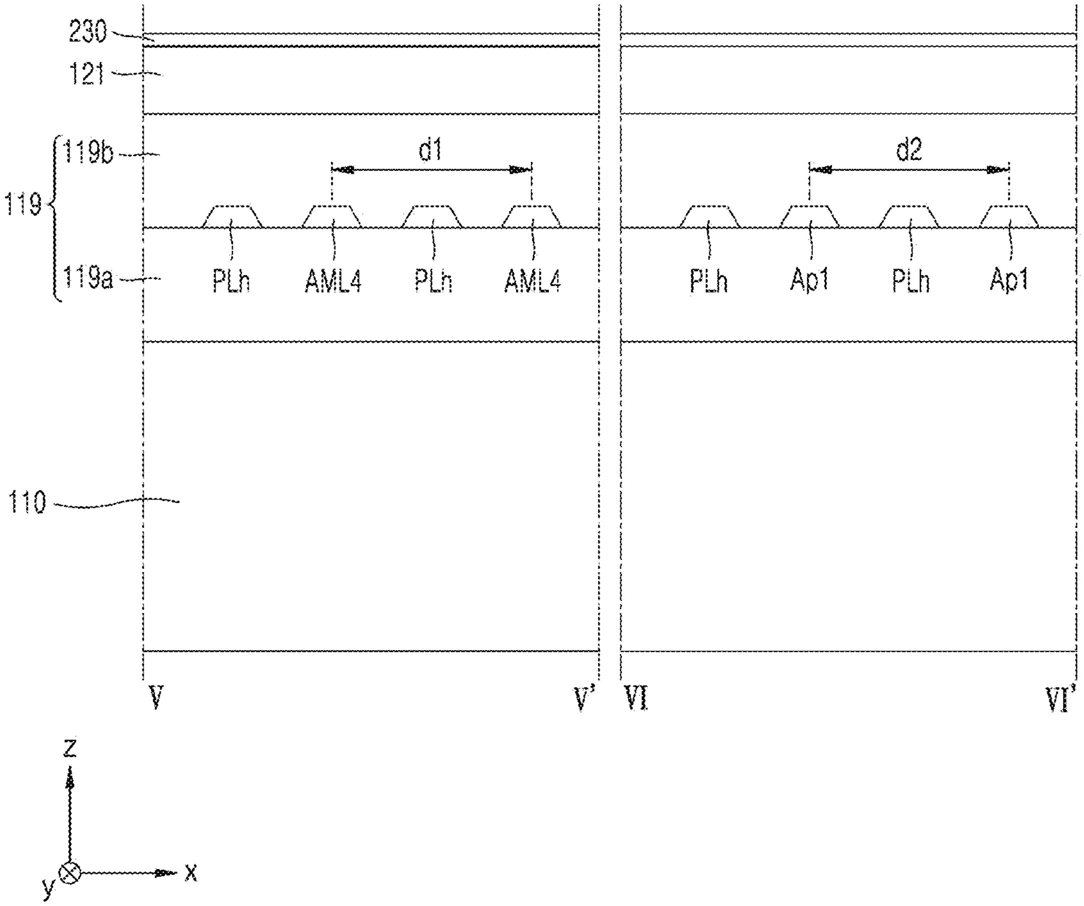
FIG. 22 is an example of a cross-sectional view of the display panel of FIG. 20 taken along the line V-V' and the line VI-VI'.

FIG. 20 is a plan view schematically illustrating a display panel according to other embodiments, and FIG. 21 is an enlarged plan view schematically illustrating a portion of the display panel of FIG. 20. FIG. 22 is an example of a cross-sectional view of the display panel of FIG. 20 taken along line V-V' and line VI-VI'.

Referring to FIG. 20, a display panel 10 may include a display area DA and a peripheral area PA around the display area DA. The display area DA may be divided into a first area AR1 and a second area AR2 in the second direction (e.g., ±x direction) and may be divided into a third area AR3, a fourth area AR4, and a fifth area AR5 in the first direction (e.g., ±y direction). The third area AR3 may be arranged between the fourth area AR4 and the fifth area AR5.

A plurality of first voltage lines PLv and a plurality of second voltage lines PLh may be arranged in the display area DA.

As described above with reference to FIG. 4, the first voltage lines PLv may be arranged in the second direction (e.g., ±x direction) and may extend in the first direction (e.g., ±y direction). The first voltage lines PLv may be electrically connected to the first voltage wiring 13 and may receive a first voltage from the first voltage wiring 13.

As described above with reference to FIG. 4, the second voltage lines PLh may be arranged in the first direction (e.g., ±y direction) and may extend in the second direction (e.g., ±x direction). The second voltage lines PLh may be electrically connected to the first voltage lines PLv and may receive the first voltage from the first voltage lines PLv. For example, as illustrated in FIG. 21, the second voltage lines PLh may be directly connected to the first voltage lines PLv through a plurality of first connectors c1. The first connectors c1 may be a portion that is buried in a contact hole formed in an insulating layer to connect an upper layer and a lower layer.

A plurality of first auxiliary patterns Ap1 may be arranged in the third area AR3 of the display area DA.

As described above with reference to FIG. 4, the first auxiliary patterns Ap1 may be arranged in the second direction (e.g., ±x direction) and may extend in the first direction (e.g., ±y direction). The first auxiliary patterns Ap1 may be connected to at least one of the first voltage lines PLv or the second voltage lines PLh. For example, as illustrated in FIG. 21, the first auxiliary patterns Ap1 may be directly connected to the second voltage lines PLh through a plurality of second connectors c2. The second connectors c2 may be a portion that is buried in a contact hole formed in an insulating layer to connect an upper layer and a lower layer.

A plurality of first auxiliary lines AML1 may be arranged in the first area AR1 of the display area DA.

As described above with reference to FIG. 11, the first auxiliary lines AML1 may be arranged in the first direction (e.g., ±y direction) on the first area AR1 of the display area DA and may extend in the second direction (e.g., ±x direction). The first auxiliary lines AML1 may be connected to at least one of the first voltage lines PLv, the second voltage lines PLh, or the first auxiliary patterns Ap1. For example, as illustrated in FIG. 21, the first auxiliary lines AML1 may be directly connected to the first auxiliary lines AML1 through a plurality of sixth connectors c6. The sixth connectors c6 may be a portion that is buried in a contact hole formed in an insulating layer to connect an upper layer and a lower layer. Moreover, the first auxiliary lines AML1 may be directly connected to the first voltage lines PLv. In this case, the sixth connectors c6 may be omitted.

A plurality of second auxiliary lines AML2 may be arranged in the second area AR2 of the display area DA.

As described above with reference to FIG. 11, each of the second auxiliary lines AML2 may include a second auxiliary pattern Ap2, a third auxiliary pattern Ap3, and a fourth auxiliary pattern Ap4. The second auxiliary pattern Ap2, the third auxiliary pattern Ap3, and the fourth auxiliary pattern Ap4 of each of the second auxiliary lines AML2 may be connected to at least one of the first voltage lines PLv or the second voltage lines PLh.

The first auxiliary patterns Ap1, the first auxiliary lines AML1, the second auxiliary pattern Ap2, the third auxiliary pattern Ap3, and the fourth auxiliary pattern Ap4 of each of the second auxiliary lines AML2 of the display panel 10 according to some embodiments may form a driving voltage line PL of a grid shape (or a mesh structure) together with the first voltage lines PLv and the second voltage lines PLh. In this case, the driving voltage line PL may have a denser grid shape (or mesh structure) than when it has a grid shape (or a mesh structure) through the first voltage lines PLv and the second voltage lines PLh. Thus, when the grid shape (or mesh structure) of the driving voltage line PL is densely formed through the first auxiliary patterns Ap1, the first auxiliary lines AML1, the second auxiliary pattern Ap2, the third auxiliary pattern Ap3, and the fourth auxiliary pattern Ap4 of each of the second auxiliary lines AML2, the voltage drop of the first driving voltage ELVDD may be further prevented or reduced and the luminance uniformity of the pixels PX (see FIG. 1) may be improved.

According to some embodiments, the lengths of the second auxiliary patterns Ap2, the lengths of the third auxiliary patterns Ap3, and the lengths of the fourth auxiliary patterns Ap4 may each monotonically decrease in the first direction (e.g., ±y direction).

According to some embodiments, the first auxiliary patterns Ap1 may not overlap the second auxiliary pattern Ap2, the third auxiliary pattern Ap3, and the fourth auxiliary pattern Ap4 of each of the second auxiliary lines AML2.

A plurality of fourth auxiliary lines AML4 may be arranged in the fourth area AR4 and the fifth area AR5 of the display area DA.

As described above with reference to FIG. 18, the fourth auxiliary lines AML4 may be arranged in the second direction (e.g., ±x direction) and may extend in the first direction (e.g., ±y direction). The fourth auxiliary lines AML4 may be electrically connected to a second voltage wiring 15. For example, the fourth auxiliary lines AML4 may extend in the first direction (e.g., ±y direction) to be electrically connected between a first portion 15*pa* of the second voltage wiring 15 and a second portion 15*pb* of the second voltage wiring 15. In other words, one end of each of the fourth auxiliary lines AML4 may be connected to the first portion 15*pa* of the second voltage wiring 15, and the other end of each of the fourth auxiliary lines AML4 may be connected to the second portion 15*pb* of the second voltage wiring 15.

According to some embodiments, as illustrated in FIG. 22, the fourth auxiliary lines AML4 and the first auxiliary patterns Ap1 may be arranged on the same layer.

According to some embodiments, the fourth auxiliary lines AML4 and the first auxiliary patterns Ap1 may be arranged apart from each other at same intervals in the second direction (e.g., ±x direction). For example, as illustrated in FIG. 22, a first distance d1 between the fourth auxiliary lines AML4 adjacent to each other among the plurality of fourth auxiliary lines AML4 may be equal to a second distance d2 between the first auxiliary patterns Ap1 adjacent to each other among the plurality of first auxiliary patterns Ap1.

According to some embodiments, the first voltage line PLv, the first auxiliary pattern Ap1, and the fourth auxiliary line AML4 may be arranged on the same layer, and the second voltage line PLh, the first auxiliary line AML1, and the second auxiliary line AML2 may be arranged on the same layer.

According to some embodiments, the first voltage line PLv, the first auxiliary pattern Ap1, and the fourth auxiliary line AML4 may be arranged on the second voltage line PLh, the first auxiliary line AML1, and the second auxiliary line AML2.

According to some embodiments, the first auxiliary line AML1 and the second auxiliary line AML2 may be arranged on the second voltage line PLh.

Figure 23:
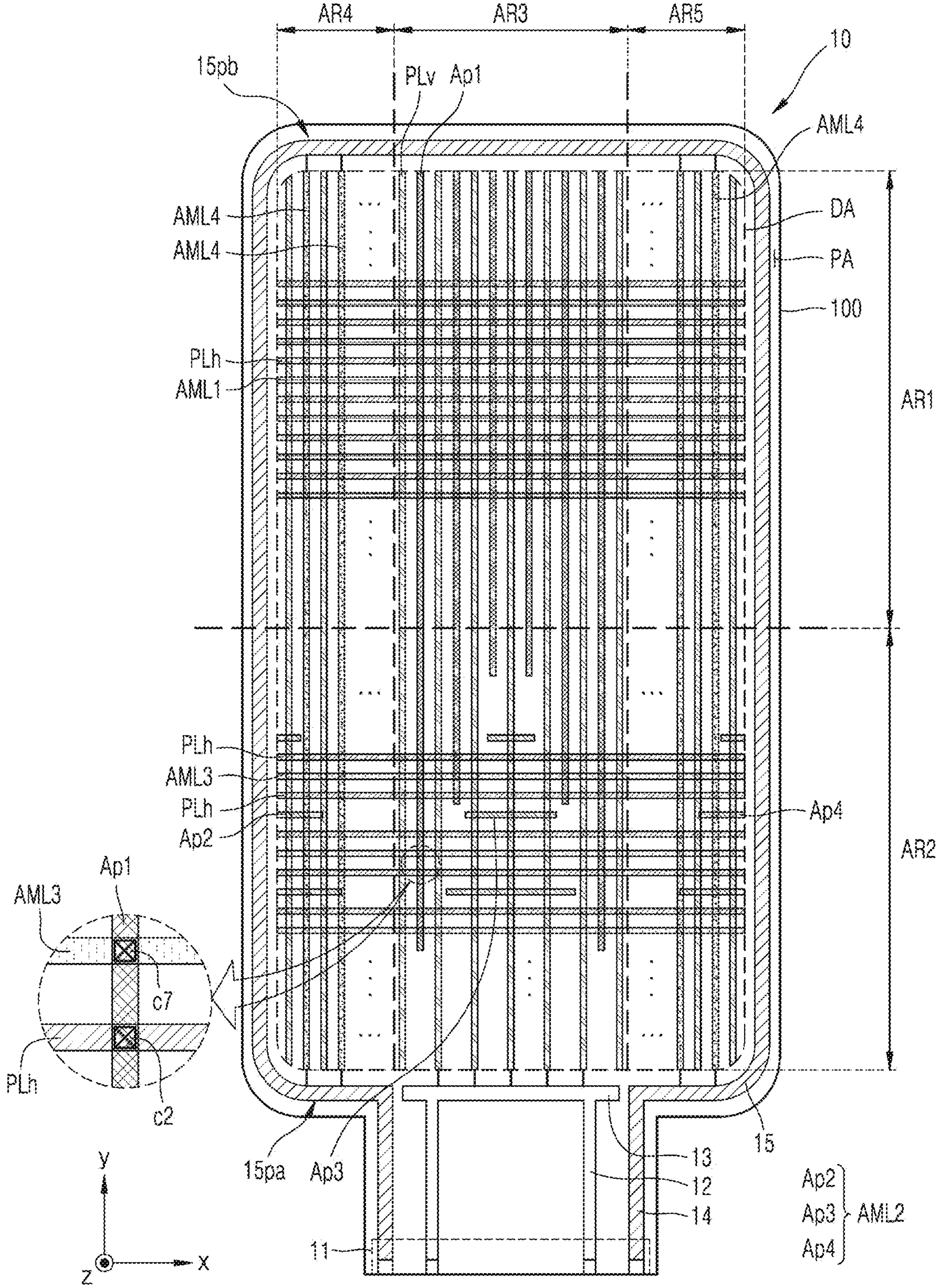
FIG. 23 is a plan view schematically illustrating a display panel according to some embodiments.

FIG. 23 is a plan view schematically illustrating a display panel according to other embodiments. FIG. 23 is a modification of FIG. 20, and they are different in the structure of a third auxiliary line. Hereinafter, redundant descriptions thereof will be replaced with those in the description of FIG. 20 and differences therebetween will be mainly described.

Referring to FIG. 23, a display panel 10 may include a plurality of third auxiliary lines AML3 arranged in a second area AR2 of a display area DA. In this case, the area of the second area AR2 of the display area DA may increase.

As described above with reference to FIG. 16, the third auxiliary lines AML3 may be arranged in the first direction (e.g., ±y direction) on the second area AR2 of the display area DA and may extend in the second direction (e.g., ±x direction). The third auxiliary lines AML3 may be arranged in each pixel row on at least a partial area of the second area AR2.

According to some embodiments, second auxiliary lines AML2 or third auxiliary lines AML3 may be arranged between adjacent second voltage lines PLh among the plurality of second voltage lines PLh. In other words, the second voltage line PLh may be arranged between the second auxiliary line AML2 and the third auxiliary line AML3 adjacent to each other among the plurality of second auxiliary lines AML2 and the plurality of third auxiliary lines AML3.

According to some embodiments, the third auxiliary lines AML3 may be arranged between the second auxiliary lines AML2. For example, as illustrated in FIG. 23, one third auxiliary line AML3 may be arranged between the second auxiliary lines AML2 adjacent to each other among the plurality of second auxiliary lines AML2.

According to some embodiments, the third auxiliary lines AML3 may be connected to at least one of the first voltage lines PLv, the second voltage lines PLh, or the first auxiliary patterns Ap1. For example, at least some of the third auxiliary lines AML3 may be directly connected to the first auxiliary patterns Ap1 through a plurality of seventh connectors c7. The seventh connectors c7 may be a portion that is buried in a contact hole formed in an insulating layer to connect an upper layer and a lower layer.

As such, the third auxiliary lines AML3 may form a driving voltage line PL of a grid shape (or a mesh structure) together with the first voltage lines PLv and the second voltage lines PLh. In this case, the driving voltage line PL may have a denser grid shape (or mesh structure) than when it has a grid shape (or a mesh structure) through the first voltage lines PLv and the second voltage lines PLh. Thus, when the grid shape (or mesh structure) of the driving voltage line PL is densely formed through the third auxiliary lines AML3, the voltage drop of the first driving voltage ELVDD may be further prevented or reduced and the luminance uniformity of the pixels PX (FIG. 1) may be relatively improved.

According to some embodiments, the second voltage line PLh, the first auxiliary line AML1, the second auxiliary line AML2, and the third auxiliary line AML3 may be arranged on the same layer.

According to some embodiments, the first voltage line PLv, the first auxiliary pattern Ap1, and the fourth auxiliary line AML4 may be arranged on the second voltage line PLh, the first auxiliary line AML1, the second auxiliary line AML2, and the third auxiliary line AML3.

According to some embodiments, the first auxiliary line AML1, the second auxiliary line AML2, and the third auxiliary line AML3 may be arranged on the second voltage line PLh.

Figure 24:
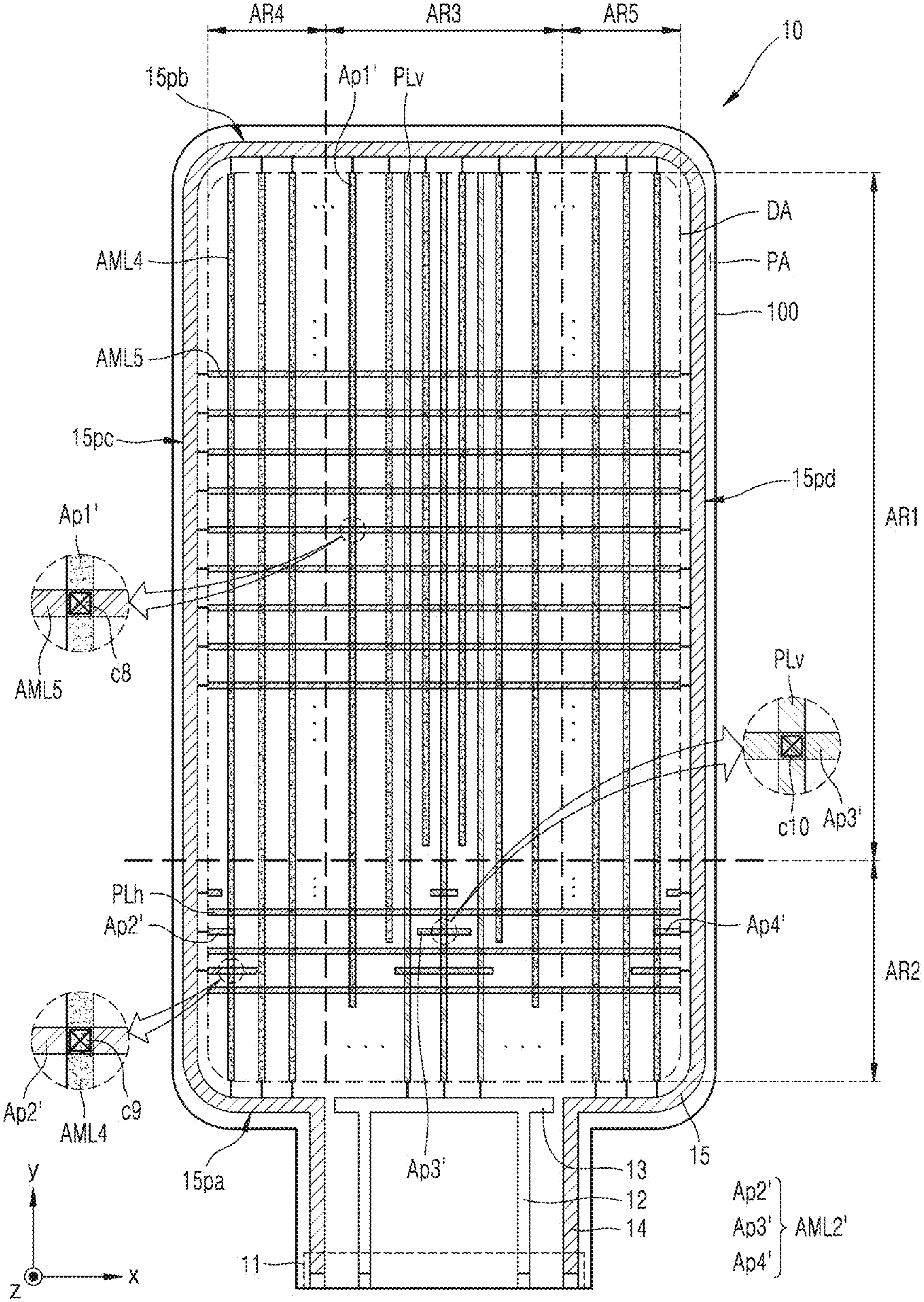
FIG. 24 is a plan view schematically illustrating a display panel according to some embodiments.

FIG. 24 is a plan view schematically illustrating a display panel according to other embodiments. FIG. 24 is a modification of FIG. 20, and they are different in the structure of a first auxiliary pattern and a first auxiliary line. Hereinafter, redundant descriptions thereof will be replaced with those in the description of FIG. 20 and differences therebetween will be mainly described.

Referring to FIG. 24, instead of a plurality of first auxiliary lines AML1, a plurality of fifth auxiliary lines AML5 may be arranged in a first area AR1 of a display area DA of a display panel 10.

As described above with reference to FIG. 19, the fifth auxiliary lines AML5 may be arranged in the first direction (e.g., ±y direction) and may extend in the second direction (e.g., ±x direction). The fifth auxiliary lines AML5 may be electrically connected to a second voltage wiring 15. For example, the fifth auxiliary lines AML5 may extend in the second direction (e.g., ±x direction) to be electrically connected between a third portion 15*pc* of the second voltage wiring 15 and a fourth portion 15*pd* of the second voltage wiring 15. In other words, one end of each of the fifth auxiliary lines AML5 may be connected to the third portion 15*pc* of the second voltage wiring 15, and the other end of each of the fifth auxiliary lines AML5 may be connected to the fourth portion 15*pd* of the second voltage wiring 15.

According to some embodiments, the fifth auxiliary lines AML5 may be connected to at least one of the fourth auxiliary lines AML4 or the first auxiliary patterns Ap1'. For example, the fifth auxiliary lines AML5 may be directly connected to the first auxiliary patterns Ap1' through a plurality of eighth connectors c8. The eighth connectors c8 may be a portion that is buried in a contact hole formed in an insulating layer to connect an upper layer and a lower layer. The fifth auxiliary lines AML5 may be directly connected to the fourth auxiliary lines AML4 as being directly connected to the first auxiliary patterns Ap1' through the eighth connectors c8.

In this case, the first auxiliary patterns Ap1' may not be connected to at least one of the first voltage lines PLv or the second voltage lines PLh and may be electrically connected to the second voltage wiring 15. The first auxiliary patterns Ap1' may be electrically connected to a first portion 15*pa* of the second voltage wiring 15.

According to some embodiments, a second auxiliary pattern Ap2' and a fourth auxiliary pattern Ap4' each of second auxiliary lines AML2' may not be connected to at least one of the first voltage lines PLv or the second voltage line PLh and may be electrically connected to the second voltage wiring 15. The second auxiliary pattern Ap2' and the fourth auxiliary pattern Ap4' of each of the second auxiliary lines AML2' may be connected to the fourth auxiliary lines AML4. For example, the second auxiliary pattern Ap2' and the fourth auxiliary pattern Ap4' of each of the second auxiliary lines AML2' may be directly connected to the fourth auxiliary lines AML4 through a plurality of ninth connectors c9. The ninth connectors c9 may be a portion that is buried in a contact hole formed in an insulating layer to connect an upper layer and a lower layer.

Moreover, in order to increase the display area DA of the display panel 10, the width of the second voltage wiring 15 arranged in the peripheral area PA may be reduced. In the display panel 10, heating may occur due to the current concentrated on the second voltage wiring 15 having a reduced width. However, when the first auxiliary pattern Ap1, the fourth auxiliary lines AML4, the fifth auxiliary lines AML5, the second auxiliary pattern Ap2', and the fourth auxiliary pattern Ap4' of each of the second auxiliary lines AML2' are electrically connected to the second voltage wiring 15 according to some embodiments, the current may be distributed through the lines of a grid shape (or a mesh structure). As a result, a heating phenomenon due to a decrease in the width of the second voltage wiring 15 may be prevented or reduced.

According to some embodiments, a third auxiliary pattern Ap3' of each of the second auxiliary lines AML2' may be connected to at least one of the first voltage lines PLv or the second voltage lines PLh. For example, the third auxiliary pattern Ap3' of each of the second auxiliary lines AML2' may be directly connected to the first voltage lines PLv through a tenth connectors c10. The tenth connectors c10 may be a portion that is buried in a contact hole formed in an insulating layer to connect an upper layer and a lower layer.

Figure 25:
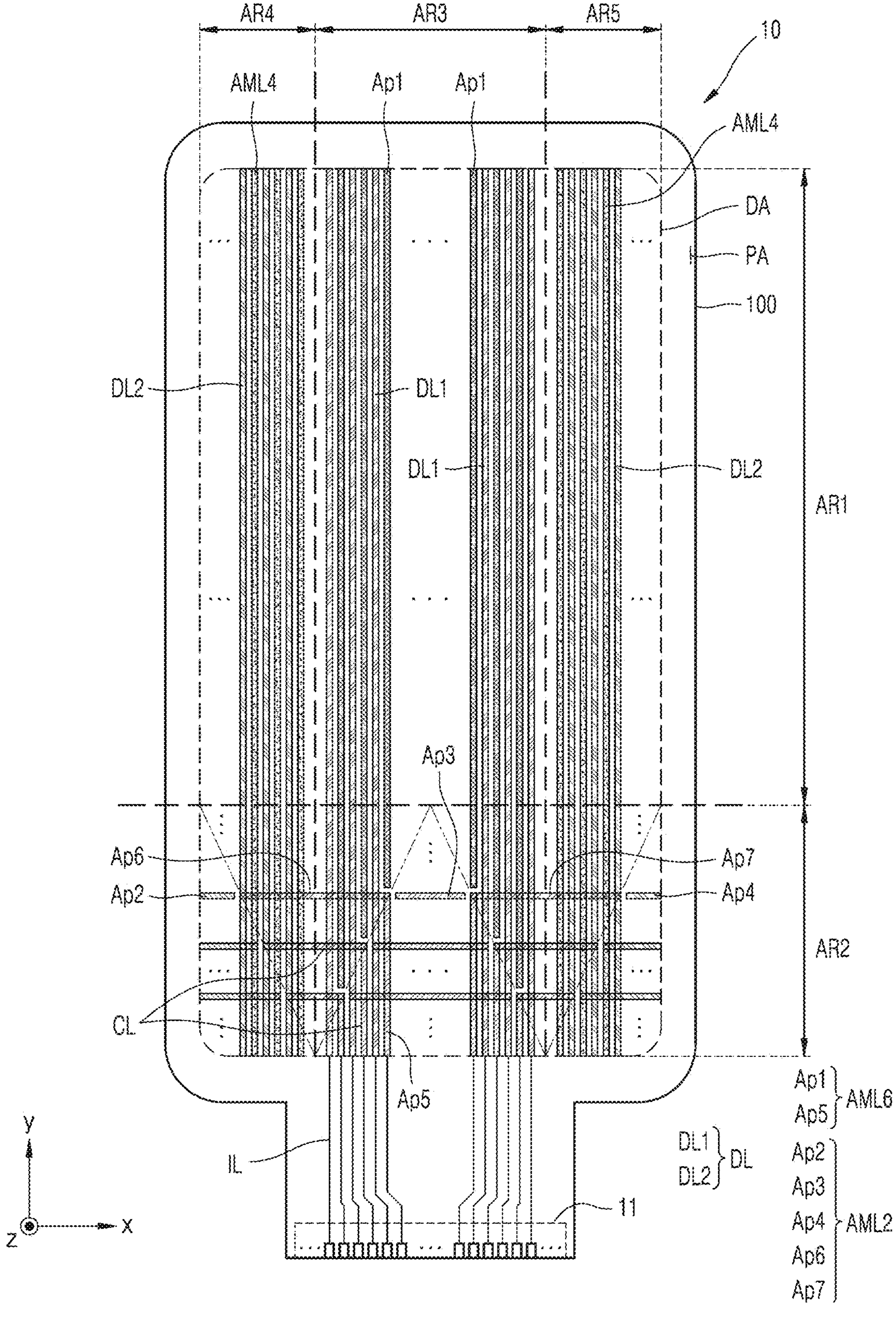
FIG. 25 is a plan view schematically illustrating a display panel according to some embodiments.
Figure 26:
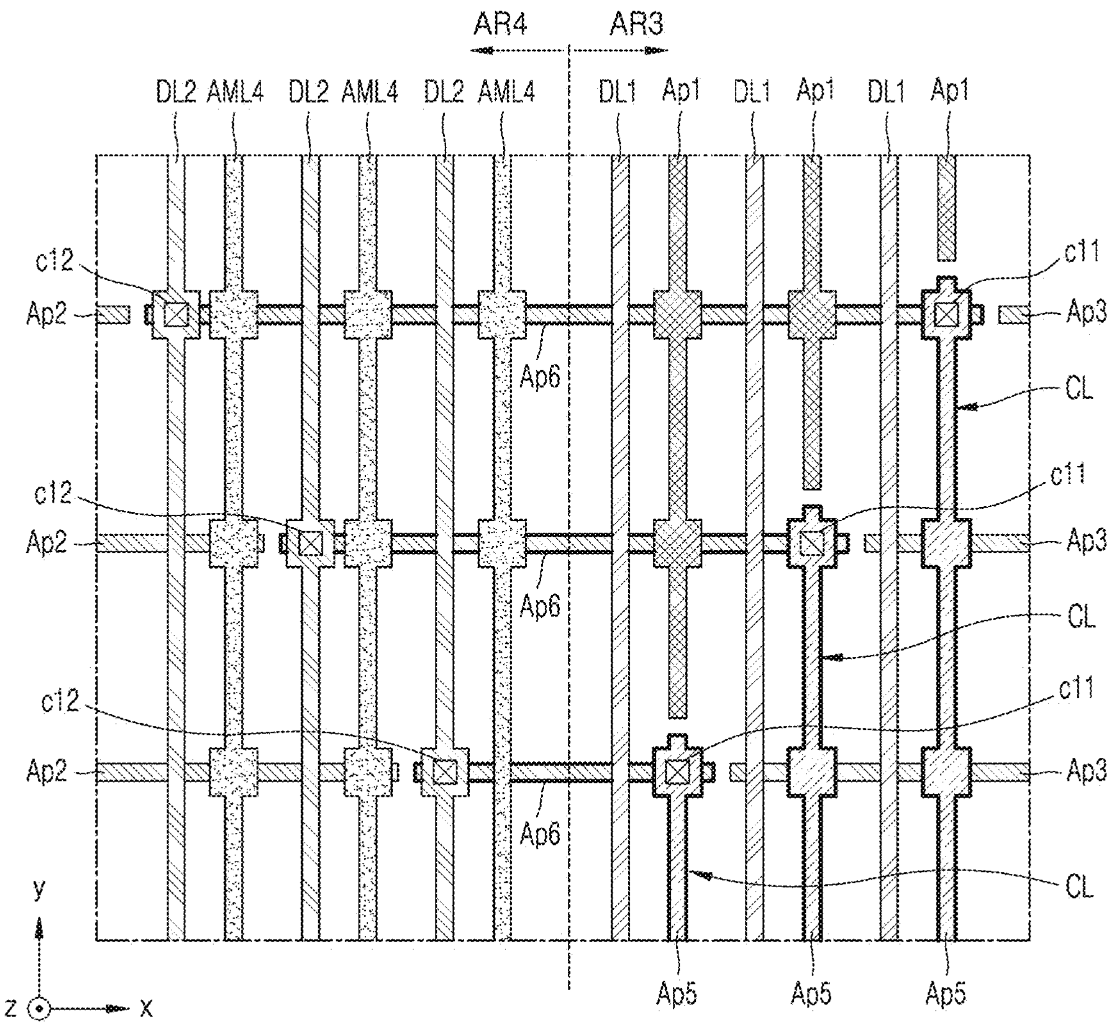
FIG. 26 is an enlarged plan view schematically illustrating a portion of the display panel of FIG. 25.

FIG. 25 is a plan view schematically illustrating a display panel according to other embodiments, and FIG. 26 is an enlarged plan view schematically illustrating a portion of the display panel of FIG. 25. Particularly, FIG. 26 is an enlarged plan view schematically illustrating a portion of the third area and the fourth area of FIG. 25.

Referring to FIGS. 25 and 26, a plurality of data lines DL extending in the first direction (e.g., ±y direction) may be arranged in a display area DA. Among the plurality of data lines DL, data lines DL arranged in a third area AR3 of the display area DA may be referred to as a first data line DL1, and data lines DL arranged in a fourth area AR4 and a fifth area AR5 of the display area DA may be referred to as a second data line DL2.

The first data lines DL1 may be electrically connected to the pad unit 11 through input lines IL respectively and may receive data signals supplied from the pad unit 11 through the input lines IL. The second data lines DL2 may be electrically connected to the pad unit 11 through connection lines CL and input lines IL respectively. The second data lines DL2 may receive data signals supplied from the pad unit 11 through the connection lines CL and the input lines IL respectively. In this case, each of the connection lines CL may include a fifth auxiliary pattern Ap5 and a sixth auxiliary pattern Ap6 or may include a fifth auxiliary pattern Ap5 and a seventh auxiliary pattern Ap7 as described below.

As such, when the second data lines DL2 are respectively electrically connected to the pad unit 11 through the connection lines CL arranged in the display area DA, the area of the peripheral area PA may be reduced or the area of the display area DA may be increased.

A plurality of sixth auxiliary lines AML6 may be arranged in the third area AR3 of the display area DA. Each of the sixth auxiliary lines AML6 may include a first auxiliary pattern Ap1 and a fifth auxiliary pattern Ap5. The first auxiliary pattern Ap1 and the fifth auxiliary pattern Ap5 may be spaced apart from each other in the first direction (e.g., ±y direction). The first auxiliary pattern Ap1 and the fifth auxiliary pattern Ap5 may be arranged on the same layer.

In this case, the first auxiliary pattern Ap1 may be connected to at least one of the first voltage lines PLv or the second voltage lines PLh as described above. The fifth auxiliary pattern Ap5 may be electrically connected to the pad unit 11 through the input line IL extending from the pad unit 11.

A plurality of second auxiliary lines AML2 may be arranged in the second area AR2 of the display area DA. Each of the second auxiliary lines AML2 may include a second auxiliary pattern Ap2, a third auxiliary pattern Ap3, a fourth auxiliary pattern Ap4, a sixth auxiliary pattern Ap6, and a seventh auxiliary pattern Ap7. The sixth auxiliary pattern Ap6 may be arranged between the second auxiliary pattern Ap2 and the third auxiliary pattern Ap3, and the seventh auxiliary pattern Ap7 may be arranged between the third auxiliary pattern Ap3 and the fourth auxiliary pattern Ap4. The second auxiliary pattern Ap2, the sixth auxiliary pattern Ap6, the third auxiliary pattern Ap3, the seventh auxiliary pattern Ap7, and the fourth auxiliary pattern Ap4 may be arranged on the same layer.

The second auxiliary pattern Ap2 and the sixth auxiliary pattern Ap6 may be spaced apart from each other in the second direction (e.g., ±x direction), the sixth auxiliary pattern Ap6 and the third auxiliary pattern Ap3 may be spaced apart from each other in the second direction (e.g., ±x direction), the third auxiliary pattern Ap3 and the seventh auxiliary pattern Ap7 may be spaced apart from each other in the second direction (e.g., ±x direction), and the seventh auxiliary pattern Ap7 and the fourth auxiliary pattern Ap4 may be spaced apart from each other in the second direction (e.g., ±x direction).

In this case, the second auxiliary pattern Ap2, the third auxiliary pattern Ap3, and the fourth auxiliary pattern Ap4 may be connected to at least one of the first voltage lines PLv or the second voltage lines PLh as described above.

One end of each of the sixth auxiliary pattern Ap6 and the seventh auxiliary pattern Ap7 may be connected to a fifth auxiliary pattern Ap5. For example, one end of each of the sixth auxiliary pattern Ap6 and the seventh auxiliary pattern Ap7 may be directly connected to the fifth auxiliary pattern Ap5 through a plurality of eleventh connectors c11. The eleventh connectors c11 may be a portion that is buried in a contact hole formed in an insulating layer to connect an upper layer and a lower layer.

The other end of each of the sixth auxiliary pattern Ap6 and the seventh auxiliary pattern Ap7 may be connected to the second data line DL2. For example, the other end of each of the sixth auxiliary pattern Ap6 and the seventh auxiliary pattern Ap7 may be directly connected to the second data line DL2 through a plurality of twelfth connectors c12. The twelfth connectors c12 may be a portion that is buried in a contact hole formed in an insulating layer to connect an upper layer and a lower layer.

As such, the fifth auxiliary pattern Ap5, the sixth auxiliary pattern Ap6, and the seventh auxiliary pattern Ap7 may be configured to transmit the data signal received from the pad unit 11 through the input line IL, to the second data line DL2. The connection line CL may function to transmit the data signal received from the pad unit 11 through the input line IL, to the second data line DL2.

Figure 27:
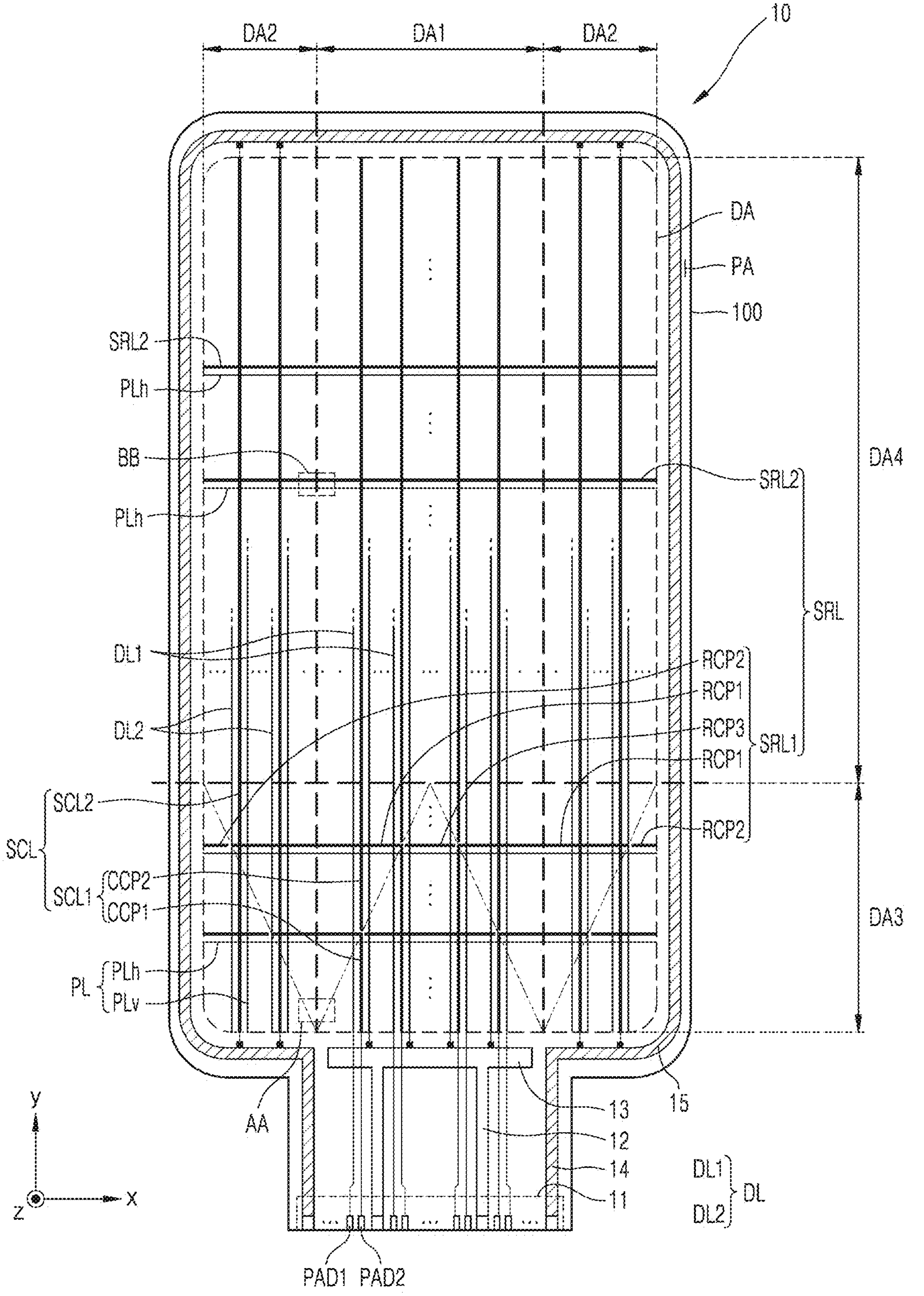
FIG. 27 is a plan view schematically illustrating a display panel according to some embodiments.
Figure 28:
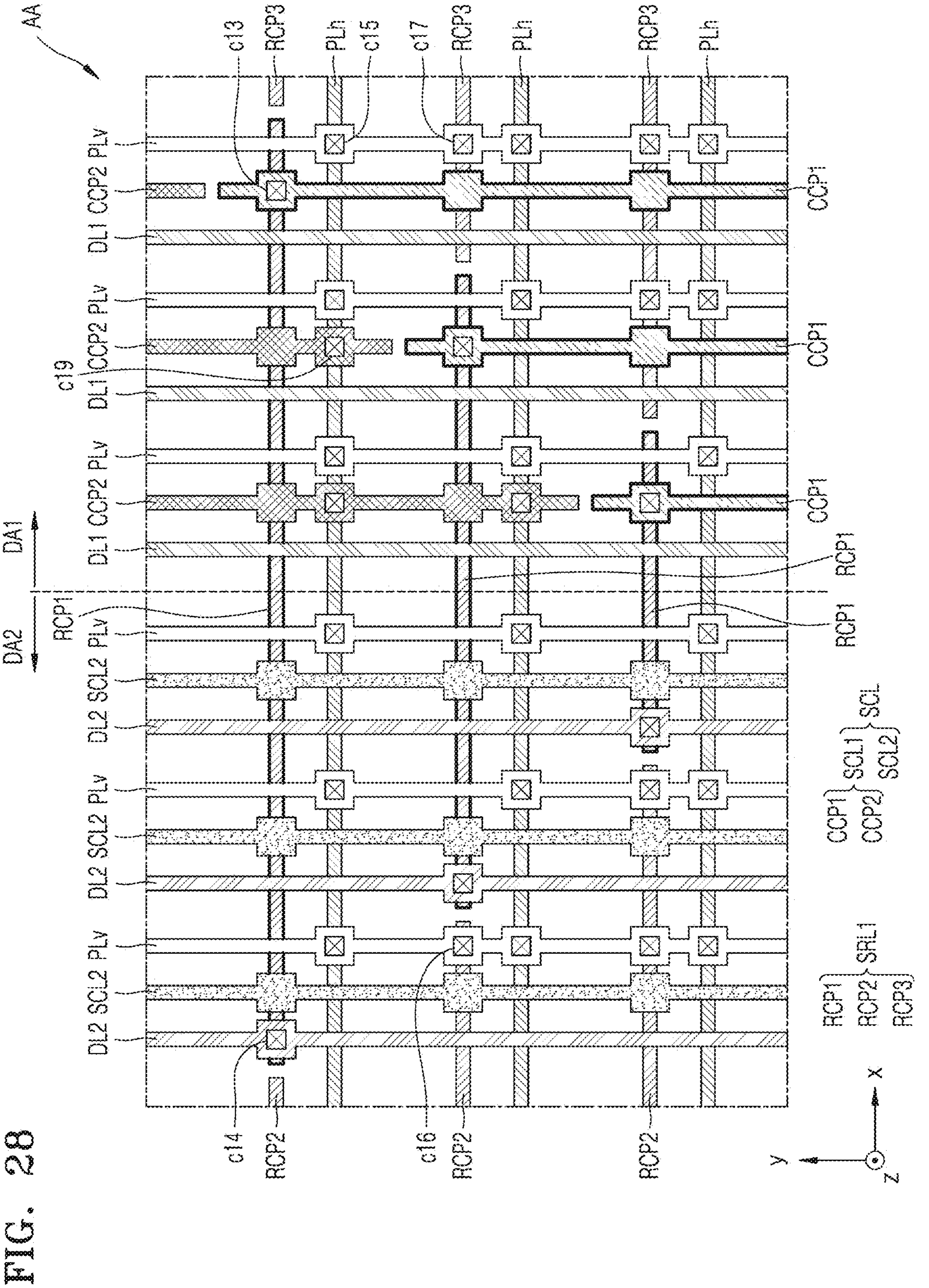
FIG. 28 is an enlarged plan view schematically illustrating a portion of the display panel of FIG. 27.
Figure 29:
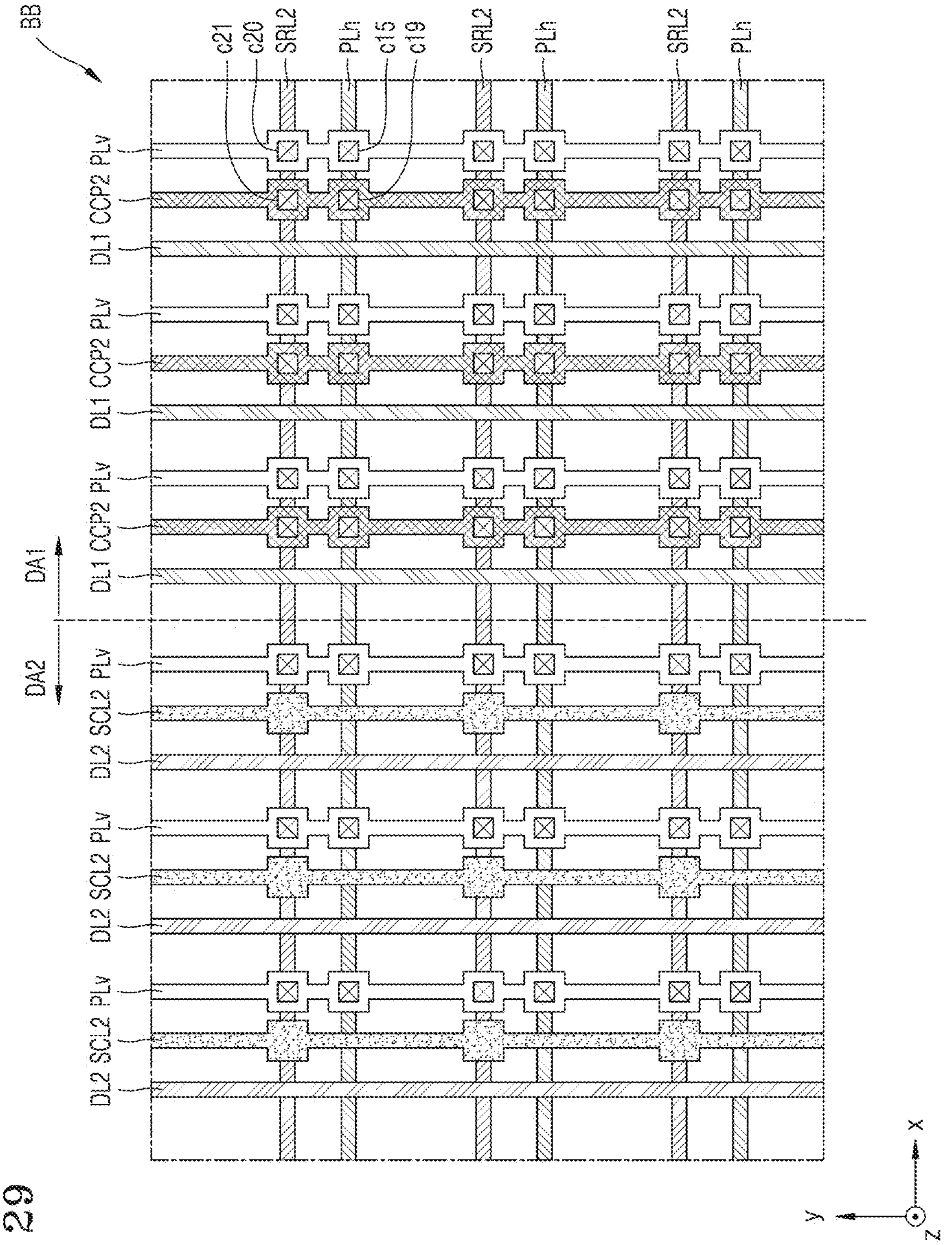
FIG. 29 is an enlarged plan view schematically illustrating another portion of the display panel of FIG. 27.

FIG. 27 is a plan view schematically illustrating a display panel according to other embodiments. FIG. 28 is an enlarged plan view schematically illustrating a portion of the display panel of FIG. 27, and FIG. 29 is an enlarged plan view schematically illustrating another portion of the display panel of FIG. 27.

Referring to FIG. 27, a display panel 10 may include a plurality of data lines DL, a plurality of driving voltage lines PL, a plurality of auxiliary row lines SRL, and a plurality of auxiliary column lines SCL. Some of the plurality of data lines DL may be referred to as a first data line DL1, and others may be referred to as a second data line DL2. Some of the plurality of driving voltage lines PL may be referred to as a first voltage line PLv, and others may be referred to as a second voltage line PLh. Some of the plurality of auxiliary row lines SRL may be referred to as a first auxiliary row line SRL1, and others may be referred to as a second auxiliary row line SRL2. Some of the plurality of auxiliary column lines SCL may be referred to as a first auxiliary column line SCL1, and others may be referred to as a second auxiliary column line SCL2.

Moreover, a first display area DA1 and second display areas DA2 located on both sides of the first display area DA1 in the second direction (e.g., ±x direction) may be defined in a substrate 100. Also, a third display area DA3 and a fourth display area DA4 into which the display area DA is divided in the second direction (e.g., ±x direction) may be defined in the substrate 100.

The first data lines DL1 may extend in the first direction (e.g., ±y direction) on the first display area DA1 and may be respectively connected to first pads PAD1. The second data lines DL2 may extend in the first direction (e.g., ±y direction) on the second display areas DA2.

The first voltage lines PLv may extend in the first direction (e.g., ±y direction) on the first display area DA1 and the second display area DA2. The second voltage lines PLh may extend in the second direction (e.g., ±x direction) on the third display area DA3 and the fourth display area DA4. The first voltage lines PLv and the second voltage lines PLh may be connected to the first voltage wiring 13 to apply the first driving voltage ELVDD (FIG. 3). The first voltage lines PLv and the second voltage lines PLh may be connected to each other through fifteenth connectors c15 as illustrated in FIGS. 28 and 29. Here, the fifteenth connectors c15 may be a portion that is buried in a contact hole formed in an insulating layer to connect an upper layer and a lower layer or may be a portion that connects one line and another line formed on the same layer.

Each of the first auxiliary row lines SRL1 may include first row connection portions RCP1, second row connection portions RCP2, and third row connection portions RCP3. In this case, the first row connection portions RCP1, the second row connection portions RCP2, and the third row connection portions RCP3 may be spaced apart from each other. The third row connection portion RCP3 may be arranged between the first row connection portions RCP1, and the first row connection portion RCP1 may be arranged between the second row connection portion RCP2 and the third row connection portion RCP3. The first row connection portions RCP1, the second row connection portions RCP2, and the third row connection portions RCP3 may extend in the second direction (e.g., ±x direction) on the third display area DA3.

According to some embodiments, one end of each of the first row connection portions RCP1 may be connected to a first column connection portion CCP1 described below, and the other end of each of the first row connection portions RCP1 may be connected to the second data line DL2. For example, as illustrated in FIG. 28, one end of each of the first row connection portions RCP1 may be connected to the first column connection portions CCP1 through thirteenth connectors c13, and the other end of each of the first row connection portions RCP1 may be connected to the second data lines DL2 through fourteenth connectors c14. Here, the thirteenth connectors c13 and the fourteenth connectors c14 may be a portion that is buried in a contact hole formed in an insulating layer to connect an upper layer and a lower layer or may be a portion that connects one line and another line formed on the same layer. Moreover, the first column connection portion CCP1 may be connected to a second pad PAD2 to receive an electrical signal. Thus, the second data line DL2 may receive the electrical signal through the first row connection portion RCP1 connected to the first column connection portion CCP1.

According to some embodiments, the first driving voltage ELVDD may be applied to the second row connection portions RCP2 and the third row connection portions RCP3. For example, as illustrated in FIG. 28, the second row connection portions RCP2 may be connected to the first voltage lines PLv to which the first driving voltage ELVDD is applied through sixteenth connectors c16, and the third row connection portions RCP3 may be connected to the first voltage lines PLv through seventeenth connectors c17. Here, the sixteenth connectors c16 and the seventeenth connectors c17 may be a portion that is buried in a contact hole formed in an insulating layer to connect an upper layer and a lower layer or may be a portion that connects one line and another line formed on the same layer.

The second auxiliary row lines SRL2 may extend in the second direction (e.g., ±x direction) on the fourth display area DA4. The first driving voltage ELVDD may be applied to the second auxiliary row lines SRL2. For example, as illustrated in FIG. 29, the second auxiliary row lines SRL2 may be connected to the first voltage lines PLv through twentieth connectors c20. Here, the twentieth connectors c20 may be a portion that is buried in a contact hole formed in an insulating layer to connect an upper layer and a lower layer or may be a portion that connects one line and another line formed on the same layer.

Each of the first auxiliary column lines SCL1 may include a first column connection portion CCP1 and a second column connection portion CCP2. The first column connection portions CCP1 and the second column connection portion CCP2 may extend in the first direction (e.g., ±y direction) on the first display area DA1. The second column connection portions CCP2 may be respectively spaced apart from the first column connection portions CCP1. The first column connection portions CCP1 may be respectively connected to the second pads PAD2. The first column connection portion CCP1 may be connected to the first row connection portion RCP1 as described above.

According to some embodiments, the first driving voltage ELVDD may be applied to the second column connection portions CCP2. For example, as illustrated in FIGS. 28 and 29, the second column connection portions CCP2 may be connected to the second voltage lines PLh through nineteenth connectors c19. As illustrated in FIG. 29, the second column connection portions CCP2 may be connected to the second auxiliary row line SRL2 through twenty-first connectors c21. Here, the nineteenth connectors c19 and the twenty-first connectors c21 may be a portion that is buried in a contact hole formed in an insulating layer to connect an upper layer and a lower layer or may be a portion that connects one line and another line formed on the same layer.

As such, the second column connection portions CCP2 and the second auxiliary row lines SRL2 may have a grid shape (or a mesh structure) and may be connected to the driving voltage line PL to be arranged in a double grid shape (or mesh structure). In this case, because the grid shape (or mesh structure) of the line to which the first driving voltage ELVDD is applied is densely formed, the voltage drop of the first driving voltage ELVDD due to a decrease in the width of the first voltage wiring 13 may be prevented or reduced and the luminance uniformity of the pixels PX may be improved. Because the driving voltage line PL, the second column connection portion CCP2, and the second auxiliary row line SRL2 are connected to each other and the first driving voltage ELVDD is applied thereto, at least one of the fifteenth connector c15, the nineteenth connector c19, the twentieth connector c20, or the twenty-first connector c21 may be omitted.

The second auxiliary column lines SCL2 may extend in the first direction (e.g., ±y direction) on the second display areas DA2. Both ends of each of the second auxiliary column lines SCL2 may be connected to the second voltage wiring 15. The second auxiliary column lines SCL2 may be connected to the second voltage wiring 15 and thus the second driving voltage ELVSS (FIG. 3) may be applied thereto. The second driving voltage ELVSS may have a different level than the first driving voltage ELVDD.

Figure 30:
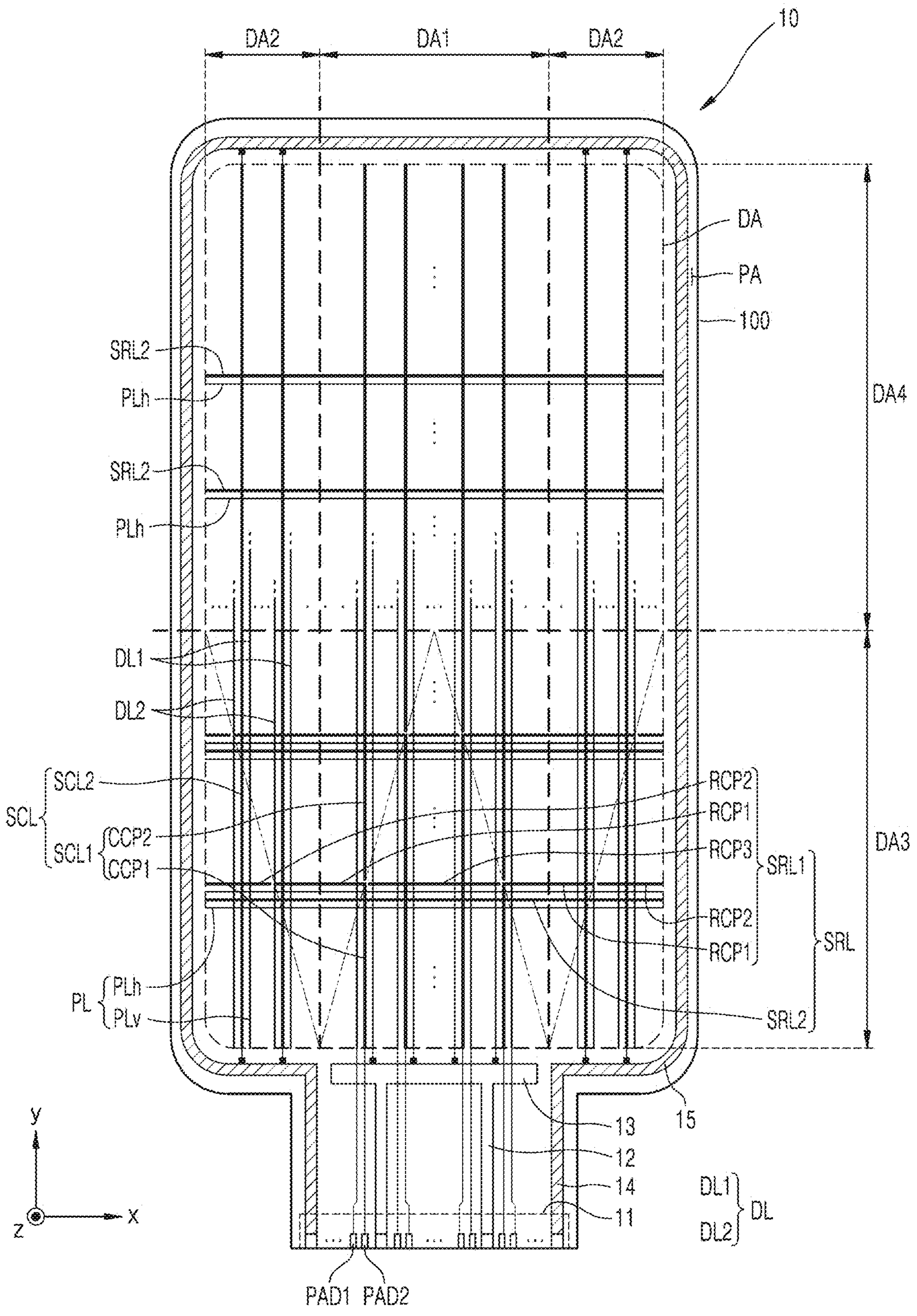
FIG. 30 is a plan view schematically illustrating a display panel according to some embodiments.

FIG. 30 is a plan view schematically illustrating a display panel according to other embodiments. FIG. 30 is a modification of FIG. 27, and they are different in the structure of a second auxiliary row line. Hereinafter, redundant descriptions thereof will be replaced with those in the description of FIG. 27 and differences therebetween will be mainly described.

Referring to FIG. 30, unlike the illustration in FIG. 27, at least one of the second auxiliary row lines SRL2 may be arranged in the third display area DA3. At least one of the second auxiliary row lines SRL2 may be arranged between the first auxiliary row lines SRL1.

Figure 31:
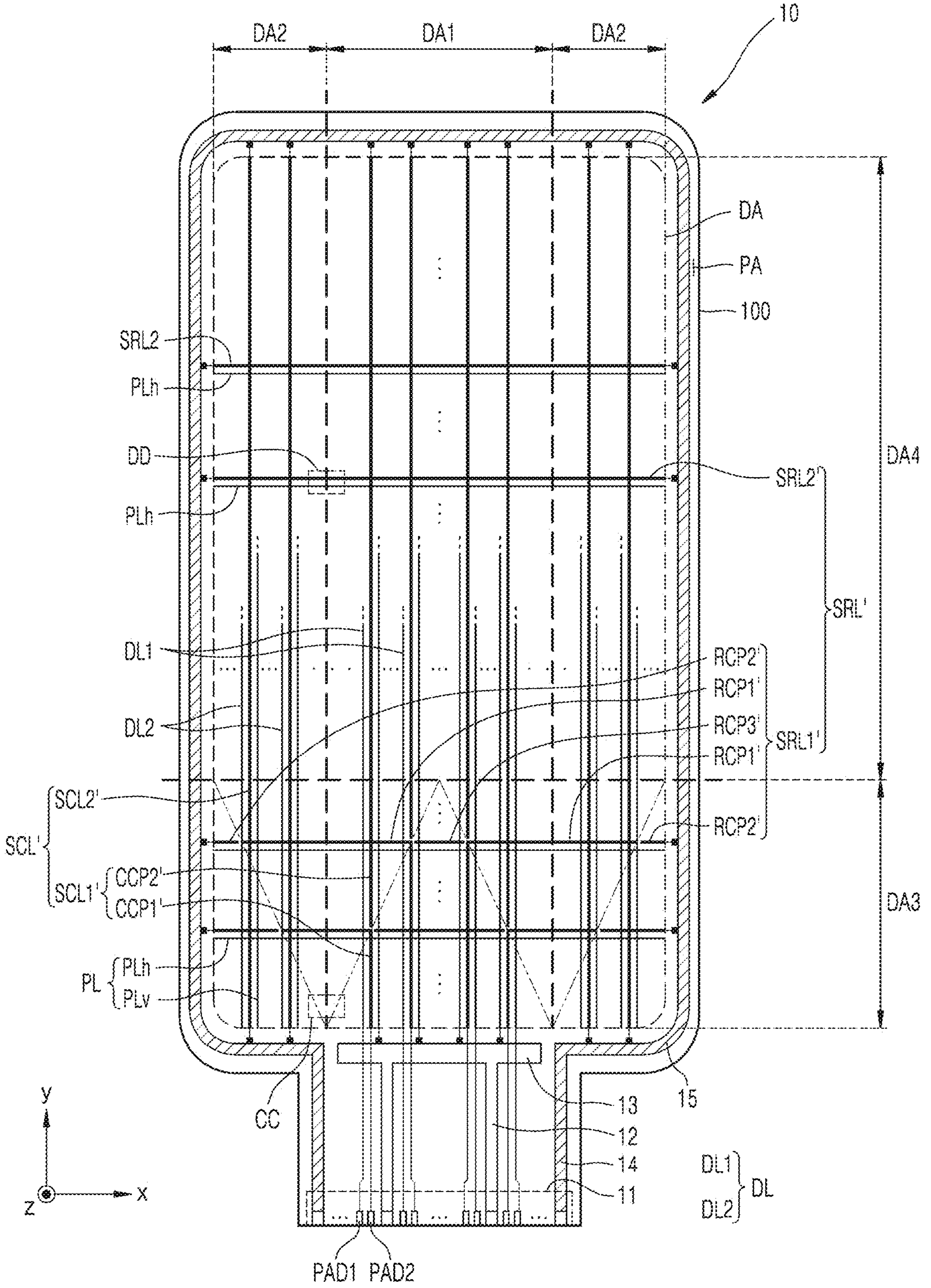
FIG. 31 is a plan view schematically illustrating a display panel according to some embodiments.
Figure 32:
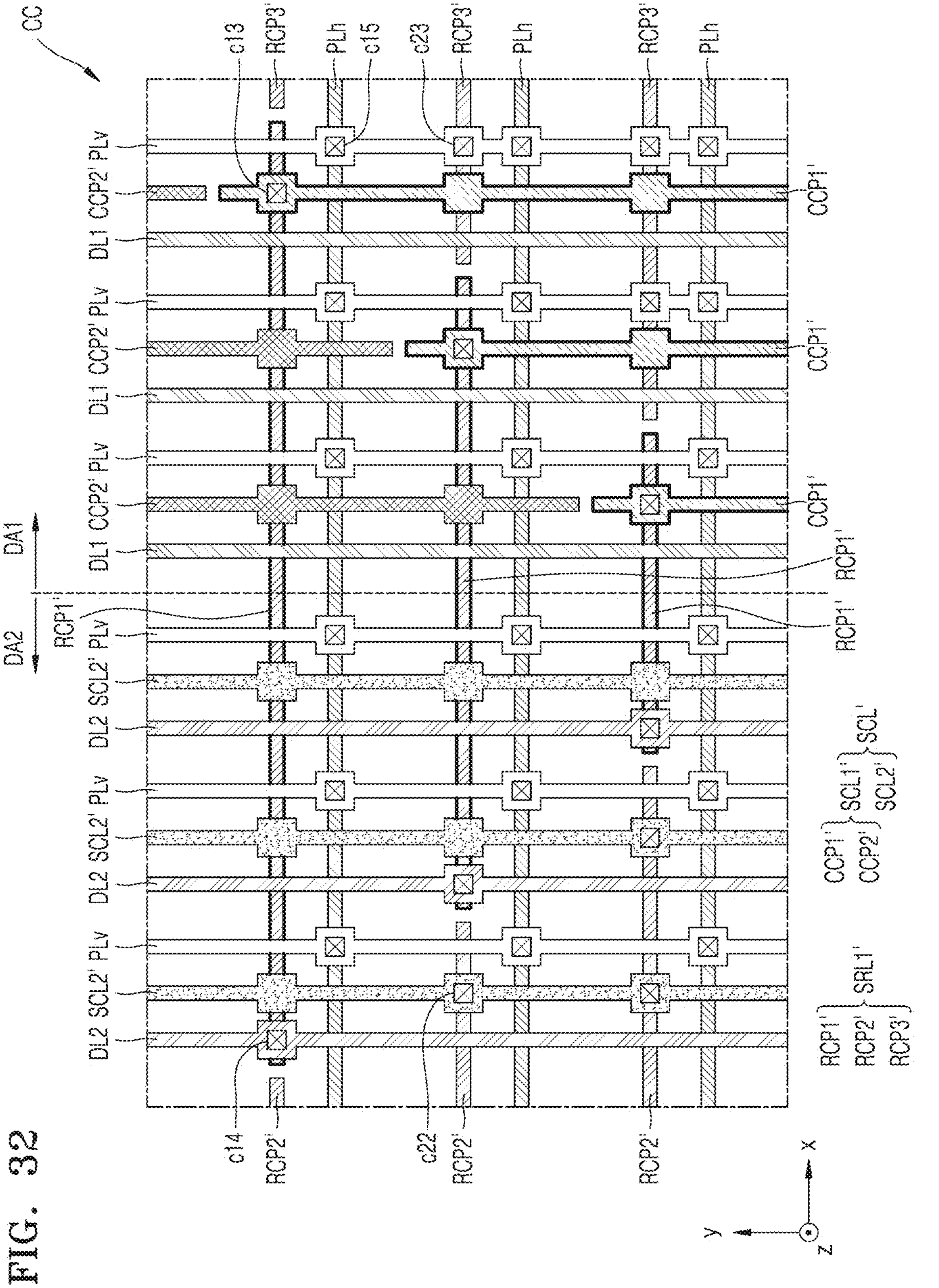
FIG. 32 is an enlarged plan view schematically illustrating a portion of the display panel of FIG. 31.
Figure 33:
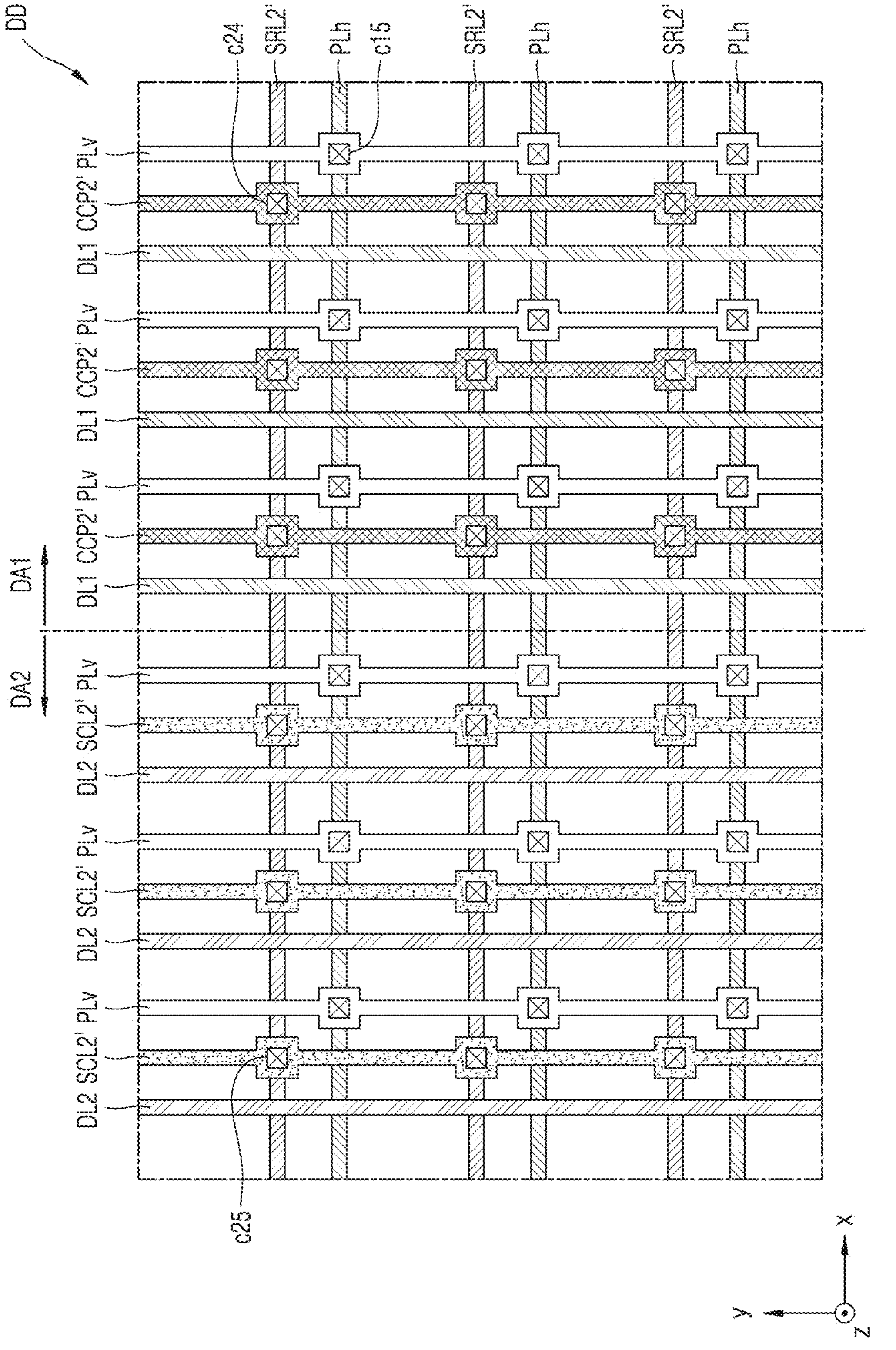
FIG. 33 is an enlarged plan view schematically illustrating another portion of the display panel of FIG. 31.

FIG. 31 is a plan view schematically illustrating a display panel according to other embodiments. FIG. 32 is an enlarged plan view schematically illustrating a portion of the display panel of FIG. 31, and FIG. 33 is an enlarged plan view schematically illustrating another portion of the display panel of FIG. 31. FIGS. 31, 32, and 33 are respectively modifications of FIGS. 27, 28, and 29, and they are different in the structure of a second auxiliary row line. Hereinafter, redundant descriptions thereof will be replaced with those in the description of FIGS. 27, 28, and 29 and differences therebetween will be mainly described.

Referring to FIG. 31, a display panel 10 may include a plurality of auxiliary row lines SRL' and a plurality of auxiliary column lines SCL'. Some of the plurality of auxiliary row lines SRL' may be referred to as a first auxiliary row line SRL1', and others may be referred to as a second auxiliary row line SRL2'. Some of the plurality of auxiliary column lines SCL' may be referred to as a first auxiliary column line SCL1', and others may be referred to as a second auxiliary column line SCL2'.

Each of the first auxiliary row lines SRL1' may include first row connection portions RCP1', second row connection portions RCP2', and third row connection portions RCP3'. In this case, the first row connection portions RCP1', the second row connection portions RCP2', and the third row connection portions RCP3' may be spaced apart from each other. The third row connection portion RCP3' may be arranged between the first row connection portions RCP1', and the first row connection portion RCP1' may be arranged between the second row connection portion RCP2' and the third row connection portion RCP3'. The first row connection portions RCP1', the second row connection portions RCP2', and the third row connection portions RCP3' may extend in the second direction (e.g., ±x direction) on the third display area DA3.

According to some embodiments, one end of each of the first row connection portions RCP1' may be connected to a first column connection portion CCP1' described below, and the other end of each of the first row connection portions RCP1' may be connected to the second data line DL2. For example, as illustrated in FIG. 32, one end of each of the first row connection portions RCP1' may be connected to the first column connection portions CCP1' through thirteenth connectors c13, and the other end of each of the first row connection portions RCP1' may be connected to the second data lines DL2 through fourteenth connectors c14. The first column connection portion CCP1' may be connected to a second pad PAD2 to receive an electrical signal. Thus, the second data line DL2 may receive the electrical signal through the first row connection portion RCP1' connected to the first column connection portion CCP1'.

According to some embodiments, the second driving voltage ELVSS (FIG. 3) may be applied to the second row connection portions RCP2'. For example, as illustrated in FIG. 31, one end of each of the second row connection portions RCP2' may be connected to the second voltage wiring 15. As another example, as illustrated in FIG. 32, the second row connection portions RCP2' may be connected to the second auxiliary column line SCL2' to which the second driving voltage ELVSS is applied through twenty-second connectors c22. Here, the twenty-second connectors c22 may be a portion that is buried in a contact hole formed in an insulating layer to connect an upper layer and a lower layer or may be a portion that connects one line and another line formed on the same layer.

According to some embodiments, the first driving voltage ELVDD (FIG. 3) may be applied to the third row connection portions RCP3'. For example, as illustrated in FIG. 32, the third row connection portions RCP3' may be connected to the first voltage lines PLv to which the first driving voltage ELVDD is applied through twenty-third connectors c23. Here, the twenty-third connectors c23 may be a portion that is buried in a contact hole formed in an insulating layer to connect an upper layer and a lower layer or may be a portion that connects one line and another line formed on the same layer.

The second auxiliary row lines SRL2' may extend in the second direction (e.g., ±x direction) on the fourth display area DA4. The second driving voltage ELVSS may be applied to the second auxiliary row lines SRL2'. For example, both ends of each of the second auxiliary row lines SRL2' may be connected to the second voltage wiring 15 as illustrated in FIG. 31. Also, as illustrated in FIG. 33, the second auxiliary row lines SRL2' may be connected to second column connection portions CCP2' to which the second driving voltage ELVSS is applied through twenty-fourth connectors c24. Also, the second auxiliary row lines SRL2' may be connected to the second auxiliary column lines SCL2' to which the second driving voltage ELVSS is applied through twenty-fifth connectors c25. Here, the twenty-fourth connectors c24 and the twenty-fifth connectors c25 may be a portion that is buried in a contact hole formed in an insulating layer to connect an upper layer and a lower layer or may be a portion that connects one line and another line formed on the same layer.

Each of the first auxiliary column lines SCL1' may include a first column connection portion CCP1' and a second column connection portion CCP2'. The first column connection portions CCP1' and the second column connection portion CCP2' may extend in the first direction (e.g., ±y direction) on the first display area DA1. The second column connection portions CCP2' may be respectively spaced apart from the first column connection portions CCP1'. The first column connection portions CCP1' may be respectively connected to the second pads PAD2. The first column connection portion CCP1' may be connected to the first row connection portion RCP1' as described above.

According to some embodiments, the second driving voltage ELVSS may be applied to the second column connection portions CCP2'. For example, as illustrated in FIG. 31, one end of each of the second column connection portions CCP2' may be connected to the second voltage wiring 15. Also, as illustrated in FIG. 33, the second column connection portions CCP2' may be connected to the second auxiliary row line SRL2' through the twenty-fourth connectors c24.

The second auxiliary column lines SCL2' may extend in the first direction (e.g., ±y direction) on the second display areas DA2. Both ends of each of the second auxiliary column lines SCL2' may be connected to the second voltage wiring 15. The second auxiliary column lines SCL2' may be connected to the second voltage wiring 15 and thus the second driving voltage ELVSS may be applied thereto. The second driving voltage ELVSS may have a different level than the first driving voltage ELVDD.

Moreover, in order to increase the display area DA of the display panel 10, the width of the second voltage wiring 15 arranged in the peripheral area PA may be reduced. In the display panel 10, heating may occur due to the current concentrated on the second voltage wiring 15 having a reduced width. However, when the second row connection portion RCP2' of the first auxiliary row line SRL1', the second auxiliary row line SRL2', the second column connection portion CCP2' of the first auxiliary column line SCL1', and the second auxiliary column line SCL2' are electrically connected to the second voltage wiring 15 according to some embodiments, the current may be distributed through the lines of a grid shape (or a mesh structure). As a result, a heating phenomenon due to a decrease in the width of the second voltage wiring 15 may be prevented or reduced.

Although only the display apparatus has been mainly described above, embodiments according to the disclosure are not limited thereto. For example, a display apparatus manufacturing method for manufacturing the display apparatus may also fall within the scope of the disclosure.

As described above, according to some embodiments, a display apparatus having a reduced peripheral area and an improved quality may be implemented. However, the scope of embodiments according to the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a substrate having a first display area, second display areas at both sides of the first display area in a first direction, and a peripheral area around the first and second display areas;

a pad unit at the peripheral area and including a plurality of first pads and a plurality of second pads;

a plurality of first data lines extending in a second direction on the first display area and respectively connected to the plurality of first pads;

a plurality of second data lines extending in the second direction on the second display areas;

a plurality of auxiliary row lines extending in the first direction on the first display area and the second display areas; and a plurality of auxiliary column lines extending in the second direction on the first display area and the second display areas, wherein first auxiliary column lines that are some of the plurality of auxiliary column lines include first column connection portions respectively connected to the plurality of second pads, first auxiliary row lines that are some of the plurality of auxiliary row lines include first row connection portions respectively connecting the first column connection portions of the first auxiliary column lines to the plurality of second data lines, a second driving voltage is applied to second auxiliary row lines that are some others of the plurality of auxiliary row lines, and the second driving voltage is applied to second auxiliary column lines that are some others of the plurality of auxiliary column lines.

2. The display apparatus of claim 1, wherein the first auxiliary column lines respectively include second column connection portions to which the second driving voltage is applied, and the second column connection portions of the first auxiliary column lines are respectively spaced apart from the first column connection portions of the first auxiliary column lines.

3. The display apparatus of claim 1, wherein the first auxiliary row lines respectively include second row connection portions to which the second driving voltage is applied, and the second row connection portions of the first auxiliary row lines are respectively spaced apart from the first row connection portions of the first auxiliary row lines.

4. The display apparatus of claim 1, wherein the first auxiliary row lines respectively include third row connection portions to which a first driving voltage having a different level than the second driving voltage is applied, and the third row connection portions of the first auxiliary row lines are respectively spaced apart from the first row connection portions of the first auxiliary row lines.

* * * * *